(12) United States Patent
Kawahito

(10) Patent No.: US 11,398,519 B2
(45) Date of Patent: Jul. 26, 2022

(54) CHARGE MODULATION ELEMENT AND SOLID-STATE IMAGING DEVICE

(71) Applicant: National University Corporation Shizuoka University, Shizuoka (JP)

(72) Inventor: Shoji Kawahito, Shizuoka (JP)

(73) Assignee: National University Corporation Shizuoka University, Shizuoka (JP)

(*) Notice: Subject to any disclaimer, the term of this patent is extended or adjusted under 35 U.S.C. 154(b) by 230 days.

(21) Appl. No.: 16/770,616

(22) PCT Filed: Dec. 7, 2018

(86) PCT No.: PCT/JP2018/045119
§ 371 (c)(1),
(2) Date: Jun. 7, 2020

(87) PCT Pub. No.: WO2019/112047
PCT Pub. Date: Jun. 13, 2019

(65) Prior Publication Data
US 2020/0312902 A1    Oct. 1, 2020

(30) Foreign Application Priority Data

Dec. 9, 2017  (JP) .............................. JP2017-236538
Dec. 11, 2017 (JP) .............................. JP2017-237275

(51) Int. Cl.
*H01L 27/146*  (2006.01)
*H04N 5/369*   (2011.01)
*H01L 31/10*   (2006.01)

(52) U.S. Cl.
CPC .. *H01L 27/14643* (2013.01); *H01L 27/14603* (2013.01); *H01L 27/14612* (2013.01); *H01L 31/10* (2013.01); *H04N 5/36965* (2018.08)

(58) Field of Classification Search
CPC ......... H01L 27/14603; H01L 27/14612; H01L 27/14643; H01L 27/1461; H01L 31/10;
(Continued)

(56) References Cited

U.S. PATENT DOCUMENTS 8,338,248 B2 * 12/2012 Kawahito ......... H01L 27/14689
257/E21.133
10,325,953 B2 * 6/2019 Kawahito ............. H01L 27/146
(Continued)

FOREIGN PATENT DOCUMENTS

EP      2330637 A2      6/2011
JP      2002-368205 A   12/2002
(Continued)

OTHER PUBLICATIONS

International Search Report and Written Opinion (including translation), dated Feb. 26, 2019, for the corresponding International Application No. PCT/JP2018/045119 in 9 pages.

*Primary Examiner* — Dao H Nguyen
(74) *Attorney, Agent, or Firm* — Polsinelli PC

(57) ABSTRACT

A charge-modulation element encompasses a p-type photoelectric-conversion layer, a n-type surface-buried region buried in an upper portion of the photoelectric-conversion layer configured to implement a photodiode with the photoelectric-conversion layer, a n-type modulation region buried in another part of the upper portion of the photoelectric-conversion layer configured to implement a part of the photodiode with the photoelectric-conversion layer, potential-control regions assigned in one of divided areas, n-type charge-accumulation regions configured to accumulate signal charges generated in the photodiode. Potentials in the modulation region and the surface-buried region are controlled by route-select signals applied to the potential-control regions so as to select one of the charge-transport (Continued)

routes, which transfers the signal charges toward one of the charge-accumulation regions.

20 Claims, 26 Drawing Sheets

(58) Field of Classification Search
CPC .............. H01L 31/103; H04N 5/36965; H04N 5/37452
USPC ......................................................... 257/292
See application file for complete search history.

(56) References Cited

U.S. PATENT DOCUMENTS

| | | | |
|---|---|---|---|
| 2002/0024071 A1* | 2/2002 | Kawajiri | H01L 27/14643 257/292 |
| 2004/0235215 A1* | 11/2004 | Komori | H01L 27/14612 438/57 |
| 2007/0158770 A1 | 7/2007 | Kawahito | |
| 2009/0134396 A1 | 5/2009 | Kawahito et al. | |
| 2011/0187908 A1* | 8/2011 | Kawahito | H01L 27/14641 250/214 R |
| 2012/0205723 A1 | 8/2012 | Suzuki et al. | |
| 2015/0187923 A1 | 7/2015 | Kawahito | |
| 2016/0099283 A1* | 4/2016 | Khaliullin | H01L 27/14679 257/258 |
| 2019/0206915 A1* | 7/2019 | Kawahito | H01L 27/1461 |

FOREIGN PATENT DOCUMENTS

| | | |
|---|---|---|
| JP | 2005-235893 A | 9/2005 |
| JP | 2010-56345 A | 3/2010 |
| JP | 2011-86904 A1 | 4/2011 |
| WO | WO 2007/026779 A1 | 3/2007 |
| WO | WO 2011/065286 A1 | 6/2011 |
| WO | WO 2014/021417 A1 | 2/2014 |

* cited by examiner

CHARGE MODULATION ELEMENT AND SOLID-STATE IMAGING DEVICE

TECHNICAL FIELD

The present invention relates to a charge-modulation element that can perform optical time-of-flight (TOF) operations and a solid-state imaging device in which a plurality of the charge-modulation elements is arrayed as imaging pixels, and more particularly relates to a solid-state imaging device that can perform high speed TOF operations.

BACKGROUND ART

As recited in Patent Literature (PTL) 1, a photonic mixer whose operation is similar to a TOF sensor is proposed. In an invention described in the PTL1, the invention includes a pair of $p^+$-type injection contact regions arranged separately from each other, in order to inject majority-carrier currents into a $p^-$-type semiconductor substrate and a pair of detector regions that is arranged adjacently at positions of an outside of the pair of the injection contact regions and collects optical currents. The pair of the detector regions is surrounded by a pair of locally-arranged $n^-$ type semiconductor regions, respectively. The photonic mixer operates in a condition such that a narrow region outside the $n^-$ type semiconductor region being depleted, because the $n^-$ type semiconductor region implements p-n junction with the $p^-$-type semiconductor substrate.

In the operation principle of the photonic mixer described in the PTL1, it is difficult to achieve a TOF sensor directed to an ultra-high-speed operation of sub-nanosecond level. That is, in an electric field control that alternately injects the majority-carrier currents from the pair of the injection contact regions into the $p^-$-type semiconductor substrate, extremely large capacitance change is involved, which results in inefficiency. Moreover, in the invention described in the PLL1, an occupation area of a neutral region in the $p^-$-type semiconductor substrate is extremely wide. The invention described in the PTL1 uses the component of slow carriers moving at a diffusion velocity in the neutral region. Thus, the influence of the slow component makes the ultra high-speed operation difficult.

The photonic mixer described in the PTL1 has a problem of increase in power dissipation because the majority-carrier currents are injected from the injection contact region into the $p^-$-type semiconductor substrate.

CITATION LIST

Patent Literature

[PTL 1] JP 2011-86904A

SUMMARY OF INVENTION

Technical Problem

In light of the above problems, an object of the present invention is to provide a charge-modulation element that can perform a high-speed operation of a TOF architecture with low power dissipation, and a solid-state imaging device in which a plurality of the charge-modulation elements is arrayed as imaging pixels.

Solution to Problem

In order to achieve the above object, a first aspect of the present invention inheres in a charge-modulation element encompassing (a) a photoelectric-conversion layer of a first conductivity type, (b) a surface-buried region of a second conductivity type buried in a part of an upper portion of the photoelectric-conversion layer, configured to implement a photodiode with the photoelectric-conversion layer, (c) a modulation region of the second conductivity type buried in another part of the upper portion of the photoelectric-conversion layer, in a depth level at an upper surface side than the surface-buried region, having lower impurity concentration than the surface-buried region, configured to implement a part of the photodiode with the photoelectric-conversion layer implements, (d) a plurality of potential-control regions of the first conductivity type, each having higher impurity concentration than the photoelectric-conversion layer, each of the potential-control regions is respectively assigned in one of a plurality of divided areas in the modulation region, the divided areas are arranged radially with respect a center of polar coordinate defined in a center of the modulation region, and (e) a plurality of charge-accumulation regions of the second conductivity type, arranged respectively adjacent to the potential-control regions on an outer boundary of each of the divided areas, the position of the charge-accumulation regions are separated from the potential-control regions, configured to accumulate signal charges temporally, the signal charges are generated in the photodiode, and the signal charges are respectively transferred through independent charge-transport routes to corresponding charge-accumulation regions. In the charge-modulation element pertaining to the first aspect, potentials in the modulation region and the surface-buried region are controlled by route-select signals applied to the potential-control regions so as to select one of the charge-transport routes, which transfers the signal charges toward one of the charge-accumulation regions. Here, the first conductivity type and the second conductivity type are the conductivity types opposite to each other. That is, when the first conductivity type is the n-type, the second conductivity type is the p-type, and when the first conductivity type is the p-type, the second conductivity type is the n-type.

A second aspect of the present invention inheres in a solid-state imaging device encompassing (a) a pixel-array area having an array of a plurality of pixels, and (b) a peripheral-circuit area merged in a single semiconductor chip with the pixel-array area, configured to drive the pixels and to process signals from the pixels. In the solid-state imaging device pertaining to the second aspect, each of the pixels includes a photoelectric-conversion layer of a first conductivity type, a surface-buried region of a second conductivity type buried in a part of an upper portion of the photoelectric-conversion layer, configured to implement a photodiode with the photoelectric-conversion layer, a modulation region of the second conductivity type buried in another part of the upper portion of the photoelectric-conversion layer, in a depth level at an upper surface side than the surface-buried region, having lower impurity concentration than the surface-buried region, configured to implement a part of the photodiode with the photoelectric-conversion layer, a plurality of potential-control regions of the first conductivity type, each having higher impurity concentration than the photoelectric-conversion layer, each of the potential-control regions is respectively assigned in one of a plurality of divided areas in the modulation region, the divided areas are arranged radially with respect a center of polar coordinate defined in a center of the modulation region, and a plurality of charge-accumulation regions of the second conductivity type, arranged respectively adjacent to the potential-control regions on an outer boundary of each of the divided areas, the position of the charge-accumulation regions are separated from the potential-control regions, configured to accumulate signal charges temporally, the signal charges are generated in the photodiode, and the signal charges are respectively transferred through independent charge-transport routes to corresponding charge-accumulation regions.

Furthermore, in each of the pixels of the solid-state imaging device pertaining to the second aspect, potentials in the modulation region and the surface-buried region are controlled by route-select signals applied to the potential-control regions so as to select one of the charge-transport routes, which transfers the signal charges toward one of the charge-accumulation regions.

Advantageous Effects of Invention

According to the present invention, it is possible to provide a charge-modulation element that can perform a high-speed operation of a TOF architecture with low power dissipation, and a solid-state imaging device in which a plurality of the charge-modulation elements is arrayed as imaging pixels.

BRIEF DESCRIPTION OF DRAWINGS

FIG. 8 is a schematic plan view explaining a configuration of a planar pattern of a part of a pixel of a solid-state imaging device pertaining to a second embodiment of the present invention, by seeing through the inter-layer insulating and the like;

FIG. 10 is a schematic planar view explaining a configuration of a planar pattern of a part of a pixel of a solid-state imaging device pertaining to a third embodiment of the present invention, by seeing through an inter-layer insulating-film in an upper layer and the like;

FIG. 14 is a schematic planar view explaining a configuration of a planar pattern of a part of a pixel of a solid-state imaging device pertaining to a fourth embodiment of the present invention, by seeing through an inter-layer insulating-film located in an upper layer and the like;

FIG. 16 is a schematic planar view explaining a configuration of a planar pattern of a part of a pixel of a solid-state imaging device pertaining to a modification of the fourth embodiment of the present invention, by seeing through an inter-layer insulating-film located in an upper layer and the like;

DESCRIPTION OF EMBODIMENTS

Figure 1:
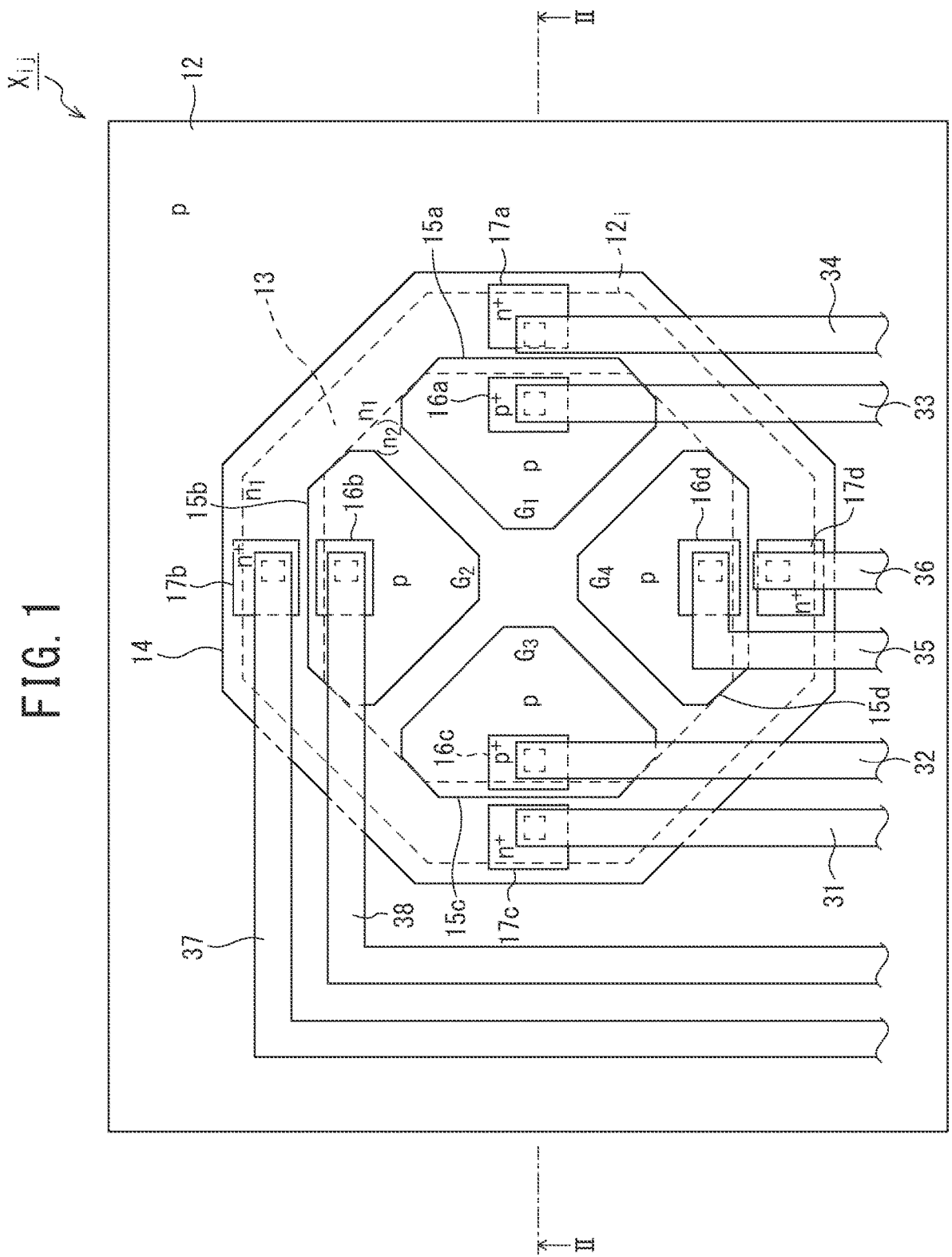
FIG. 1 is a schematic plan view explaining a configuration of a planar pattern of a part of a pixel in a solid-state imaging device pertaining to a first embodiment of the present invention, by omitting, or seeing through an inter-layer insulating-film, which will be illustrated in FIG. 2.

Next, the first to fourth embodiments of the present invention will be described below, with reference to the drawings. In the following description of the drawings, the same or similar reference numeral is assigned to the same or similar portion. However, the drawing is merely diagrammatic. Thus, attention should be paid to a fact that a relationship between a thickness and a planar dimension, a ratio between thicknesses of respective layers and the like differ from the actual values.

Figure 26:
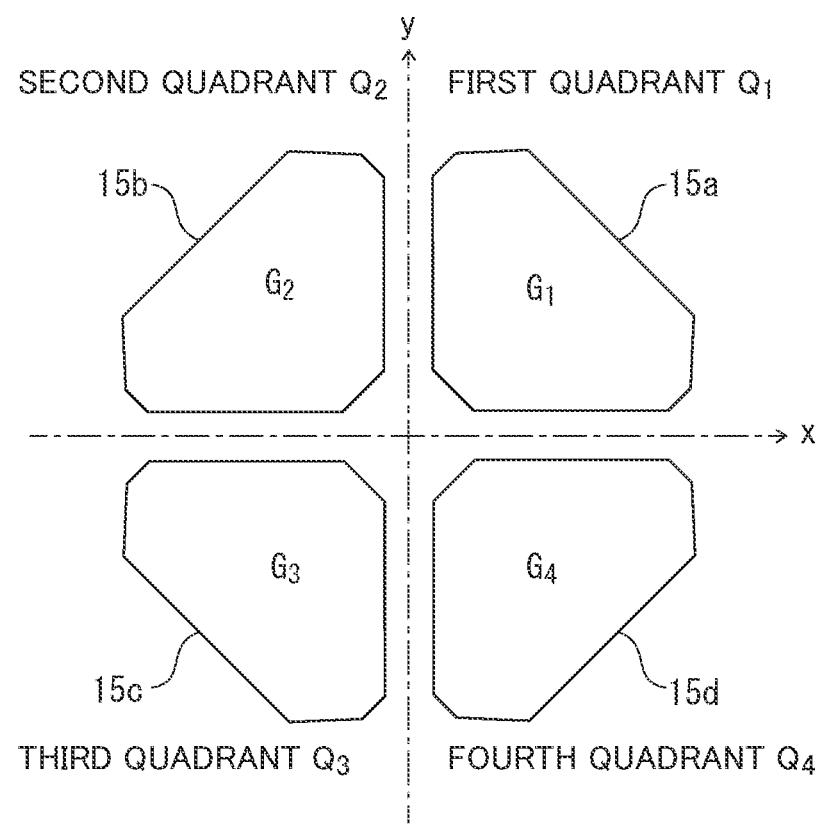
FIG. 26 is a schematic view exemplifying first to fourth quadrants serving as a base of an arrangement of potential-control regions, in order to explain a planar layout of the potential-control regions of the pixel in the solid-state imaging device pertaining to the first to fourth embodiments of the present invention.

For example, in the explanations of the first to fourth embodiments of the present invention, the arrangement and position and others in the potential-control region is explained by defining a first quadrant Q1, a second quadrant Q2, a third quadrant Q3 and a fourth quadrant Q4 in accordance with the exemplification in FIG. 26. However, the explanation divided into the four quadrants is merely a definition for convenience. The dividing scheme of an area exemplified in FIG. 26 is such that quadruple-division is performed with respect to the coordinate center of a polar coordinate system.

More typically, a dividing scheme is allowed in which k is defined as a positive integer of two or more, and the area of the polar coordinate system is divided into k with respect to the coordinate center, and k charge-transport routes of signal charges are controlled. That is, in the explanation of the first to fourth embodiments, a quadruple rotationally symmetric topology is explained exemplarily. More typically, the dividing scheme can be applied to a k-fold rotationally symmetric topology shall be understood from the idea of the following explanations. Thus, the topology, azimuth, position, arrangement position number, thickness and dimension of the concrete planar arrangement should be judged by considering the purpose of the technical idea in the present invention that can be read from the following explanations.

Also, illustrations of an element-isolation insulating-film, a field insulating film and others are omitted in the following descriptions of the drawings, and with regard to the interlayer insulating-film, its illustration is omitted except FIG. 2. Also, although a surface interconnection in the present invention naturally includes a structure becoming a multi-level interconnection as a matter of course, the illustration of complicated structure is omitted. The reason why the above illustrations are omitted lies in the convenience for the sake of simple explanation to clarify the purpose of the present invention. The structure of the element-isolation insulating-film obvious for one skilled in the art is assumed to be read by properly incorporating in a self-evident range. Also, it is natural that a portion in which mutual dimensional relations and ratios differ from each other is included even between the mutual drawings.

By the way, the first to fourth embodiments mentioned below exemplify the device and methods to embody the technical idea of the present invention. Thus, the technical idea of the present invention does not specify the material, shape, structure, arrangement and other items of respective members implementing the solid-state imaging device to the followings. Also, in the following explanations, a case in which a first conductivity type is a p-type and a second conductivity type is an n-type is exemplified. However, by inversely selecting the conductivity type, the first conductivity type may be the n-type, and the second conductivity type may be the p-type. Also, the notation of a superscript + is labeled to n or p represents a semiconductor region in which an impurity concentration is relatively heavy, as compared with a semiconductor region to which + is not labeled, and the notation of a superscript − is labeled to n or p represents a semiconductor region in which an impurity concentration is relatively light as compared with a semiconductor region to which − is not labeled. On the technical idea of the present invention, various changes can be performed within the technical scope described in the claims.

First Embodiment

In the solid-state imaging device (two-dimensional image sensor) pertaining to the first embodiment of the present invention, a plurality of pixels $X_{ij}$ (i=1 to m, and j=1 to n, wherein the m and the n are positive integers, respectively) are arrayed in the shape of two-dimensional matrix. FIG. 1 illustrates a planar pattern of an imaging area of the pixel $X_{ij}$ serving as its representative example. The pixel $X_{ij}$ illustrated in FIG. 1 receives an optical signal entered through a light-shield window of a light-shield film and converts the optical signal into signal charges. As mentioned at the beginning, quadruple potential-control regions 15a, 15b, 15c and 15d of the first conductivity type ($p^+$-type) are arranged separately from each other in the areas defined by a first quadrant Q1, a second quadrant Q2, a third quadrant Q3 and a fourth quadrant Q4 defined in FIG. 26, respectively, as illustrated in FIG. 1. The quadruple potential-control regions 15a, 15b, 15c and 15d are buried in an upper portion of a modulation region 14 of the second conductivity type (n-type), as illustrated in FIG. 2.

As can be understood from FIG. 1, the quadruple potential-control regions 15a, 15b, 15c and 15d are buried separately from each other as planar patterns of similar topology, independent of each other, in the modulation region 14. A periphery of the modulation region 14 is surrounded by a p-type well region (p-well) 12. In FIG. 1, an inner edge of a boundary side of the p-well 12 is represented by a broken line (concealed line) to which a reference numeral 12i is labeled. However, as can be understood from FIG. 2, an outer boundary of the modulation region 14 protrudes into an upper portion of an inner boundary wall of the p-well 12. Also, in FIGS. 8, 10 and 16 and the like, the inner edge 12i on the inner boundary of the p-well 12 is similarly represented by a broken line. Such as the structures illustrated in FIGS. 8, 10 and 16 and the like, a structure is allowed in which the inner edge 12i on the inner boundary of the p-well 12 is separated from the outer boundary of the modulation region 14, or the inner edge 12i on the inner boundary of the p-well 12 coincides with the outer boundary of the modulation region 14. Moreover, an element-isolation insulating-film may be buried in the upper portion of the p-well 12 by a technique of Shallow Trench Isolation (STI). However, as described at the beginning, the illustration of the structure of the element-isolation insulating-film and others obvious for one skilled in the art is omitted in FIG. 2.

Figure 2:
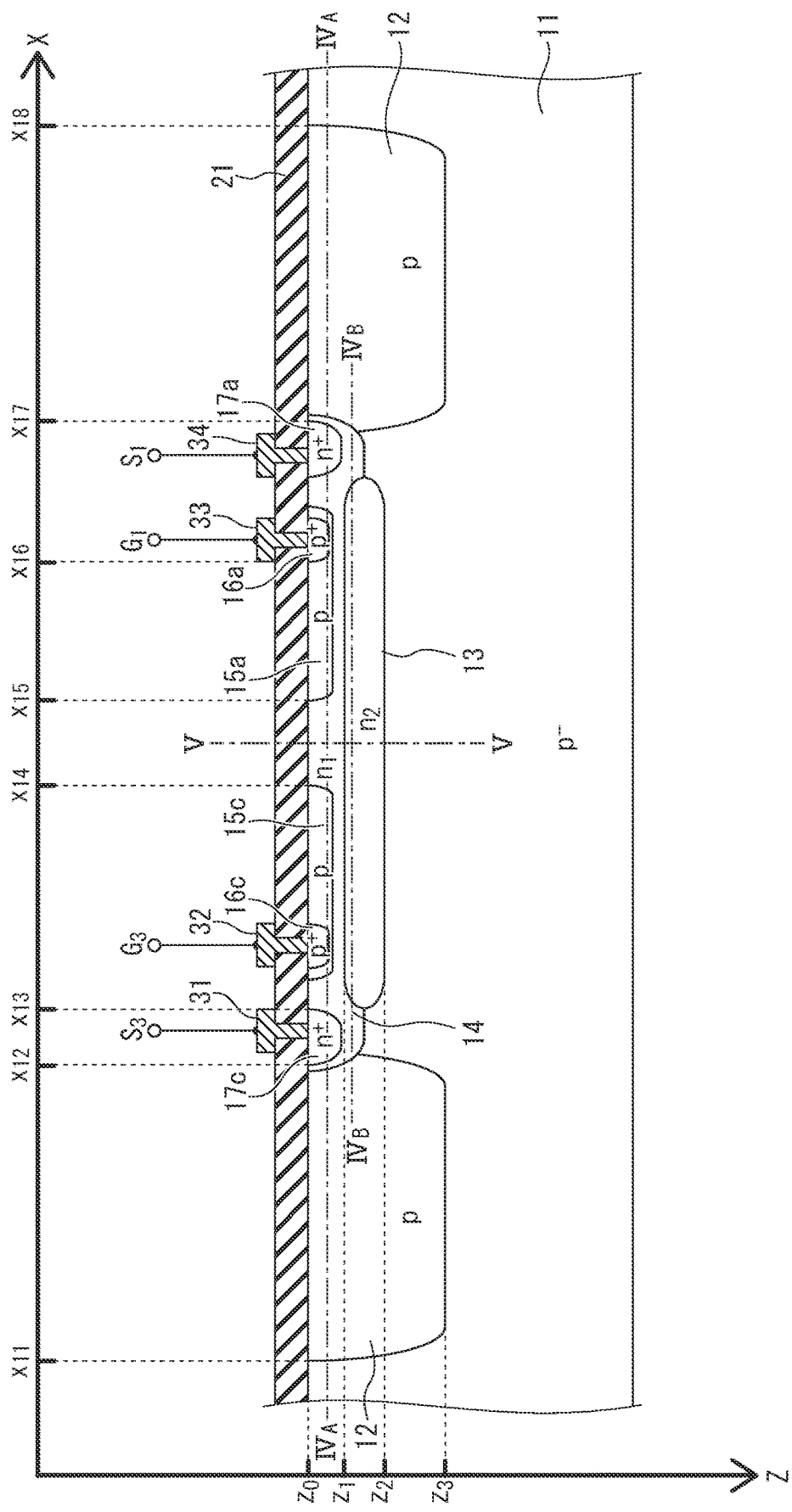
FIG. 2 is a schematic structure view taken from a cross-section corresponding to a II-II direction in FIG. 1. However, with regard to the inter-layer insulating-film, the cross-sectional structure does not correspond perfectly to a structure of the planar pattern in FIG. 1.

As can be understood from FIG. 2, an octagonal surface-buried region 13 represented by a broken line in FIG. 1 is locally buried in a lower portion at a center of the modulation region 14. The cross-sectional view in FIG. 2 can be construed to be a configuration, in which a part of an upper portion of the surface-buried region 13 protrudes into the modulation region 14d so that the upper portion of the surface-buried region 13 is included (encapsulated) by the lower portion of the center of the modulation region 14d. An impurity concentration n2 of the surface-buried region 13 is higher than an impurity concentration n1 of the modulation region 14 (n2>n1). The quadruple potential-control regions 15a, 15b, 15c and 15d directly control potentials in the corresponding portions of modulation region 14, in which the potential-control regions 18a, 18b, 18c and 15d are buried, and potentials in the surface-buried region 13 just under the buried portions of the potential-control regions 18a, 18b, 18c and 15d, independently of each other, and at the same time, and the quadruple potential-control regions 15a, 15b, 15c and 15d serve as pinning layers for capturing and drawing out non-signal charges. As illustrated in FIG. 2, a structure body of each pixel $X_{ij}$ of the solid-state imaging device pertaining to the first embodiment may be a p⁻-type semiconductor substrate itself, or a p⁻-type photoelectric-conversion layer 11 epitaxially-grown on the semiconductor substrate. On the photoelectric-conversion layer 11, the n-type modulation region 14 is laminated through the surface-buried region 13. A periphery of the modulation region 14 is surrounded by the p-type well region (p-well) 12.

As illustrated in FIG. 1, the modulation region 14 is octagon in a plan view. However, each of the potential-control regions 15a, 15b, 15c and 15d is octagon in which three apex angles of an isosceles triangle are chamfered. The reason why the three apex angles of the triangle are chamfered to exhibit an octagonal shape lies in that the base angles at both ends of a bottom side are cut away in two-steps. When each of the shapes of the potential-control regions 15a, 15b, 15c and 15d is approximated by the isosceles triangle in a plan view, a p⁺-type first contact region 16a is arranged at inner vicinity at a center of a bottom side of the first potential-control region 15a assigned in the first quadrant Q1. Similarly, in a plan view, a p⁺-type second contact region 16b is arranged at inner vicinity at a center of a bottom side of the isosceles triangle defining the planar pattern of the second potential-control region 15b assigned in the second quadrant Q2. Moreover, in a plan view, a p⁺-type third contact region 16c is arranged at inner vicinity at a center of a bottom side of the third potential-control region 15c assigned in the third quadrant Q3, and a p⁺-type fourth contact region 16d is arranged at inner vicinity at a center of a bottom side of the fourth potential-control region 15d assigned in the fourth quadrant Q4.

On the upper portion of the modulation region 14, the quadruple potential-control regions 15a, 15b, 15c and 15d are assigned in the quadruple-divided quadrants, respectively. Thus, each of the potential-control regions 15a, 15b, 15c and 15d sequentially determines the charge-transport routes of the signal charges by controlling the potential profiles in the modulation region 14 and the surface-buried region 13 along time sequence. And, the signal charges generated in the pixel $X_{ij}$ are transferred respectively through the charge-transport routes, sequentially defined by the modulation region 14, to outer directions of the modulation region 14 via static induction effect. For transferring the signal charges through the charge-transport routes, as illustrated in FIG. 1, quadruple charge-accumulation regions 17a, 17b, 17c and 17d, which sequentially accumulate the signal charges transferred via the static induction effect by the quadruple potential-control regions 15a, 15b, 15c and 15d, are arranged as floating-drain regions outside the quadruple potential-control regions 15a, 15b, 15c and 15d, respectively. In a plan view, the n⁺-type first charge-accumulation region 17a is arranged at an outer boundary area adjacent to the center of the bottom side of the first potential-control region 15a assigned in the first quadrant Q1, the bottom side is defined in the isosceles triangle implementing the planar pattern of first potential-control region 15a. Similarly, the n⁺-type second charge-accumulation region 17b is arranged at an outer boundary area adjacent to the center of the bottom side of the second potential-control region 15b assigned in the second quadrant Q2. Moreover, the n⁺-type third charge-accumulation region 17c is arranged at an outer boundary area adjacent to the center of the bottom side of the third potential-control region 15c assigned in the third quadrant Q3, and the n⁺-type fourth charge-accumulation region 17d is arranged at an outer boundary area adjacent to the center of the bottom side of the fourth potential-control region 15d assigned in the fourth quadrant Q4.

The modulation region 14 and the surface-buried region 13, which serve as the light-receiving cathode-region (charge-generation region), and the photoelectric-conversion layer 11 serving as the light-receiving anode-region just under the surface-buried region 13 implement a photodiode. Signal charges (electrons) generated in the charge-generation region (light-receiving anode-region) are injected into the surface-buried region 13 just over the charge-generation region and introduced to the modulation region 14.

In FIG. 2 that is the cross-sectional view taken from the cross-section corresponding to a II-II direction in FIG. 1, the first contact region 16a buried in the right side of the first potential-control region 15a, and the third contact region 16c buried in the left side of the third potential-control region 15c are exposed at the top surface of the photoelectric-conversion layer 11. And, the first charge-accumulation region 17a is exposed at the top surface of the photoelectric-conversion layer 11 in the vicinity on the right side of the first potential-control region 15a, and the third charge-accumulation region 17c is exposed at the top surface of the photoelectric-conversion layer 11 in the vicinity on the left side of the fourth potential-control region 15d. Although an inter-layer insulating-film 21 covers the upper portions of the modulation region 14 and the p-well 12, a surface interconnection 33 is connected to the first contact region 16a through a contact via penetrating through the inter-layer insulating-film 21, and a surface interconnection 32 is connected to the third contact region 16c. Moreover, a surface interconnection 34 is connected to the first charge-accumulation region 17a through a contact via penetrating through the inter-layer insulating-film 21, and a surface interconnection 31 is connected to the third charge-accumulation region 17c.

Figure 3A:
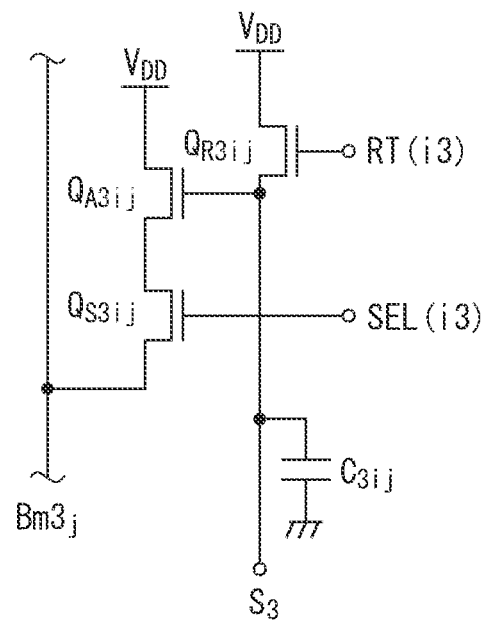
FIG. 3 is a circuit diagram explaining an outline of a read-out circuit provided in the pixel of the solid-state imaging device pertaining to the first embodiment.
Figure 3B:
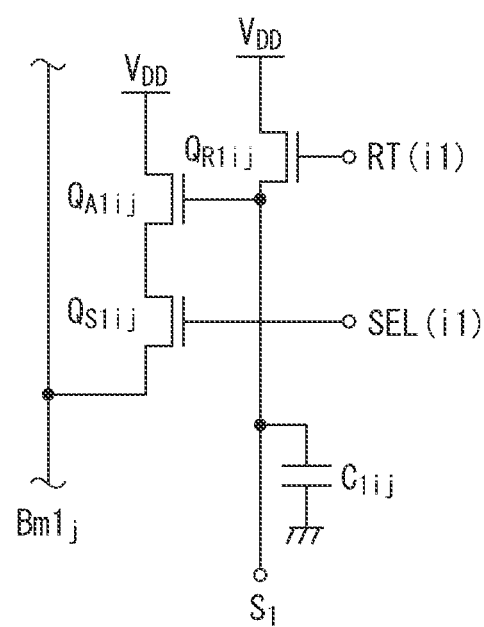

The surface interconnection 34 located on the right side of FIG. 2 is connected to a connection node S1 of the pixel $X_{ij}$. However, as illustrated in FIG. 3, the connection node S1 is connected to a source electrode of a reset transistor $Q_{R1ij}$ of the pixel $X_{ij}$. A drain electrode of the reset transistor $Q_{R1ij}$ is connected to a power supply VDD. To a gate electrode of the reset transistor $Q_{R1ij}$, a reset signal RT(i1) on i-th row of a horizontal line is delivered from a vertical shift resistor (vertical driver circuit) 102 (see FIG. 12, which will be described later). The connection node S1 is also connected to a gate electrode of a read-out transistor (amplifying transistor) $Q_{A1ij}$ of the pixel $X_{ij}$. A drain electrode of the read-out transistor $Q_{A1ij}$ is connected to the power supply VDD, and a source electrode is connected to a drain electrode of a switching transistor $Q_{S1ij}$ for pixel selection of the pixel $X_{ij}$. A source electrode of the switching transistor $Q_{S1ij}$ is connected to a vertical signal line $B_{m1j}$ on a j-th column, and a selection signal SEL(i1) on i-th row is applied to a gate electrode of the switching transistor $Q_{S1ij}$ from the vertical shift register 102. By setting the selection signal SEL(i1) to a high (H) level, the switching transistor $Q_{S1ij}$ is turned on, and a current corresponding to a potential of the charge-accumulation region 17a amplified by the read-out transistor $Q_{A1ij}$ flows through the vertical signal line $B_{m1j}$. On the other hand, for the gate electrode of the reset transistor $Q_{R1ij}$, all of the reset signals RT(i1) are set to the high (H) level, and the charges accumulated in the charge-accumulation region 17a are drawn out to the side of the power supply VDD, and the charge-accumulation region 17a is reset.

The surface interconnection 31 located on the left side of FIG. 2 is connected to a connection node S3 of the pixel $X_{ij}$. As illustrated in FIG. 3, the connection node S3 is connected to a source electrode of a reset transistor $Q_{R3ij}$ of the pixel $X_{ij}$. A drain electrode of the reset transistor $Q_{R3ij}$ is connected to the power supply VDD. To a gate electrode of the reset transistor $Q_{R3ij}$, a reset signal RT(i3) on i-th row is entered. The connection node S3 is also connected to a gate electrode of a read-out transistor $Q_{A3ij}$ of the pixel $X_{ij}$. A drain electrode of the read-out transistor $Q_{A3ij}$ is connected to the power supply VDD, and a source electrode is connected to a drain electrode of a switching transistor $Q_{S3ij}$ of the pixel $X_{ij}$. A source electrode of the switching transistor $Q_{S3ij}$ is connected to a vertical signal line $B_{m3j}$ on the j-th column, and to a gate electrode, a selection signal SEL(i3) on then i-th row is given. By setting the selection signal SEL(i3) to a high (H) level, the switching transistor $Q_{S3ij}$ is turned on, and a current corresponding to a potential of the charge-accumulation region 17c amplified by the read-out transistor $Q_{A3ij}$ flows through the vertical signal line $B_{m3j}$. On the other hand, for the gate electrode of the reset transistor $Q_{R3ij}$, all of the reset signals RT(i3) are set to the high (H) level, and the charges accumulated in the charge-accumulation region 17c are drawn out to the side of the power supply VDD, and the charge-accumulation region 17c is reset.

As the inter-layer insulating-film 21, it is possible to employ non-doped silicon oxide film ($SiO_2$ film) referred to as "NSG", which does not include impurity elements such as phosphorus (P) or boron (B) and the like. By the way, as the inter-layer insulating-film 21, phospho-silicate glass (PSG) film to which phosphorus atoms are doped, boro-silicate glass (BSG) film to which boron atoms are doped, boro-phospho-silicate glass (BPSG) film to which boron and phosphorus atoms are doped, or silicon nitride ($Si_3N_4$ film and the like can be used.

Although illustration is omitted in the cross-sectional view in FIG. 2, as illustrated in FIG. 1, a surface interconnection 38 is connected to the second contact region 16b, and a surface interconnection 35 is connected to the fourth contact region 16d. Moreover, as illustrated in FIG. 1, a surface interconnection 37 is connected to the second charge-accumulation region 17b, and a surface interconnection 36 is connected to the fourth charge-accumulation region 17d. By the way, the wiring layout of the surface interconnections 31 to 38 illustrated in FIG. 1 is merely exemplifications. Thus, in light of the relation to the other surface interconnections whose illustrations are actually omitted, the illustration of a layout differing from FIG. 1 is naturally allowed.

If the surface interconnections 31 to 38 illustrated in FIG. 1 are implemented by transparent electrodes made of polycrystalline silicon, tin oxide ($SnO_2$), indium (In) doped tin oxide (ITO), zinc (Zn) doped tin oxide (ZTO), gallium (Ga) doped tin oxide (GTO), and aluminum (Al) doped tin oxide (ATO), it is possible to protect the reduction of an opening ratio for the pixel $X_{ij}$ of the solid-state imaging device pertaining to the first embodiment. When an impurity concentration of the photoelectric-conversion layer 11 serving as the charge-generation region is set to a $p^-$-type semiconductor layer of about $6 \times 10^{11}$ to $2 \times 10^{15}$ $cm^{-3}$, an impurity concentration of the p-well 12 may be set to a p-type semiconductor region of about $5 \times 10^{16}$ to $5 \times 10^{17}$ $cm^{-3}$. For example, when the impurity concentration of the photoelectric-conversion layer 11 is set to about $1 \times 10^{13}$ to $1.5 \times 10^{15}$ $cm^{-3}$, a thickness of the photoelectric-conversion layer 11 can be designed to about 4 to 100 micrometers, preferable, about 6 to 20 micrometers. For the modulation region 14, it is possible to employ a value of an impurity concentration of about $5 \times 10^{14}$ to $1 \times 10^{17}$ $cm^{-3}$, representatively, for example a value of an impurity concentration of about $1 \times 10^{16}$ $cm^{-3}$, and its depth can be set to about 0.1 micrometer to 3 micrometers, preferably, about 0.3 micrometer to 1.5 micrometers.

Figure 4:
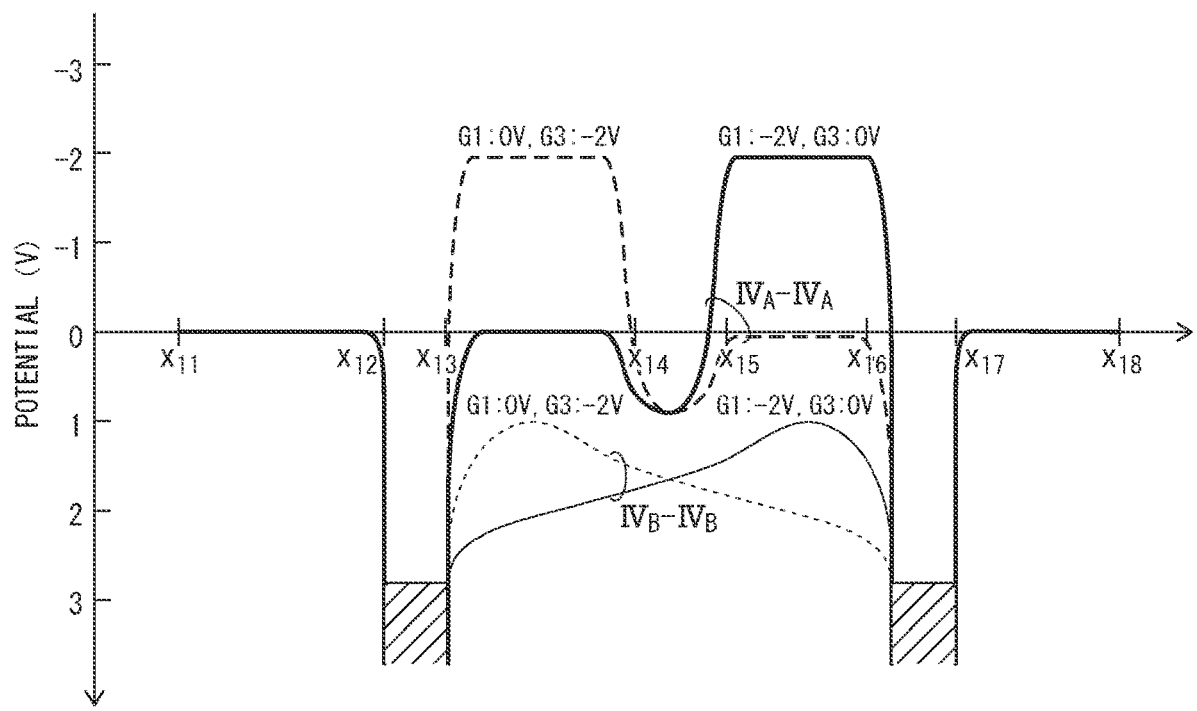
FIG. 4 is a view in which thick solid and broken lines represent potential profiles at a cross-sectional level along a horizontal direction ($IV_A$-$IV_A$ direction) in FIG. 2 and thin solid and broken lines represent potential profiles at a cross-sectional level along an $IV_B$-$IV_B$ in FIG. 2.

The upper side of FIG. 2 illustrates position coordinates x1, x2, x3, - - -, x8 of a planar direction (X direction). However, curves represented by thick solid broken lines in FIG. 4 represent potential profiles on a horizontal cross-section along an $IV_A$-$IV_A$ direction of the pixel $X_{ij}$ illustrated in FIG. 2. Also, curves represented by thin solid and broken lines in FIG. 4 represent potential profiles on a horizontal cross-section along an $IV_B$-$IV_B$ direction of the pixel $X_{ij}$ illustrated in FIG. 2. In a vias condition in which a first control voltage G1=−2 volts is applied to the first potential-control region 15a in the first quadrant Q1 and a third control voltage G3=0 volt is applied to the third potential-control region 15c in the third quadrant Q3, a potential profile on a cross-section cutting horizontally along the $IV_A$-$IV_A$ direction in the upper surface side of a pixel close to a position of the inter-layer insulating-film 21 represents an approximately constant zero potential in a range between the coordinates x11 and x12, which corresponds to an area in the left p-well 12, as represented by the thick solid line, and represents a potential well at positions between the coordinates x12 and x13, which corresponds to an area in the third charge-accumulation region 17c.

Moreover, a potential profile on the horizontal cross-section cutting at shallow positions along the $IV_A$-$IV_A$ direction represents an approximately constant zero potential at positions between the coordinates x13 and x14, which corresponds to an area in the third potential-control region 15c, and then represents a potential valley at gap positions between the coordinates x14 and x15, which corresponds to an area between the third potential-control region 15c and the first potential-control region 15a. Moreover, when the thick solid line advances to the right side on an X axis, the potential profile represents an approximately constant peak voltage −2 volts at positions between the coordinates x15 and x16, which corresponds to an area in the first potential-control region 15a, and then represents a potential well at positions between the coordinates x16 and x17, which corresponds to an area in the first charge-accumulation region 17a. And, when the thick solid line advances to the further right side on the X axis, the potential profile again represents the approximately constant zero potential in a range between the coordinates x17 and x18, which corresponds to an area of the right p-well 12. As represented by the thick solid line in FIG. 4, in a vias condition in which the first control voltage G1=−2 volts is applied to the first potential-control region 15a and the third control voltage G3=0 volt is applied to the third potential-control region 15c, the upper surface side close to the position of the inter-layer insulating-film 21 of the pixel exhibits a potential profile similar to a hook structure of a p-n-p bipolar junction transistor (BJT) in which the third potential-control region 15c is a p-type emitter and the first potential-control region 15a is a p-type collector. The gap position between the coordinates x14 and x15, which corresponds to the area between the third potential-control region 15c and the first potential-control region 15a, serves as a base position of the BJT, and exhibits a potential valley for electrons, establishing a potential barrier of a hook type against holes. Holes that are non-signal charges which are collected and captured in the first potential-control region 15*a* are drawn out through the surface interconnection 33.

On the other hand, in a vias condition in which the first control voltage G1=0 volt is applied to the first potential-control region 15*a* in the first quadrant Q1 and the third control voltage G3=−2 volts is applied to the third potential-control region 15*c* in the third quadrant Q3, a potential profile on a horizontal cross-section along the $IV_A$-$IV_A$ direction represents an approximately constant zero potential in a range (between the coordinates x1 and x12, which corresponds to the area of the left p-well 12, although a thick broken line is concealed. Moreover, when advancing to the right side 3S on the X axis along the $IV_A$-$IV_A$ direction, the potential profile represents an approximately constant peak voltage −2 volt, as represented by a thick broken line at positions (between the coordinates x13 and x14) of the third potential-control region 15*c*, and then represents a potential valley at gap positions (between the coordinates x14 and x15, which corresponds to the area between the third potential-control region 15*c* and the first potential-control region 15*a*. When advancing to the further right side on the X axis, the potential profile represents an approximately constant zero potential at positions (between the coordinates x15 and x16, which corresponds to the area of the first potential-control region 15*a*, as represented by a thick broken line, and then represents a potential well at positions (between the coordinates x16 and x17, which corresponds to the area of the first charge-accumulation region 17*a*. And, when advancing to the further right side on the X axis, the potential profile again represents an approximately constant zero potential in a range (between the coordinates x17 and x18, which corresponds to the area of the right p-well 12, although a thick broken line is concealed behind a thick solid line.

As represented by the thick broken line in FIG. 4, in a vias condition in which the first control voltage G1=0 volt is applied to the first potential-control region 15*a* and the third control voltage G3=−2 volts is applied to the third potential-control region 15*c*, the upper surface side close to the position of the inter-layer insulating-film 21 of the pixel exhibits a potential profile similar to the hook structure of the p-n-p BJT in which the first potential-control region 15*a* is the p-type emitter and the third potential-control region 15*c* is the p-type collector. A potential valley with respect to electrons disposed at the gap positions between the coordinates x14 and x15, which corresponds to an area between the third potential-control region 15*c* and the first potential-control region 15*a*, which serve as the base of BJT, means that a hook shaped potential valley is generated against holes. Holes that are non-signal charges, which are collected and captured in the third potential-control region 15*c*, are drawn out through the surface interconnection 32.

On the other hand, a potential profile on a horizontal cross-section at deep positions along the $IV_B$-$IV_B$ direction separated from the inter-layer insulating-film 21 is equal to the potential profile of the shallow positions along the $IV_A$-$IV_A$ direction, on the left side from the position at coordinate x13, which corresponds to an area of the third charge-accumulation region 17*c* and on the right side from the position at coordinate x16, which corresponds to an area of the first charge-accumulation region 17*a*. Thus, explanations are performed by paying attention between the position at coordinate x13, which corresponds to an area of the third charge-accumulation region 17*c* and the position at coordinate x16, which corresponds to an area of the first charge-accumulation region 17*a*.

In a vias condition in which the first control voltage G1=−2 volts is applied to the first potential-control region 15*a* in the first quadrant Q1 and the third control voltage G3=0 volt is applied to the third potential-control region 15*c* in the third quadrant Q3, a potential profile on a horizontal cross-section along the $IV_B$-$IV_B$ direction represents a right-rising potential profile which decreases approximately from +3 volts to +1.7 volts in the positions between the coordinates x13 and x14, which corresponds to the area of the third potential-control region 15*c* as represented by the thin solid line, and then decreases in a right-rising potential profile approximately from +1.7 volts to +1.3 volts even in the gap positions between the coordinates x14 and x15, which corresponds to the area between the third potential-control region 15*c* and the first potential-control region 15*a*. And, when advancing to the further right side on the X axis, the potential profile decreases to 1 volt of the minimum voltage in the positions between the coordinates x15 and x16, which corresponds to the area of the first potential-control region 15*a*, and then increases toward a potential well in the positions between the coordinates x16 and x17, which corresponds to the area of the first charge-accumulation region 17*a*. In a bias condition that the first control voltage G1=−2 volts is applied to the first potential-control region 15*a* in the first quadrant Q1 and the third control voltage G3=0 volt is applied to the third potential-control region 15*c* in the third quadrant Q3, as displayed in the thin solid line FIG. 4, a charge-transport route toward the third charge-accumulation region 17*c* is generated in a lower portion of the modulation region 14 and the surface-buried region 13, and the signal charges generated in the photoelectric-conversion layer 11 is known to be introduced to the third charge-accumulation region 17*c* in the third quadrant Q3.

In a vias condition in which the first control voltage G1=0 volt is applied to the first potential-control region 15*a* in the first quadrant Q1 and the third control voltage G3=−2 volts is applied to the third potential-control region 15*c* in the third quadrant Q3, a potential profile on the horizontal cross-section along the $IV_B$-$IV_B$ direction decreases to 1 volt of the minimum voltage in the positions between the coordinates x13 and x14, which correspond to the area of the third potential-control region 15*c* as represented by the thin broken line, and then exhibits a right-falling potential profile which increases to about +1.5 volts, and then increases at a right-falling potential profile, approximately from +1.5 volts to +1.7 volts, even in the gap positions between the coordinates x14 and x15, which corresponds to the area between the third potential-control region 15*c* and the first potential-control region 15*a*. And, when the horizontal cross-section advances to the further right side on the X axis, the potential profile continues to increase in the positions between the coordinates x15 and x16, which corresponds to the area of the first potential-control region 15*a*, and then increases toward a potential well in the positions between the coordinates x16 and x17, which corresponds to the area of the first charge-accumulation region 17*a*. In a bias condition that the first control voltage G1=0 volt is applied to the first potential-control region 15*a* in the first quadrant Q1 and the third control voltage G3=−2 volts is applied to the third potential-control region 15*c* in the third quadrant Q3, as represented by the thin broken line in FIG. 4, a charge-transport route of the potential profile toward the first charge-accumulation region 17*a* is generated in the lower portion of the modulation region 14 and the surface-buried region 13, and the signal charges generated in the photoelectric-conversion layer 11 are introduced to the first charge-accumulation region 17*a* in the first quadrant Q1.

Although illustration is omitted, because a bias condition that the second control voltage G2=0 volt is applied to the second potential-control region 15b in the second quadrant Q2 and the fourth control voltage G4=−2 volts is applied to the fourth potential-control region 15d in the fourth quadrant Q4 is similar to the bias condition illustrated in FIG. 4, the behavior such that a charge-transport route of a potential profile toward the second charge-accumulation region 17b is generated in the lower portion of the modulation region 14 and the surface-buried region 13, and the signal charges generated in the photoelectric-conversion layer 11 are introduced to the second charge-accumulation region 17b in the second quadrant Q2 will be easily understood from the above explanation. Also, in a bias condition that the second control voltage G2=−2 volts is applied to the second potential-control region 15b in the second quadrant Q2 and the fourth control voltage G4=0 volt is applied to the fourth potential-control region 15d in the fourth quadrant Q4, a charge-transport route toward the fourth charge-accumulation region 17d in the fourth quadrant Q4 is similarly generated in the lower portion of the modulation region 14 and the surface-buried region 13, and the signal charges generated in the photoelectric-conversion layer 11 shall be transferred to the fourth charge-accumulation region 17d.

When the change in the potential profile in FIG. 4 is seen, since individual voltage pulses, or route-select signals are sequentially applied to the quadruple potential-control regions 15a, 15b, 15c and 15d illustrated in FIG. 1 in accordance with a pulse-application mode determined by a predetermined timing chart, the high-speed operation of the TOF architecture can be efficiently achieved by controlling the charge-transport routes generated in the lower portion of the modulation region 14 and the surface-buried region 13, in such a way that the signal charges are sequentially accumulated in the quadruple charge-accumulation regions 17a, 17b, 17c and 17d.

Figure 5:
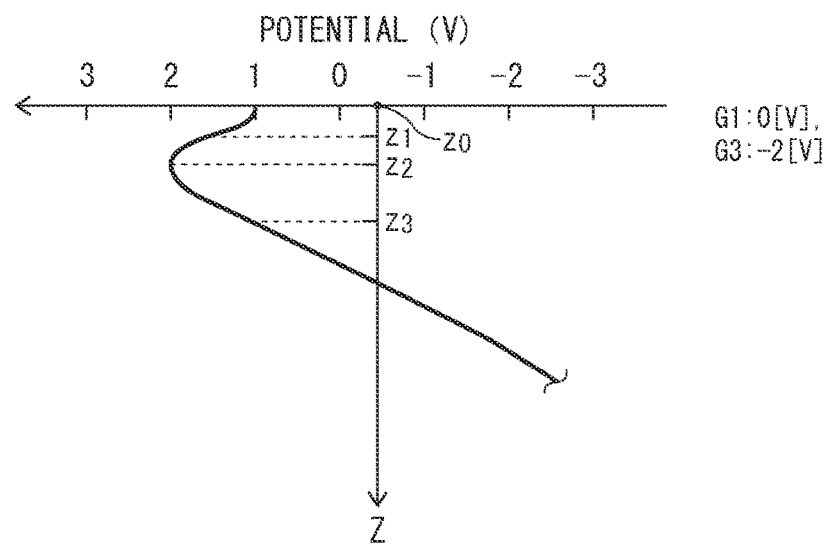
FIG. 5 is a view indicating a potential profile in the pixel of the solid-state imaging device pertaining to the first embodiment, at positions along a vertical direction (V-V direction) in FIG. 2.

The left side of FIG. 2 illustrates position coordinates z0, z1, z2 and z3 in a depth direction (Z direction), and a curve illustrated in FIG. 5 illustrates a potential profile on a cross-sectional level along a vertical direction (V-V direction) in FIG. 2. A potential profile is measured along the V-V direction, passing through the inter-layer insulating-film 21, the modulation region 14, the surface-buried region 13 and the photoelectric-conversion layer 11 in the depth direction, and the potential profile exhibits a distribution of hook type, which as illustrated in FIG. 5, increases gradually toward a positive direction from a depth level at coordinate z0, which corresponds to a depth at a lower surface of the inter-layer insulating-film 21 to a depth level at coordinate z1, which corresponds to a depth at an upper surface of the surface-buried region 13 and becomes the maximum value of about 2 volts at the vicinity of a depth level at coordinate z2, which corresponds to a depth at a lower surface of the surface-buried region 13. And, when the subject point in the potential profile becomes much deeper than the maximum value at the vicinity of the lower surface of the surface-buried region 13, the potential profile exhibits a decreasing tendency, and when the subject point in the potential profile exceeds a depth level at coordinate z3, which corresponds to a depth at a lower surface of the p-well 12 and further advances toward a bottom surface of the photoelectric-conversion layer 11 in the depth direction, the potential profile on the vertical cross-section along V-V direction decreases to a negative value as illustrated in FIG. 5.

The profile representing the maximum potential value of about 2 volts at the vicinity of the depth level at coordinate z2, which is defined at the depth of the lower surface of the surface-buried region 13, illustrated in FIG. 5 corresponds to the profile of about 2 volts represented by the thin solid line and the broken line in FIG. 4, or the potential profile at the vicinity of the center between the third potential-control region 15c and the first potential-control region 15a, defined between the coordinates x14 and x15. A potential profile illustrated in FIG. 5 that is drawn in the vertical direction (V-V direction) at the center between the third potential-control region 15c and the first potential-control region 15a between the coordinates x14 and x15 becomes the hook profile similar to the static induction transistor (SIT) in which the third potential-control region 15c and the first potential-control region 15a serve as a p-type buried gate electrode.

However, the potential profile for carrying out the TOF operation, by controlling the charge-transport routes for the signal charges, applying voltage pulses to the quadruple potential-control regions 15a, 15b, 15c and 15d sequentially with time, so that the signal charges are sequentially delivered to the quadruple charge-accumulation regions 17a, 17b, 17c and 17d, thereby accumulating the signal charges in the charge-accumulation regions 17a, 17b, 17c, is differs from a symmetrical saddle point potential exhibited in SIT in the strict means. That is, in a bias application mode of sequentially applying pulses so that a potential of a specific potential-control region among the quadruple potential-control regions 15a, 15b, 15c and 15d is set to 0 volt, and the remaining three potential-control regions is set to −2 volts, respectively, the potential profile becomes an asymmetrical shape. Namely, in the asymmetrical potential shape, a specific potential for electrons in the specific quadrant becomes low, and reversely, a potential for holes in the specific quadrant becomes high.

In any case, according to the structure of the pixel $X_{ij}$ in the solid-state imaging device pertaining to the first embodiment, it is possible to achieve the TOF operation at an extremely high speed because the quadruple potential-control regions 15a, 15b, 15c and 15d illustrated in FIG. 1 directly control the potentials of the surface-buried region 13 just under the potential-control regions 15a, 15b, 15c and 15d in the vertical direction (depth direction). That is, it is possible to carry out a high-efficient and high-speed control of potential, in such a way that at the central position in the quadruple potential-control regions 15a, 15b, 15c and 15d illustrated in FIG. 1 and at the depth level at the vicinity of the lower surface of the surface-buried region 13, the asymmetric potential, in which the barrier against holes in the particular quadrant is higher than the barriers against holes in the remaining quadrants, is generated at a high speed. According to the structure of the pixel $X_{ij}$ in the solid-state imaging device pertaining to the first embodiment, it is possible to achieve a rotating operation of the asymmetric potential on a plan view illustrated in FIG. 1 together with the pulsed voltages at a high speed and a high efficiency, in accordance with the designed timing chart (see FIG. 13, which will be described later). Also, the pixel $X_{ij}$ in the solid-state imaging device pertaining to the first embodiment can achieve the effectiveness of the low power dissipation, because the injection of the majority carriers is not required, which is distinguishable from the technique described in the PTL 1.

Modification of First Embodiment

Figure 6:
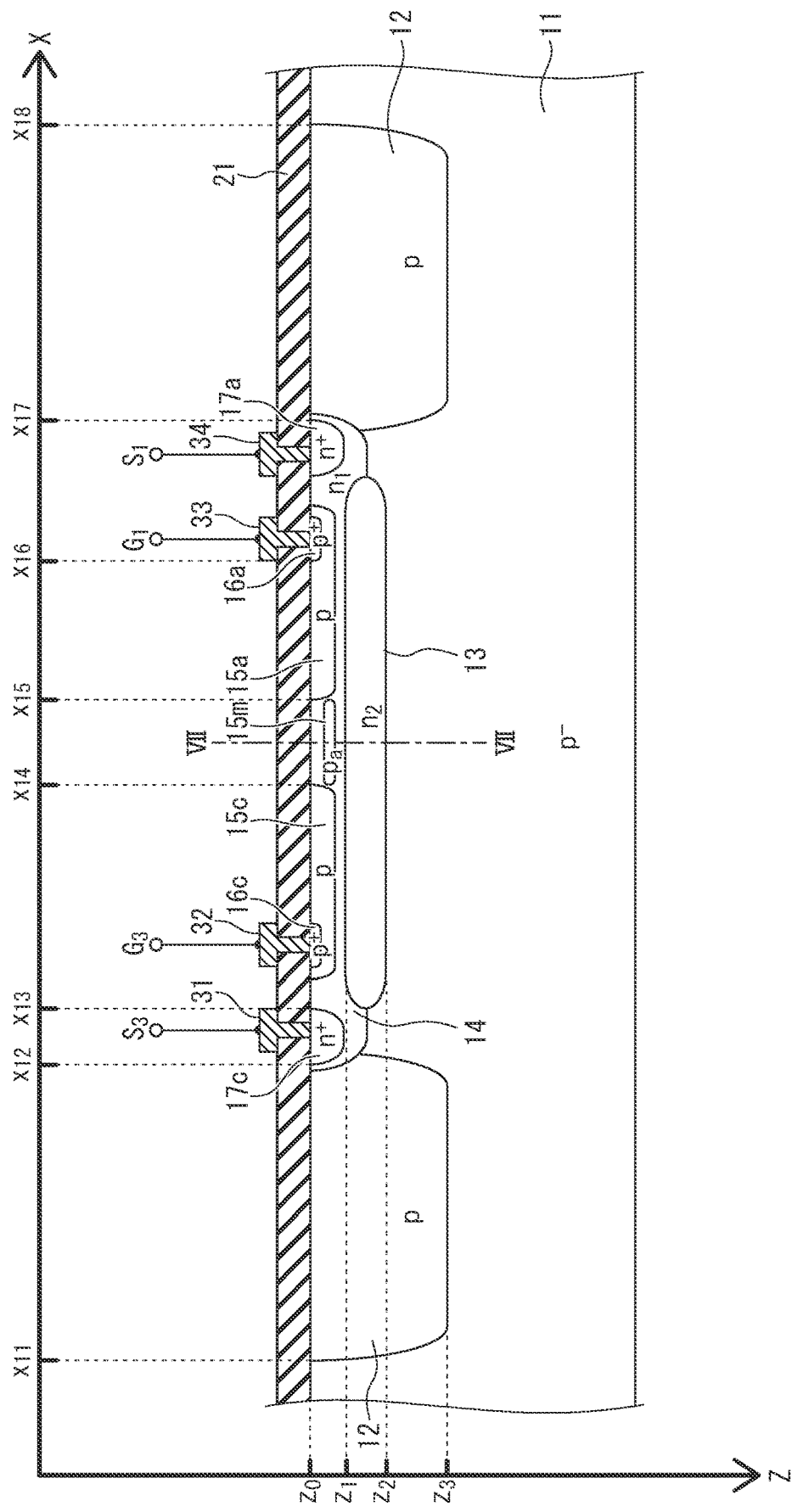
FIG. 6 is a schematic cross-sectional view of a part of a pixel in a solid-state imaging device pertaining to a modification of the first embodiment of the present invention.

Although illustration of the planar pattern is omitted, the configuration that a pixel $X_{ij}$ in a solid-state imaging device pertaining to a modification of the first embodiment has a pattern in which the quadruple p$^+$-type potential-control regions 15a, 15b, 15c and 15d are arranged is common to the topology of the solid-state imaging device pertaining to the first embodiment illustrated in FIG. 1. However, the configuration illustrated in FIG. 6, in which a p-type central buried-control-region 15m is arranged at the coordinate center in the first quadrant Q1 to the fourth quadrant Q4 differs from the topology of the solid-state imaging device pertaining to the first embodiment. An impurity concentration pa of the central buried-control-region 15m is about $10^{16}$ to $10^{17}$ cm$^{-3}$, which is set to a degree of the concentration such that the central buried-control-region 15m can be depleted. In a planar pattern, the p$^+$-type first contact region 16a is arranged in inner vicinity at the center on the outer bottom side of the first potential-control region 15a arranged in the first quadrant Q1, and the p$^+$-type third contact region 16c is arranged in inner vicinity at the center on the outer bottom side of the third potential-control region 15c arranged in the third quadrant Q3. Here, the "outer bottom side" means one of eight sides of the chamfered isosceles triangle, which implements octagon. Although illustration is omitted, similarly to the case illustrated in FIG. 1, it is natural that the contact region exists in the second potential-control region 15b and the fourth potential-control region 15d. As illustrated in FIG. 6, the quadruple potential-control regions 15a, 15b, 15c and 15d are buried in the upper portion of the n-type modulation region 14, such that the upper surfaces of the quadruple potential-control regions 15a, 15b, 15c and 15d are in common with the upper portion of the n-type modulation region 14. However, the upper surface of the central buried-control-region 15m is the same level as the lower surfaces of the first contact region 16a and the third contact region 16c. The lower surface of the central buried-control-region 15m is the same level as the lower surfaces of the quadruple potential-control regions 15a, 15b, 15c and 15d.

Figure 7:
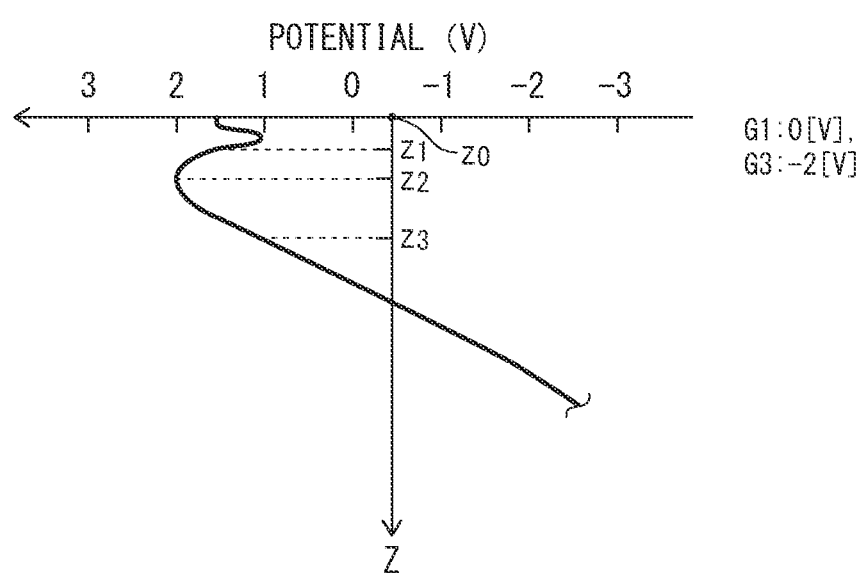
FIG. 7 is a view indicating a potential profile in the pixel of the solid-state imaging device pertaining to the first embodiment along a vertical direction (VII-VII direction) in FIG. 6.

Although the left side in FIG. 6 illustrates position coordinates z0, z1, z2 and z3 in a depth direction (Z direction), a curve illustrated in FIG. 7 represents a potential profile at positions along a vertical direction (VII-VIII direction) in FIG. 6. Along the VII-VIII direction, the potential cross-section passes through the inter-layer insulating-film 21, the modulation region 14, the surface-buried region 13 and the photoelectric-conversion layer 11 in the depth direction, and the potential is about 1.5 volts at a depth level at coordinate z0, which corresponds to the depth at the lower surface of the inter-layer insulating-film 21, as illustrated in FIG. 7. However, as the potential cross-section advances to the depth direction, the potential decreases to about 1.0 volt and again increases to a positive direction and exhibits a dip of a potential profile. And, the potential becomes about 1.5 volts at the depth level at coordinate z1, which corresponds to the depth at the upper surface of the surface-buried region 13, and as the potential cross-section advances to the further deeper direction, the potential increases to the positive direction, and has the maximum value of about 2.0 volts at the vicinity of the depth level at coordinate z2, which corresponds to the depth at the lower surface of the surface-buried region 13. And, when the potential cross-section becomes much deeper than the depth level representing the maximum value of the potential at the vicinity of the lower surface of the surface-buried region 13, the potential exhibits a decreasing tendency, and exhibits a hook profile. When the potential cross-section exceeds the depth level at coordinate z3, which corresponds to the depth at the lower surface of the p-well 12 and further advances toward the bottom surface of the photoelectric-conversion layer 11 in the depth direction, the potential in the vertical direction (VII-VIII direction) decreases to a negative value as illustrated in FIG. 7.

As illustrated in FIG. 7, since the dip for the potential profile is generated in the surface portion between the coordinates z0 and z1, components of dark current caused by interface level can be collected in the surface portion. As the dark current is collected, according to the pixel $X_{ij}$ in the solid-state imaging device pertaining to the modification of the first embodiment, by drawing out the dark-current components to an exhaust drain, through the interface boundary on the surface, it is possible to avoid the dark-current components from mixing in the signal charges. In particular, in a case of a solid-state imaging device that mainly uses near-infrared light, because generated charges are few because light is absorbed near the surface, in view of influence on sensibility, it is effective to remove the dark-current components caused by the interface level.

Second Embodiment

Figure 8:
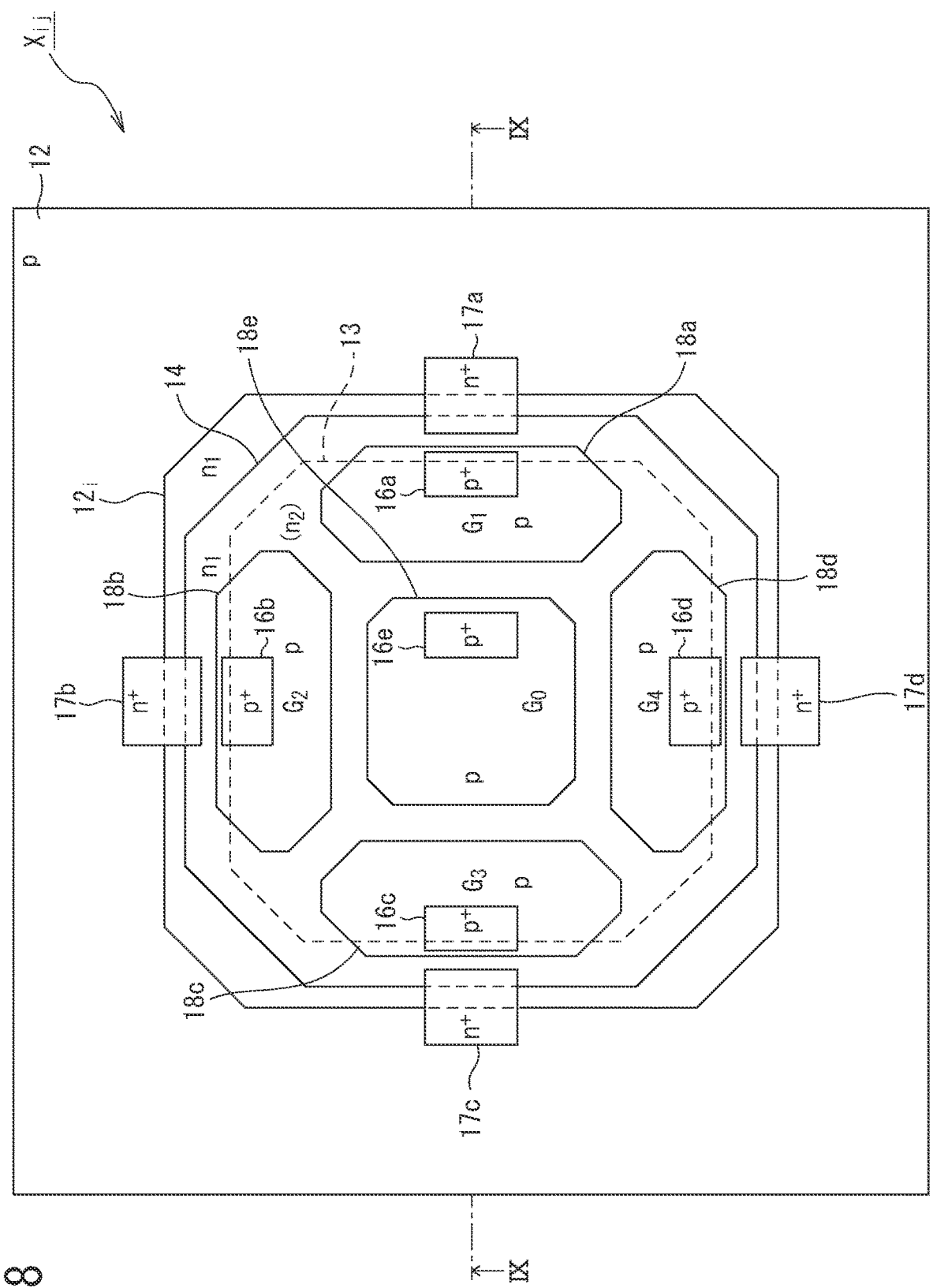

The pixel-array area in the solid-state imaging device pertaining to the second embodiment of the present invention is similar to the first embodiment in that a plurality of the pixels $X_{ij}$ is arrayed in the shape of two-dimensional matrix. Even in FIG. 8 illustrating the planar pattern of the imaging area of the pixel $X_{ij}$ as a representative example, the basic design principle lies in the radially arranged regions defined by the first quadrant Q1, the second quadrant Q2, the third quadrant Q3 and the fourth quadrant Q4 which are defined in FIG. 26. The pixel $X_{ij}$ in the solid-state imaging device pertaining to the second embodiment differs from the solid-state imaging device pertaining to the first embodiment in that the pixel $X_{ij}$ is a pattern in which quintuple p$^+$-type potential-control regions 18a, 18b, 18c, 18d and 18e are arranged.

Figure 9:
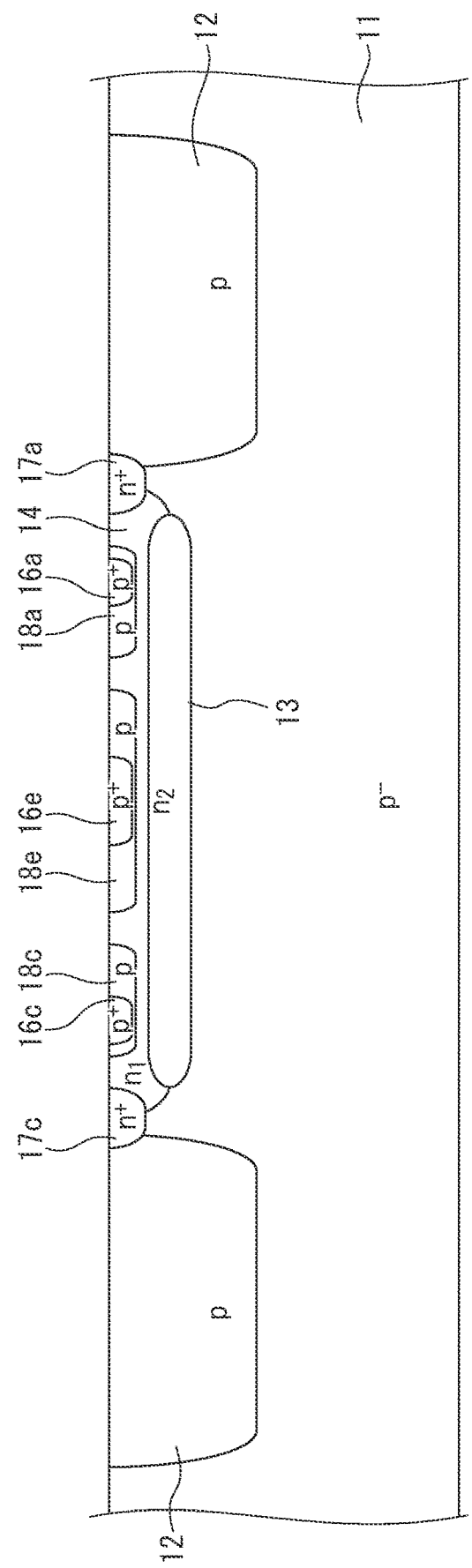
FIG. 9 is a schematic cross-sectional view taken from an IX-IX direction in FIG. 8.

By the way, a planar topology in which the first potential-control region 18a is arranged in the first quadrant Q1, the second potential-control region 18b is arranged in the second quadrant Q2, the third potential-control region 18c is arranged in the third quadrant Q3, and the fourth potential-control region 18d is arranged in the fourth quadrant Q4 is similar to the topology of the solid-state imaging device pertaining to the first embodiment illustrated in FIG. 1. However, the topology in the solid-state imaging device pertaining to the second embodiment differs from the topology of the solid-state imaging device pertaining to the first embodiment in that the central potential-control region 18e is arranged at the coordinate center of the first quadrant Q1 to the fourth quadrant Q4 as illustrated in FIG. 8. The quintuple potential-control regions 18a, 18b, 18c, 18d and 18e are buried in the upper portion of the n-type modulation region 14 as illustrated in FIG. 9. As can be understood from FIG. 8, the quadruple potential-control regions 18a, 18b, 18c and 18d are separated from each other, and the potential-control regions 18a, 18b, 18c and 18d surround the central potential-control region 18e, being separated from the central potential-control region 18e. The quadruple potential-control regions 18a, 18b, 18c and 18d, each having the similar planar topology are buried independently in the modulation region 14.

As can be from understood from FIG. 9, an octagonal surface-buried region 13 represented by the broken line in FIG. 8 is locally buried in a lower portion at a center of the modulation region 14. An impurity concentration n2 of the surface-buried region 13 is higher than an impurity concentration n1 of the modulation region 14 (n2>n1). The quintuple potential-control regions 18a, 18b, 18c, 18d and 18e directly control potentials in the corresponding portions of modulation region 14, in which the potential-control regions 18a, 18b, 18c, 18d and 18e are buried, and potentials in the surface-buried region 13 just under the buried portions of the potential-control regions 18a, 18b, 18c, 18d and 18e, independently with each other, and at the same time, the quintuple potential-control regions 18a, 18b, 18c, 18d and 18e serve as pinning layers for capturing and drawing out non-signal charges. As illustrated in FIG. 9, a structure body of the pixel $X_{ij}$ in the solid-state imaging device pertaining to the second embodiment may be a p⁻-type semiconductor substrate itself, or a p⁻-type photoelectric-conversion layer 11 epitaxially-grown on the semiconductor substrate. On the photoelectric-conversion layer 11, the n-type modulation region 14 is arranged through the surface-buried region 13. A periphery of the modulation region 14 is surrounded by the p-type well region (p-well) 12.

As illustrated in FIG. 8, the modulation region 14 is octagon, and the central potential-control region 18e arranged at the center of the modulation region 14 is also octagon, which has a quadruple rotational symmetry. However, the central potential-control region 18e is an unequal-sided octagon whose shape differs from the modulation region 14. The topology of the second embodiment differs from the topology of the solid-state imaging device pertaining to the first embodiment in that each shape of the quadruple potential-control regions 18a, 18b, 18c and 18d around the central potential-control region 18e is elongated octagon. A p⁺-type first contact region 16a is arranged at inner vicinity at a center of an outer long side of the first potential-control region 18a arranged in the first quadrant Q1. Here, the "outer long side" means one of eight sides of the elongated octagon. Similarly, a p⁺-type second contact region 16b is arranged at inner vicinity at a center of an outer long side of the second potential-control region 18b arranged in the second quadrant Q2. Moreover, a p⁺-type third contact region 16c is arranged at inner vicinity at a center of an outer long side of the third potential-control region 18c arranged in the third quadrant Q3, and a p⁺-type fourth contact region 16d is arranged at inner vicinity at a center of an outer long side of the fourth potential-control region 18d arranged in the fourth quadrant Q4.

A fixed potential, for example, −1 volt is applied to the central potential-control region 18e, and a potential just under the central potential-control region 18e is maintained at a constant potential. As the upper portion of the modulation region 14 is divided into quadruple quadrants so that the quadruple potential-control regions 18a, 18b, 18c and 18d surround a periphery of the central potential-control region 18e, pulses driven at 0 volt and −2 volts are sequentially applied to the quadruple potential-control regions 18a, 18b, 18c and 18d. The quadruple potential-control regions 18a, 18b, 18c and 18d control the potential profiles in the modulation region 14 and the surface-buried region 13, respectively, along time sequence and sequentially determine charge-transport routes of signal charges. And, the signal charges generated in the pixel $X_{ij}$ are transferred through the charge-transport routes sequentially defined by the modulation region 14, respectively, to outer directions of the modulation region 14 via static induction effect.

As illustrated in FIGS. 8 and 9, quadruple charge-accumulation regions 17a, 17b, 17c and 17d for sequentially accumulating the signal charges transferred via the static induction effects by the quadruple potential-control regions 18a, 18b, 18c and 18d are arranged as floating-drain regions outside the quadruple potential-control regions 18a, 18b, 18c and 18d, respectively. The n⁺-type first charge-accumulation region 17a is arranged at an outer boundary area adjacent to the first potential-control region 18a arranged in the first quadrant Q1. Similarly, the n⁺-type second charge-accumulation region 17b is arranged at an outer boundary area adjacent to the second potential-control region 18b arranged in the second quadrant Q2. Moreover, the n⁺-type third charge-accumulation region 17c is arranged at an outer boundary area adjacent to the third potential-control region 18c arranged in the third quadrant Q3, and the n⁺-type fourth charge-accumulation region 17d is arranged at an outer boundary area adjacent to the fourth potential-control region 18d arranged in the fourth quadrant Q4.

The modulation region 14 and the surface-buried region 13, which serve as the light-receiving cathode-region (charge-generation region), and the photoelectric-conversion layer 11 serving as the light-receiving anode-region just under the surface-buried region 13 implement a photodiode. The signal charges (electrons) generated in the charge-generation region (light-receiving anode-region) are injected into the surface-buried region 13 just over the charge-generation region and introduced to the modulation region 14.

In FIG. 9 that is the cross-sectional view taken from an IX-IX direction in FIG. 8, the first contact region 16a buried in the right side of the first potential-control region 18a, the central contact region 16e buried in the center of the central potential-control region 18e, and the third contact region 16c buried in the left side of the third potential-control region 18c are exposed at a top surface of the photoelectric-conversion layer 11. And, the first charge-accumulation region 17a is exposed at the top surface of the photoelectric-conversion layer 11 in vicinity of the right side of the first potential-control region 18a, and the third charge-accumulation region 17c is exposed at the top surface of the photoelectric-conversion layer 11 in vicinity of the left side of the third potential-control region 18c. In the cross-sectional view in FIG. 9, similarly to FIG. 2, an inter-layer insulating-film shall cover the upper portions of the modulation region 14 and the p-well 12. However, the illustrations of the inter-layer insulating-film and a contact plug penetrating through the inter-layer insulating-film, and surface interconnections connected through the contact plug to the first contact region 16a and the like are omitted.

Also, in FIG. 8, the illustrations of the wiring layouts of the surface interconnections 31 to 38 and the like illustrated in FIG. 1 are omitted. However, including the surface interconnection connected to the central contact region 16e in the central potential-control region 18e, the layout as exemplified in FIG. 1, or alternatively, a surface interconnection of a layout differing from FIG. 1 can be naturally connected as a matter of course. Also, if these surface interconnections are made by transparent electrodes such as polycrystalline silicon and the like, it is possible to achieve the effectiveness, which will not to reduce an opening ratio for the pixel $X_{ij}$, is similar to the first embodiment.

Figure 18:
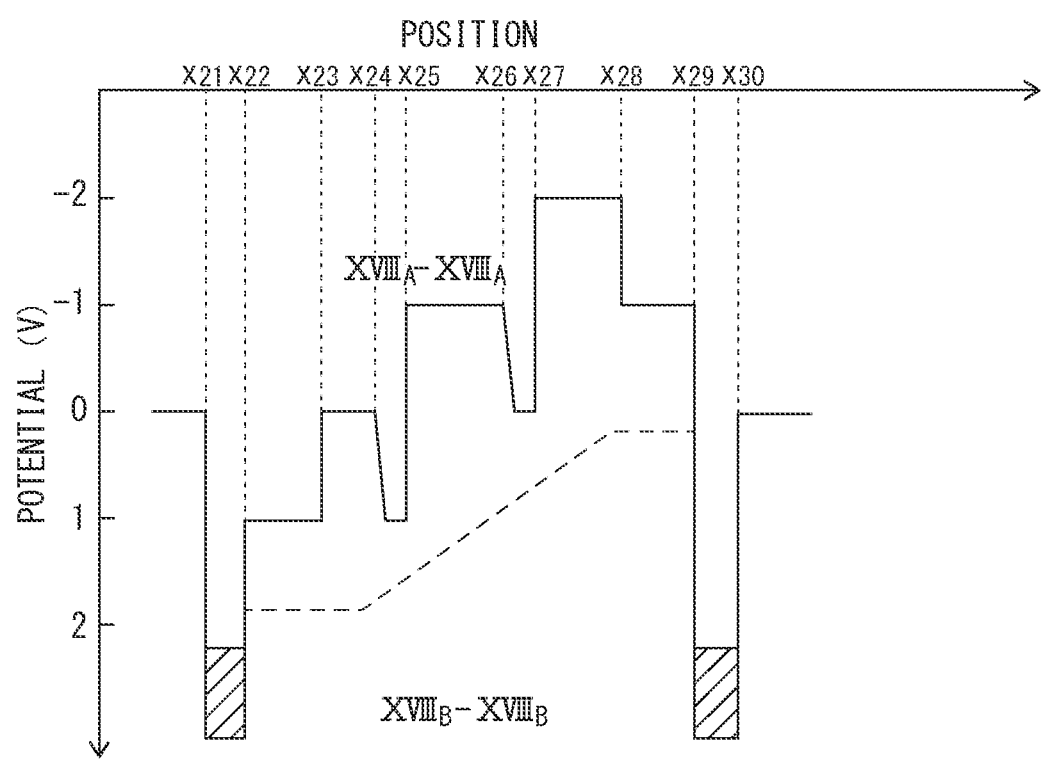
FIG. 18 is a view in which a solid line represents a potential profile on a horizontal cross-section along an $XVIII_A$-$XVIII_A$ direction in FIG. 17, and a broken line represents a potential profile on a horizontal cross-section along an $XVIII_B$-$XVIII_B$ direction in FIG. 17.

Although the illustration of the potential profile such as FIG. 4, which has been referred in the first embodiment, is omitted, in a vias condition in which a first control voltage G1=−2 volts is applied to the first potential-control region 18a, a fixed potential G0=−1 volt is applied to the central potential-control region 18e, and a third control voltage G3=0 volt is applied to the third potential-control region 18c, potentials on the horizontal potential cross-section in the upper surface side of the pixel represents a potential profile where a hook structure of p-n-p BJT in which the third potential-control region 18c serves as the emitter and the central potential-control region 18e serves as the collector and another hook structure of p-n-p BJT in which the central potential-control region 18e serves as the emitter and the first potential-control region 18a serves as the collector are connected in series (see FIG. 18, which will be referred later). A position between the third potential-control region 18c and the central potential-control region 18e and another position between the central potential-control region 18e and the first potential-control region 18a, which serve as the base positions of BJTs, respectively, hook type potential barriers against holes are generated. Non-signal charges (holes), which are collected and captured in the central potential-control region 18e and the first potential-control region 18a, are drawn out through the surface interconnection whose illustration is omitted.

Similarly, in a vias condition in which the first control voltage G1=0 volt is applied to the first potential-control region 18a, the fixed potential G0=−1 volt is applied to the central potential-control region 18e, and the third control voltage G3=−2 volts is applied to the third potential-control region 18c, potentials on the horizontal potential cross-section in the upper surface side of the pixel represents a potential profile where a hook structure of p-n-p BJT, in which the first potential-control region 18a is the emitter and the central potential-control region 18e is the collector, and another hook structure of p-n-p BJT, in which the central potential-control region 18e is the emitter and the third potential-control region 18c is the collector, are connected in series. The position between the third potential-control region 18c and the central potential-control region 18e and the position between the central potential-control region 18e and the first potential-control region 18, which serve as the base positions of the BJTs, respectively, the potential barriers of hook type against holes are generated. And the non-signal charges (holes), which are collected and captured in the central potential-control region 18e and the third potential-control region 18c, are drawn out through the surface interconnection whose illustration is omitted.

On the other hand, in a potential profile along a deep horizontal level passing horizontally through the surface-buried region 13, when the first control voltage G1=0 volt is applied to the first potential-control region 18a, the fixed potential G0=−1 volt is applied to the central potential-control region 18e, and the third control voltage G3=−2 volts is applied to the third potential-control region 18c in the third quadrant Q3, a charge-transport route of the potential profile toward the first charge-accumulation region 17a is generated in the lower surface of the modulation region 14 and the surface-buried region 13, and the signal charges generated in the photoelectric-conversion layer 11 are introduced to the first charge-accumulation region 17a in the first quadrant Q1. When the second control voltage G2=0 volt is applied to the second potential-control region 18b, the fixed potential G0=−1 volt is applied to the central potential-control region 18e, and the fourth control voltage G4=−2 volts is applied to the second potential-control region 18b, a charge-transport route of the potential profile toward the second charge-accumulation region 17b is generated in the lower surface of the modulation region 14 and the surface-buried region 13, and the signal charges generated in the photoelectric-conversion layer 11 are introduced to the second charge-accumulation region 17b in the second quadrant Q2.

Similarly, with regard to a potential profile along a deep horizontal level passing horizontally through the surface-buried region 13, when the first control voltage G1=−2 volts is applied to the first potential-control region 15a in the first quadrant Q1, the fixed potential G0=−1 volt is applied to the central potential-control region 18e, and the third control voltage G3=0 volt is applied to the third potential-control region 15c in the third quadrant Q3, a charge-transport route toward the third charge-accumulation region 17c is generated in the lower portion of the modulation region 14 and the surface-buried region 13, and the signal charges generated in the photoelectric-conversion layer 11 are introduced to the third charge-accumulation region 17c in the third quadrant Q3. Moreover, when the second control voltage G2=−2 volts is applied to the second potential-control region 18b, the fixed potential G0=−1 volt is applied to the central potential-control region 18e, and the fourth control voltage G4=0 volt is applied to the fourth potential-control region 18d in the fourth quadrant Q4, a charge-transport route toward the fourth charge-accumulation region 17d is generated in the lower surface of the modulation region 14 and the surface-buried region 13, and the signal charges generated in the photoelectric-conversion layer 11 are introduced to the fourth charge-accumulation region 17d.

That is, by applying the fixed potential to the central potential-control region 18e illustrated in FIG. 8 and sequentially applying the route-select signals to the quadruple potential-control regions 18a, 18b, 18c and 18d around the central potential-control region 18e in accordance with a pulse-application mode determined by the predetermined timing chart (see FIG. 13, which will be described later), a high-speed operation of TOF architecture can be achieved at a high efficiency, by controlling the charge-transport routes generated in the lower portion of the modulation region 14 and the surface-buried region 13 so that the signal charges are sequentially accumulated in the quadruple charge-accumulation regions 17a, 17b, 17c and 17d. Because other matters are substantially similar to those of the solid-state imaging device pertaining to the first embodiment as explained already, the duplicated explanations are omitted.

Third Embodiment

Figure 10:
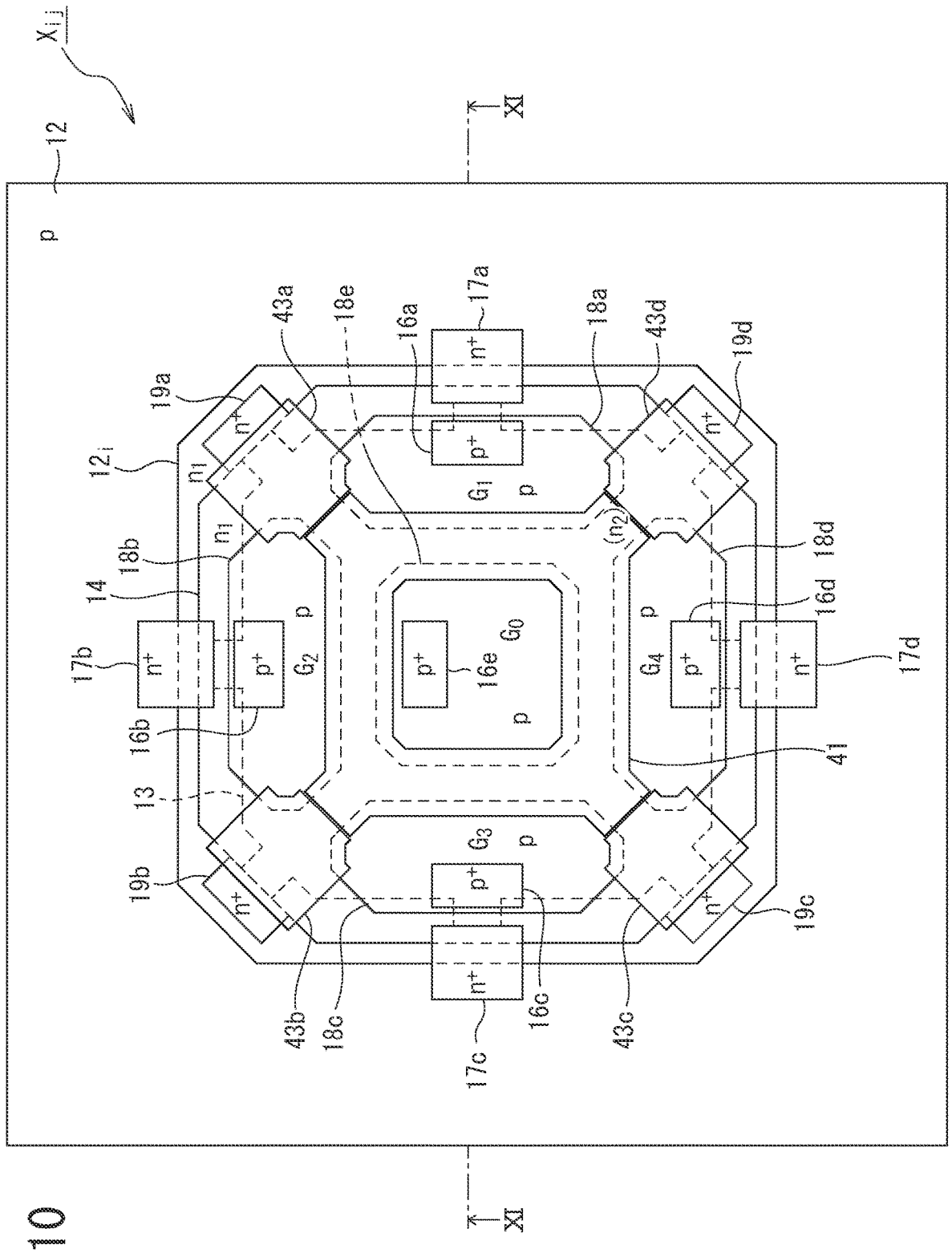
Figure 11:
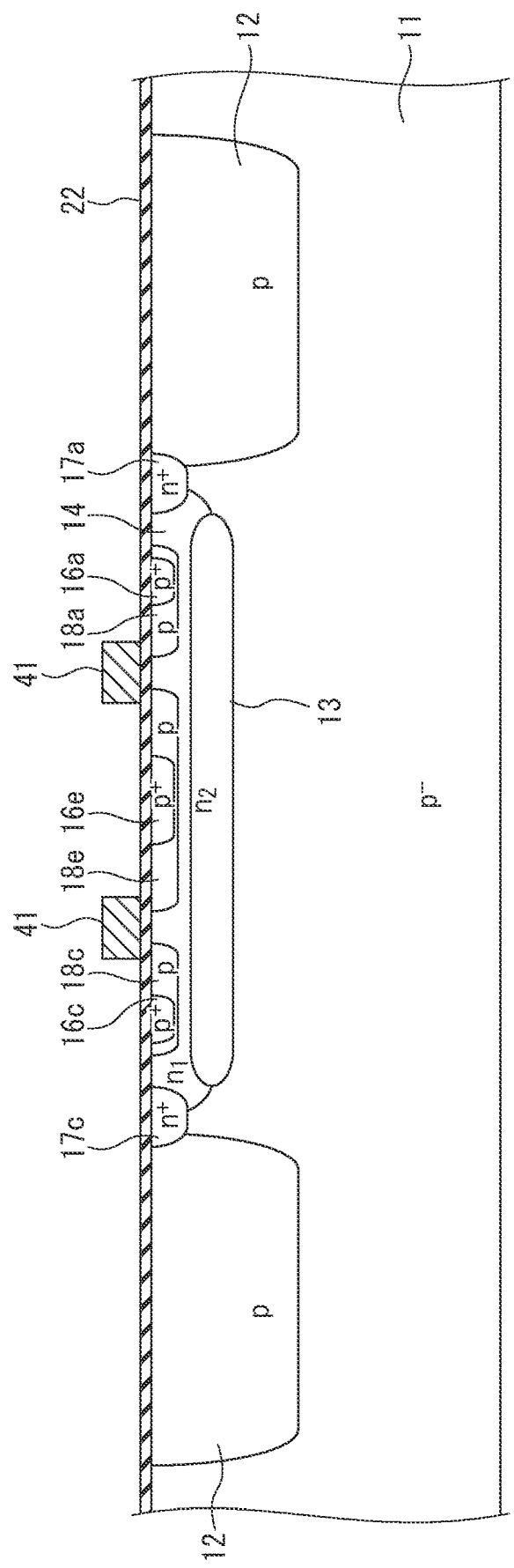
FIG. 11 is a schematic cross-sectional view taken from an IX-IX direction in FIG. 10.

The design principle that the pixel $X_{ij}$ in the solid-state imaging device pertaining to the third embodiment of the present invention is based upon the layout pattern illustrated in FIG. 10, in which the quintuple p$^+$-type potential-control regions 18a, 18b, 18c, 18d and 18e are arranged, is common to the planar layout of the pixel $X_{ij}$ in the solid-state imaging device pertaining to the second embodiment. Similar to the second embodiment, the quintuple potential-control regions 18a, 18b, 18c, 18d and 18e are buried in the upper portion of the n-type modulation region 14, as illustrated in FIG. 11. As can be understood from FIG. 10, with a planar configuration such that the quadruple potential-control regions 18a, 18b, 18c and 18d are separated from each other and surround the central potential-control region 18e, away from the outer contour of the central potential-control region 18e, the potential-control regions 18a, 18b, 18c and 18d, each having the similar planar topology, are buried in the modulation region 14, independently from others. However, the feature that auxiliary-gate electrode 41 is further placed between the central potential-control region 18e and the quadruple potential-control regions 18a, 18b, 18c and 18d differs from the structure of the pixel $X_{ij}$ in the solid-state imaging device pertaining to the second embodiment.

The auxiliary-gate electrode 41 is arranged on a gate insulating film 22 illustrated in FIG. 11, in a planar pattern exemplified in FIG. 10, and implement a plurality of insulated gate structures. As illustrated in FIG. 11, the structure body of the cross-sectional structure of the pixel $X_{ij}$ in the solid-state imaging device pertaining to the third embodiment may be a p⁻-type semiconductor substrate itself, or alternatively, a p⁻-type photoelectric-conversion layer 11 epitaxially grown on the semiconductor substrate. On the photoelectric-conversion layer 11, an n-type modulation region 14 is arranged through a surface-buried region 13. A periphery of a modulation region 14 is surrounded by a p-well 12. A gate insulating film 22 is formed so as to cover the p-well 12, the modulation region 14, and the first potential-control region 18a, the central potential-control region 18e and the third potential-control region 18c of the upper portion of the modulation region 14. Although as the gate insulating film 22, $SiO_2$ film is preferable, it is allowed to use various insulating films other than the $SiO_2$ film. For example, it is allowed to use ONO film implemented by triple-layer lamination film of $SiO_2$ film/$Si_3N_4$ film/$SiO_2$ film. Moreover, oxide which includes at least one element of strontium (Sr), aluminum (Al), magnesium (Mg), yttrium (Y), hafnium (Hf), zirconium (Zr), tantalum (Ta) and bismuth (Bi), or silicon nitride including the foregoing elements can be used as the gate insulating film 22.

As illustrated in FIG. 10, a planar pattern of the auxiliary-gate electrode 41 is a ring-shaped topology that covers the upper portions of a partial area of an outer contour of the central potential-control region 18e and a partial area of an inner contour of an array of the quadruple potential-control regions 18a, 18b, 18c and 18d. As can be understood, the octagonal surface-buried region 13 represented by a broken line in FIG. 10 is locally buried at a lower portion in a center of the modulation region 14. The impurity concentration n2 of the surface-buried region 13 is higher than the impurity concentration n1 of the modulation region 14 (n2>n1). The quintuple potential-control regions 18a, 18b, 18c, 18d and 18e control potentials in the corresponding portions of modulation region 14, in which the potential-control regions 18a, 18b, 18c, 18d and 18e are buried, and potentials in the surface-buried region 13 just under the buried portions of the potential-control regions 18a, 18b, 18c, 18d and 18e, independently of each other, and at the same time, the quintuple potential-control regions 18a, 18b, 18c, 18d and 18e serve as pinning layers for capturing and drawing out non-signal charges. As illustrated in FIG. 10, the modulation region 14 is octagon, and the central potential-control region 18e arranged in the center of the modulation region 14 is also octagon. A structure in which each shape of the quadruple potential-control regions 18a, 18b, 18c and 18d around the central potential-control region 18e is elongated octagon is similar to the topology of the solid-state imaging device pertaining to the second embodiment.

As illustrated in FIG. 10, the auxiliary-gate electrode 41 implements the planar topology that surrounds the outer contour of the central potential-control region 18e with a width that an edge of the width reaches to the first potential-control region 18a. Consequently, a first insulated gate transistor (MIS transistor) is disposed between the central potential-control region 18e and the first potential-control region 18a. Similarly, in a pattern in which the auxiliary-gate electrode 41 surrounds the outer contour of the central potential-control region 18e with the width that an edge of the width reaches to the second potential-control region 18b, the auxiliary-gate electrode 41 implements a second MIS transistor, the gate of which is common to the first MIS transistor between the central potential-control region 18e and the second potential-control region 18b.

Moreover, the auxiliary-gate electrode 41 implements a third MIS transistor between the central potential-control region 18e and the third potential-control region 18c, and furthermore, implements a fourth MIS transistor between the central potential-control region 18e and the fourth potential-control region 18d, respectively, while having the auxiliary-gate electrode 41 common to the first MIS transistor. A p⁺-type first contact region 16a is formed in the inner vicinity at a center of an outer long side of the first potential-control region 18a. Here, the "outer long side" means one of eight sides of elongated octagon. Similarly, a p⁺-type second contact region 16b is formed in the inner vicinity at a center of an outer long side of the second potential-control region 18b. Moreover, a p⁺-type third contact region 16c is arranged in the inner vicinity at a center of an outer long side of the third potential-control region 18c, and a p⁺-type fourth contact region 16d is arranged in the inner vicinity at a center of an outer long side of the fourth potential-control region 18d.

In FIG. 11 that is the cross-sectional view taken from an IX-IX direction in FIG. 10, the first contact region 16a buried in the right side of the first potential-control region 18a, the central contact region 16e buried in the center of the central potential-control region 18e, and the third contact region 16c buried in the left side of the third potential-control region 18c are exposed at a top surface of the photoelectric-conversion layer 11. And, the first charge-accumulation region 17a is exposed at the top surface of the photoelectric-conversion layer 11 in vicinity of the right side of the first potential-control region 18a, and the third charge-accumulation region 17c is exposed at the top surface of the photoelectric-conversion layer 11 in vicinity of the left side of the third potential-control region 18c. The right side of FIG. 11 illustrates the auxiliary-gate electrode 41 implementing a first MIS transistor that is formed between the central potential-control region 18e and the first potential-control region 18a, and the left side of FIG. 11 illustrates the auxiliary-gate electrode 41 implementing a third MIS transistor that is formed between the central potential-control region 18e and the third potential-control region 18c. The right auxiliary-gate electrode 41 and the left auxiliary-gate electrode 41, which are illustrated as patterns separated from each other in FIG. 11, are a continuous integrated member as illustrated in FIG. 11. However, the auxiliary-gate electrodes 41 and the gate insulating film 22 are covered by the inter-layer insulating-film. However, in the cross-sectional structure in FIG. 11, the illustrations of the inter-layer insulating-film, the contact plug penetrating through the inter-layer insulating-film, and the surface interconnections connected through the contact plug to the first contact region 16a and others are omitted similarly to FIGS. 2 and 9.

Also in the pixel $X_{ij}$ in the solid-state imaging device pertaining to the third embodiment, similarly to the second embodiment, the fixed potential, for example, −1 volt is applied to the central potential-control region 18e, and the pulse driven at a mode of (0 volt, −2 volts) is sequentially applied to the quadruple potential-control regions 18a, 18b, 18c and 18d. Consequently, the charge-transport routes of the signal charges are sequentially determined, and the signal charges generated in the pixel $X_{ij}$ can be transferred to the outer directions of the modulation region 14 via the static induction effects. That is, the n⁺-type first charge-accumulation region 17a is formed as the floating-drain region at the outer boundary of the first potential-control region 18a arranged in the first quadrant Q1. Similarly, the n⁺-type second charge-accumulation region 17b is formed as the floating-drain region at the outer boundary of the second potential-control region 18b arranged in the second quadrant Q2. Moreover, the n⁺-type third charge-accumulation region 17c is arranged as the floating-drain region at the outer boundary of the third potential-control region 18c arranged in the third quadrant Q3, and the n+-type fourth charge-accumulation region 17d is arranged as the floating-drain region at the outer boundary of the fourth potential-control region 18d arranged in the fourth quadrant Q4.

The first charge-accumulation region 17a, second charge-accumulation region 17b, third charge-accumulation region 17c and fourth charge-accumulation region 17d are arrayed at equal interval at positions radiating outer ward. As the modulation region 14 is an unequal-sided octagon having long and short sides alternately, the radiating directions of the first charge-accumulation region 17a, second charge-accumulation region 17b, third charge-accumulation region 17c and fourth charge-accumulation region 17d cut the long sides of the octagon, respectively. And, a first exhaust-drain region 19a, a second exhaust-drain region 19b, a third exhaust-drain region 19c and a fourth exhaust-drain region 19d are arrayed respectively in contact with the short sides of the modulation region 14 exhibiting the unequal-sided octagon. Through the gate insulating film 22 whose illustration is omitted in FIG. 10, because the gate insulating film 22 is transparent, as illustrated in FIG. 10, a first exhaust-gate electrode 43a is placed so as to cover a top short side of the first potential-control region 18a, a right short side of the second potential-control region 18b and a part of the first exhaust-drain region 19a. Similarly, a second exhaust-gate electrode 43b is placed so as to cover a left short side of the second potential-control region 18b, a top short side of the third potential-control region 18c and a part of the second exhaust-drain region 19b. Moreover, a third exhaust-gate electrode 43c is placed so as to cover a lower short side of the third potential-control region 18c, a left short side of the fourth potential-control region 18c and a part of the third exhaust-drain region 19c, and a fourth exhaust-gate electrode 43d is placed so as to cover a right short side of the fourth potential-control region 18d, a lower short side of the first potential-control region 18c and a part of the fourth exhaust-drain region 19d.

Also, in FIG. 10, although the illustrations of the wiring layouts of the surface interconnections 31 to 38 and others illustrated in FIG. 1 are omitted, including the surface interconnection connected to the central contact region 16e in the central potential-control region 18e, it is natural that the surface interconnection of the layout exemplified in FIG. 1, or alternatively, a layout differing from FIG. 1 is connected. Also, the effectiveness that, with surface interconnections implemented by transparent electrodes such as polycrystalline silicon and the like, it is possible to protect the reduction of the opening ratio for the pixel $X_{ij}$ is similar to the first and second embodiments.

Although the illustration of the potential profile in FIG. 4 which has been used in the explanation of the first embodiment is omitted, if there is no auxiliary-gate electrode 41, when the first control voltage G1=−2 volts is applied to the first potential-control region 18a, the fixed potential G0=−1 volt is applied to the central potential-control region 18e, and the third control voltage G3=0 volt is applied to the third potential-control region 18c, a potential profile measured along the horizontal cross-section passing through the upper surface side of the pixel represents a potential profile of double hook structures connected in series. The double hook structures include a hook structure of p-n-p BJT, in which the third potential-control region 18c is the emitter and the central potential-control region 18e is the collector, and another hook structure of p-n-p BJT, in which the central potential-control region 18e is the emitter and the first potential-control region 18a is the collector. Similarly, if there is no auxiliary-gate electrode 41, when the first control voltage G1=0 volt is applied to the first potential-control region 18a, the fixed potential G0=−1 volt is applied to the central potential-control region 18e, and the third control voltage G3=−2 volts is applied to the third potential-control region 18c, the potential profile measured along the horizontal cross-section passing through the upper surface side of the pixel represents a potential profile of double hook structures, where a hook structure of p-n-p BJT, in which the first potential-control region 18a is the emitter and the central potential-control region 18e is a connector, and another hook structure of p-n-p BJT, in which the central potential-control region 18e is the emitter and the third potential-control region 18c is the collector are connected in series.

That is, as explained in the explanation of the second embodiment, if there is no auxiliary-gate electrode 41, the hook-type potential barriers against the non-signal charges (holes) are generated at a position between the third potential-control region 18c and the central potential-control region 18e and a position between the central potential-control region 18e and the first potential-control region 18a, which serve as the bases of BJTs, respectively. However, in a vias condition in which the first control voltage G1, the second control voltage G2, the third control voltage G3 and the fourth control voltage G4 are not driven, for example, under assumption of G1=G2=G3=G4=0 volt, when a negative voltage is applied to the auxiliary-gate electrode 41, the potential barrier against the non-signal charges is removed. When the negative voltage (non-signal charge-induction pulse) is applied to the auxiliary-gate electrode 41, the auxiliary-gate electrode 41 induces the non-signal charges just under the auxiliary-gate electrode 41, and the non-signal charges are drawn out to the surface interconnection through the central potential-control region 18e maintained at the fixed potential G0=−1 volt from just under the auxiliary-gate electrode 41.

On the other hand, when a positive voltage is applied to the auxiliary-gate electrode 41 in a vias condition in which the first control voltage G1, the second control voltage G2, the third control voltage G3 and the fourth control voltage G4 are not driven, the potential barrier against the non-signal charges becomes high. The potential barrier against the non-signal charges serves as a potential well for electrons, which will contribute to dark current and background light components. Thus, when a positive potential is applied as "a charge-exhaust voltage" to the exhaust-gate electrodes 43a, 43b, 43c and 43d, electrons contributing to the dark current and background light components just under the auxiliary-gate electrode 41 can be drawn out to the exhaust-drain regions 19a, 19b, 19c and 19d. That is, the auxiliary-gate electrode 41 facilitates the extraction of electrons contributing to the dark current and background light components to the exhaust-drain regions 19a, 19b, 19c and 19d.

Figure 12:
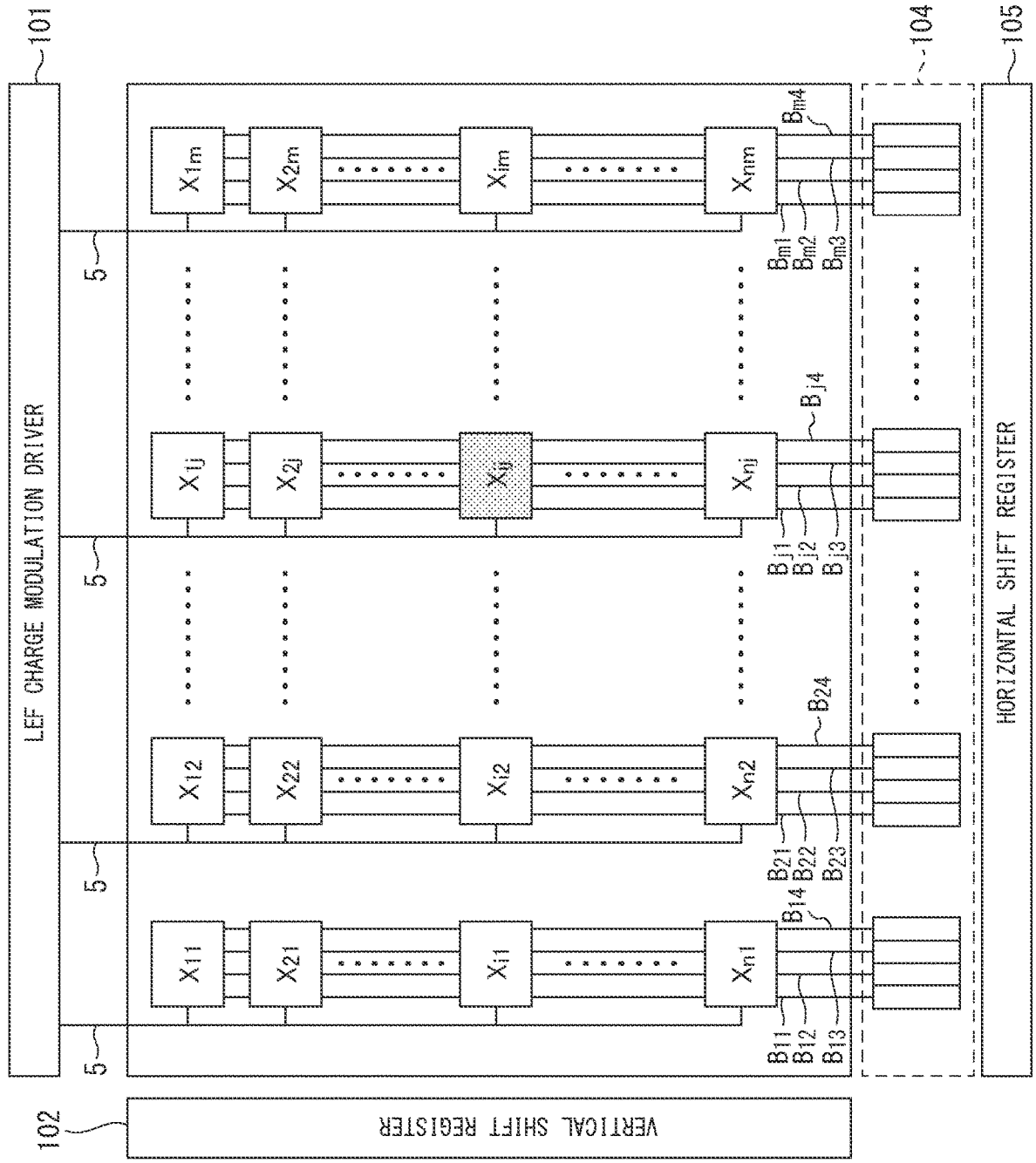
FIG. 12 is a plan view explaining an outline of a layout on a semiconductor chip of the solid-state imaging device pertaining to the third embodiment.

In the solid-state imaging device pertaining to the third embodiment, as illustrated in FIG. 12, the pixel-array area and a peripheral-circuit area (101, 102, 104 and 105) are arranged and integrated on the same semiconductor chip. In the pixel-array area, a plurality of active pixels $X_{ij}$ illustrated in FIG. 10 is arrayed in a shape of two-dimensional matrix. And, on the upper side area of the pixel-array area, an LEF charge modulation driver 101 is deployed along pixel rows $X_{11}$-$X_{1m}$; $X_{21}$ to $X_{2m}$; - - - , $X_{n1}$ to $X_{nm}$ directions. In the lower side of the pixel-array area, a column parallel folded integration/cyclic A/D converters 104 and a horizontal shift register 105 connected to the column parallel folded integration/cyclic A/D converters 104 are deployed along pixel rows X11, X12, X13, - - - X1m; - - - X105, X104, X103, - - - X2m; X31, X32, X33, - - - X3m; - - - Xn1, Xn2, Xn3, - - - X$_{nm}$ directions, which is represented along a horizontal direction in FIG. 12.

From the charge modulation driver 101, for each column, respectively, a first control voltage G$_1$, a second control voltage G$_2$, a third control voltage G$_3$, a fourth control voltage G$_4$ and a charge-exhaust voltage G$_D$ are delivered with different phase relations from each other. In the left side of the pixel-array area, a vertical shift register 103 is deployed along pixel columns X11, X21, - - -, Xi1, - - -, Xn1; X12, X22, - - -, Xi2, - - -, Xn2; X1j, X2j, - - -, Xij, - - -, Xnj; - - -; X1m, X2m, - - -, Xim - - -, Xnm directions, the column direction is represented as a vertical direction in FIG. 12. A timing generator whose illustration is omitted is connected to the vertical shift register 103 and the horizontal shift register 105. In the solid-state imaging device pertaining to the third embodiment, signal read-out operations and A/D conversions are performed on the column parallel folded integration/cyclic A/D converters 104 deployed in the lower side of the pixel-array area, and noise is further cancelled. Consequently, signal levels caused by optical charges are extracted, and signals in which fixed pattern noise and a part of temporal random noise (reset noise) are cancelled are determined.

Figure 13:
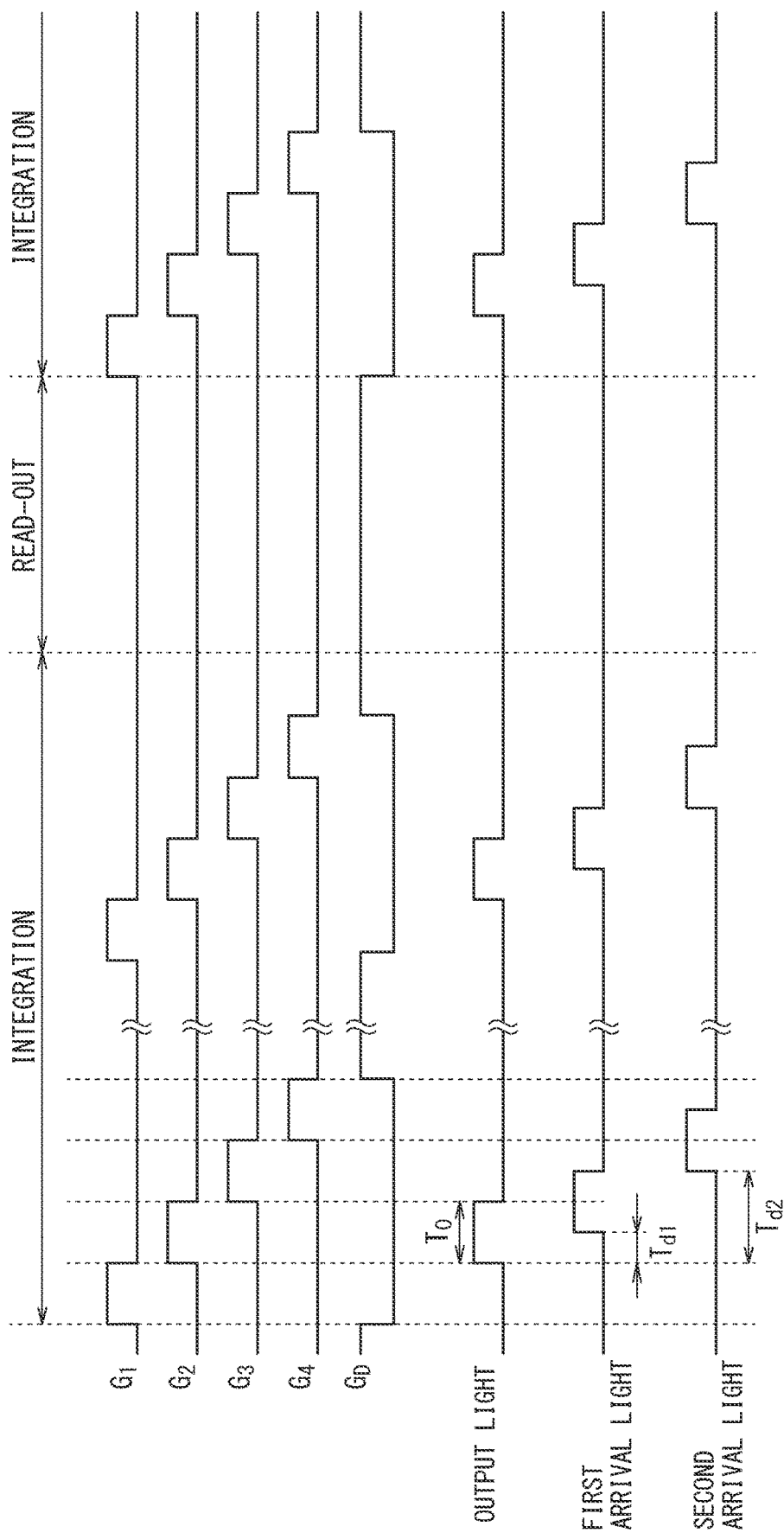
FIG. 13 is a timing chart explaining an operation of a quadruple-output charge-modulation element pertaining to the third embodiment.

As illustrated in FIG. 13, a quadruple-output charge-modulation element pertaining to the third embodiment is operated with a pulsed light whose duty is relatively narrow. As illustrated in FIG. 13, in a period for accumulating charges modulated by the charge-modulation element, after receiving an optical pulse of arrival light, the quadruple-output charge-modulation element operates cyclically, by the quintuple pulsed signals implemented by the first control voltage G$_1$, the second control voltage G2, the third control voltage G3, the fourth control voltage G4 and the charge-exhaust voltage G$_D$, as illustrated in FIG. 13.

(a) In a period in which the first control voltage G$_1$ is a second potential level H, the second control voltage G$_2$ is a first potential level L, the third control voltage G$_3$ is the first potential level L, and the fourth control voltage G$_4$ is the first potential level L, signal charges generated in the light-receiving area are transferred to the first charge-accumulation region 17a illustrated in FIG. 10.

(b) In a period in which the second control voltage G$_2$ is the second potential level H, the first control voltage G$_1$ is the first potential level L, the third control voltage G$_3$ is the first potential level L, and the fourth control voltage G$_4$ is the first potential level L, the signal charges generated in the light-receiving area are transferred to the second charge-accumulation region 17b illustrated in FIG. 10.

(c) In a period in which the third control voltage G3 is the second potential level H, the first control voltage G1 is the first potential level L, the third control voltage G3 is the first potential level L, and the fourth control voltage G$_4$ is the first potential level L, the signal charges generated in the light-receiving area are transferred to the third charge-accumulation region 17c illustrated in FIG. 10.

(d) In a period in which the fourth control voltage G$_4$ is the second potential level H, the first control voltage G$_1$ is the first potential level L, the second control voltage G2 is the first potential level L, and the third control voltage G3 is the first potential level L, the signal charges generated in the light-receiving area are transferred to the fourth charge-accumulation region 17d illustrated in FIG. 10.

(e) On the other hand, in a period in which the charge-exhaust voltage G$_D$ is a second potential level H$_D$, the first control voltage G$_1$ is the first potential level L, the second control voltage G2 is the first potential level L, the third control voltage G$_3$ is the first potential level L, and the fourth control voltage G$_4$ is the first potential level L, the signal charges generated in the light-receiving area are drawn out to the first exhaust-drain region 19a, the second exhaust-drain region 19b, the third exhaust-drain region 19c and the fourth exhaust-drain region 19d.

At the time, when the optical pulse of the arrival light is received at the timing illustrated in FIG. 13, optical charges are transferred to the second charge-accumulation region 17b and the third charge-accumulation region 17c. Charges accumulated in the second charge-accumulation region 17b and the third charge-accumulation region 17c are defined as Q2 and Q3, the Q2 and the Q3 are expressed by the following Eqs. (1) and (2).

$$Q_2 = I_{ph}(T_0 - T_4) + I_a T_o \quad (1)$$

$$Q_3 = I_{ph} T_4 + I_a T_o \quad (2)$$

Here, the I$_{ph}$ is an optical current by an optical pulsed signal, the I$_a$ is an optical current by background light, the To is a pulse width of light, and the T$_4$ is a delay time of the optical pulse caused by a light flight time. In a period in which the first control voltage G$_1$ is the second potential level H, the second control voltage G2 is the first potential level L, the third control voltage G$_3$ is the first potential level L, and the fourth control voltage G$_4$ is the first potential level L, and in a period in which the first control voltage G$_1$ is the first potential level L, the second control voltage G$_2$ is the first potential level L, the third control voltage G$_3$ is the first potential level L, and the fourth control voltage G$_4$ is the second potential level H, since the optical pulse does not arrive, the signal only caused by the background light is accumulated. At this time, when the charges accumulated in the first charge-accumulation region 17a and the charges accumulated in the fourth charge-accumulation region 17d are defined as Q1 and Q4, the Q1 and the Q4 are expressed by the following Eqs. (3) and (4).

$$Q1 = I_a T_o \quad (3)$$

$$Q4 = I_a T_o \quad (4)$$

By using the value of Q1, it is possible to estimate a light flight time while the influence of the background light included in the Q2 and the Q3 is cancelled. That is, from the Eqs. (1), (2) and (3), the light flight time is expressed by the following Eq. (5).

$$T_d = T_o(Q3 - Q1)/(Q2 + Q3 - 2Q1) \quad (5)$$

When the optical pulse arrives at the timing of the second arrival light in FIG. 13 and a light flight time (delay time) of the arrival light is defined as T$_{d2}$, the charges Q1, Q2, Q3 and Q4 which are accumulated in the first charge-accumulation region 17a, the second charge-accumulation region 17b, the third charge-accumulation region 17c and the charge-accumulation region 17d, respectively, are represented as followings.

$$Q1 = I_a T_o \quad (6)$$

$$Q2 = I_a T_o \quad (7)$$

$$Q3 = I_{ph}(2T_o - T_{d2}) + I_a T_o \quad (8)$$

$$Q4 = I_{ph}(2Td2 - T_o) + I_a T_o \quad (9)$$

By using Eqs. (6), (7), (8) and (9), the T$_{d2}$ can be calculated by the following Eq. (10).

$$T_{d2} = T_o + T_o(Q4 - Q1)/(Q4 + Q3 - 2Q1) \quad (10)$$

In this way, by the quadruple-output charge-modulation element pertaining to the third embodiment, it is possible to carry out a distance measurement in a range of twice the light flight time of the $T_o$ by a pulse width of the $T_o$. Whether or not the flight time of the optical pulse is longer than the $T_o$ can be known by comparing the Q2 with the Q4. That is, if the flight time of the optical pulse is Q2>Q4, a calculation is performed by the Eq. (4), and if Q2≦Q4, the calculation is performed by the Eq. (10).

That is, the effectiveness that it is possible to achieve the TOF operation at high efficiency and high speed, by applying the fixed potential to the central potential-control region 18e illustrated in FIG. 10, by sequentially applying the route-select signals to the quadruple potential-control regions 18a, 18b, 18c and 18d around the central potential-control region 18e in accordance with the pulse-application mode determined by the predetermined timing chart, and by controlling the charge-transport routes generated in the lower surface of the modulation region 14 and the surface-buried region 13 so that the signal charges are sequentially accumulated in the quadruple charge-accumulation regions 17a, 17b, 17c and 17d, is substantially similar to the solid-state imaging device pertaining to the second embodiment. Thus, the duplicated explanations are omitted.

Fourth Embodiment

Figure 14:
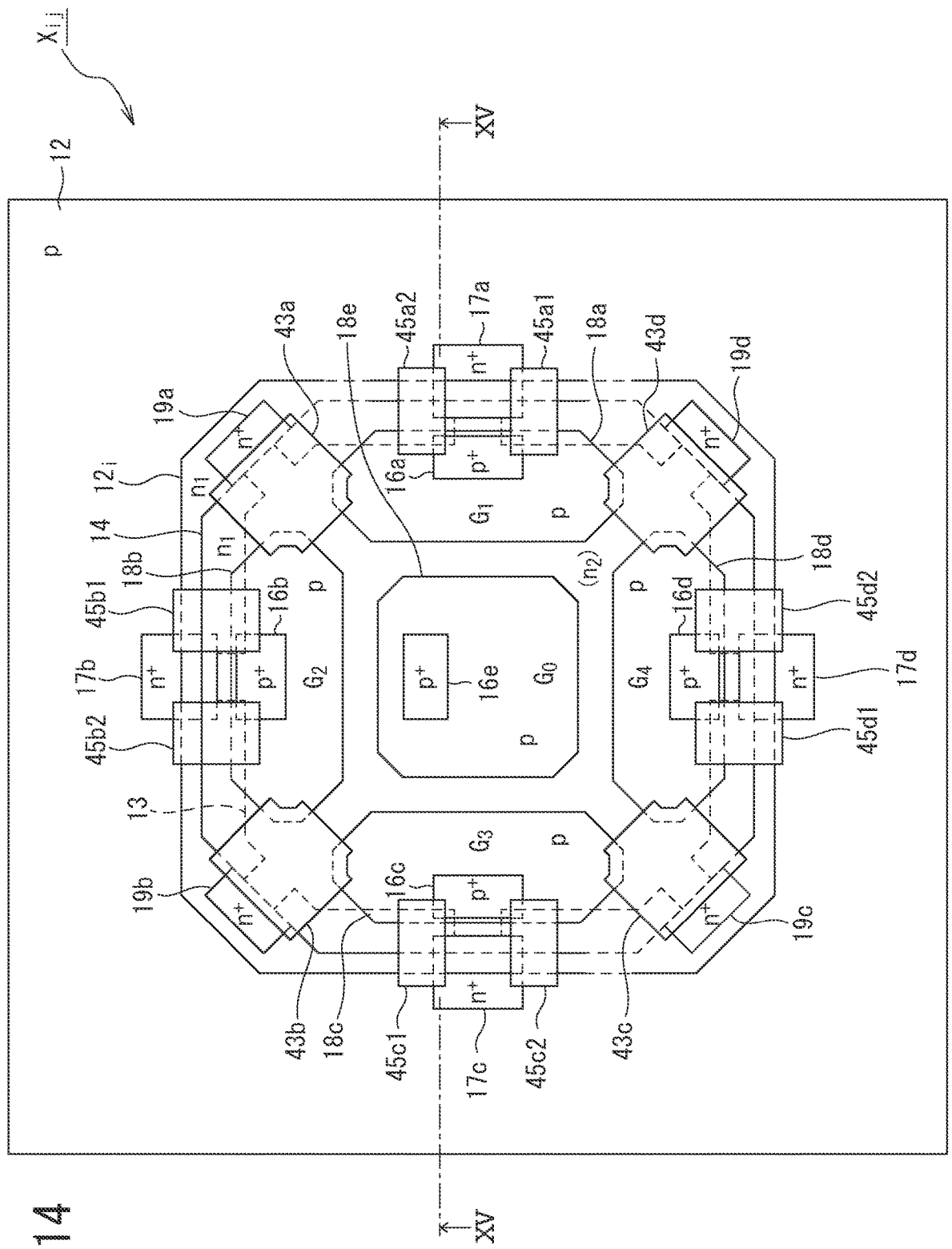
Figure 15:
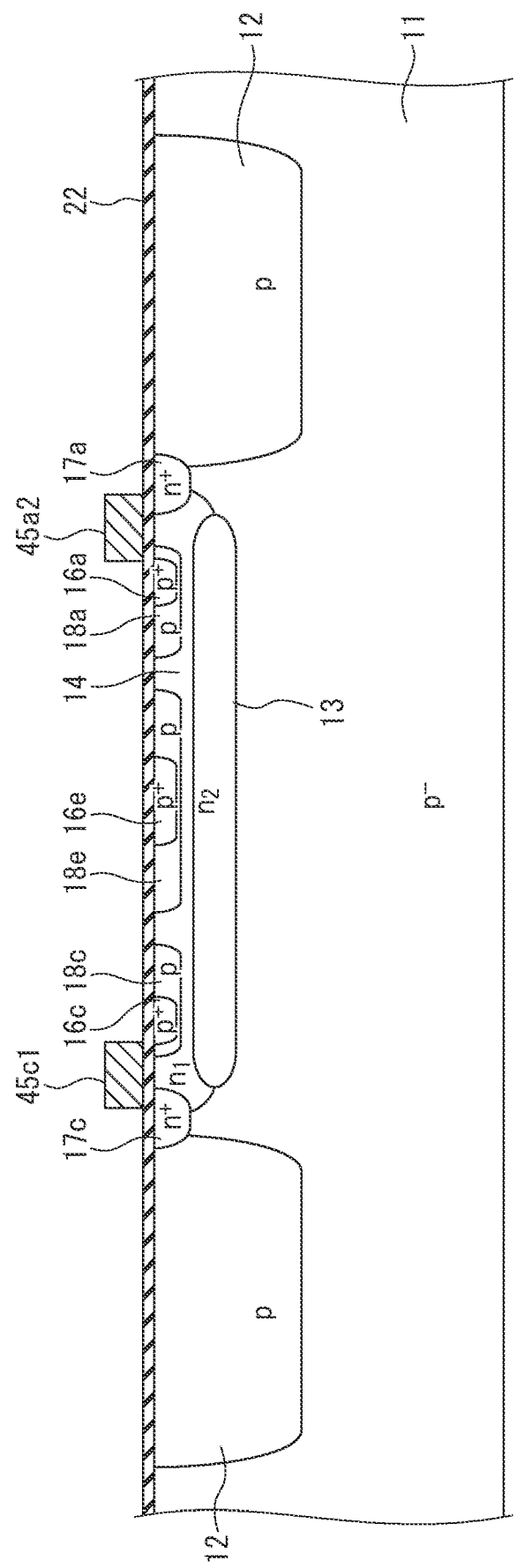
FIG. 15 is a schematic cross-sectional view taken from an XV-XV direction in FIG. 14.

The design principle that the pixel $X_{ij}$ in a solid-state imaging device pertaining to the fourth embodiment of the present invention is based upon the layout pattern in which quintuple p$^+$-type potential-control regions 18a, 18b, 18c, 18d and 18e are arranged as illustrated in FIG. 14 is common to the planar layout of the pixel $X_{ij}$ in the solid-state imaging device pertaining to the second and third embodiments. Similar to the second embodiment and others, the quintuple potential-control regions 18a, 18b, 18c, 18d and 18e are buried in the upper portion of the n-type modulation region 14 as illustrated in FIG. 15. When the center of the central potential-control region 18e coincides with the center of the polar coordinate group, as can be understood from FIG. 14, the quadruple potential-control regions 18a, 18b, 18c and 18d are arrayed radially in the topology of the quadruple rotational symmetry, with a center of the polar coordinate group as a rotational center. A layout of the quadruple potential-control regions 18a, 18b, 18c and 18d, which are separated from each other and surround the central potential-control region 18e away from the outer contour of the central potential-control region 18e, and the potential-control regions 18a, 18b, 18c and 18d, each of which having the similar pattern, are arrayed radially, independent of each other in the modulation region 14, is similar to the array of the second embodiment. However, a structure that the pixel $X_{ij}$ in the solid-state imaging device pertaining to the fourth embodiment includes quadruple pairs of electric-field control-electrodes 45a1, 45a2; 45b1, 45b2; 45c1, 45c2; 45d1, 45d2 on the outer boundary of the array of the quadruple potential-control regions 18a, 18b, 18c and 18d, which are arrayed in the topology of the quadruple rotational symmetry, differs from the structure of the pixel $X_{ij}$ in the solid-state imaging device pertaining to the second embodiment.

As illustrated in FIG. 14, the n$^+$-type first charge-accumulation region 17a is arranged as a floating-drain region at the outer boundary of the first potential-control region 18a arranged in the first quadrant Q1. Similarly, the n$^+$-type second charge-accumulation region 17b is arranged as the floating-drain region at the outer boundary of the second potential-control region 18b arranged in the second quadrant Q2, the n$^+$-type third charge-accumulation region 17c is arranged as the floating-drain region at the outer boundary of the third potential-control region 18c arranged in the third quadrant Q3, and the n$^+$-type fourth charge-accumulation region 17d is arranged as the floating-drain region at the outer boundary of the fourth potential-control region 18d arranged in the fourth quadrant Q4. As the modulation region 14 exhibits an unequal-sided octagon having long sides and short sides alternately, each of the first charge-accumulation region 17a, second charge-accumulation region 17b, third charge-accumulation region 17c and fourth charge-accumulation region 17d is arrayed at a position located at an outer long side of the modulation region 14, so that the first charge-accumulation region 17a, second charge-accumulation region 17b, third charge-accumulation region 17c and fourth charge-accumulation region 17d are arrayed at an equal interval.

In FIG. 14, the pair of the first electric-field control-electrodes 45a1 and the first electric-field control-electrodes 45a2 arranged in the first quadrant Q1, when a pulsed voltage is applied as a transfer signal (transfer voltage) to the first electric-field control-electrodes 45a1 and the first electric-field control-electrodes 45a2 at the same time, controls a lateral electric field in the modulation region 14 between the first electric-field control-electrodes 45a1 and the counterpart first electric-field control-electrodes 45a2, by generating a potential profile for creating a charge-transport route in the modulation region 14. And, through the charge-transport route between the first electric-field control-electrodes 45a1 and the counterpart first electric-field control-electrodes 45a2, the signal charges are transferred toward the first charge-accumulation region 17a. That is, since the pulsed voltage is applied as the transfer signal (transfer voltage) to the first electric-field control-electrodes 45a1 and the counterpart first electric-field control-electrodes 45a2 at the same time, a potential gradient in the charge-transport route passing through the first potential-control region 18a is defined in the modulation region 14 via the static induction effect, and the signal charges generated in the pixel $X_{ij}$ are transferred to the first charge-accumulation region 17a. The transferring of the signal charges by the first electric-field control-electrodes 45a1 and the counterpart first electric-field control-electrodes 45a2 can transport the charges at an extremely high speed, because the carrier transport does not involve the scattering of the signal charges caused by surface defects generated in the interface between oxide film and semiconductor such as usual MOS structure.

Similarly, the pair of the second electric-field control-electrode 45b1 and the counterpart second electric-field control-electrode 45b2 arranged in the second quadrant Q2 controls a lateral electric field in the modulation region 14 located between the second electric-field control-electrode 45b1 and the counterpart second electric-field control-electrode 45b2, the lateral electric field is induced by the application of the transfer signal (transfer voltage), and defines a potential gradient in the charge-transport route passing through the second potential-control region 18b via the static induction effect, and transfers the signal charges generated in the pixel $X_{ij}$ to the second charge-accumulation region 17b at a high speed. Also, the pair of the third electric-field control-electrode 45c1 and the counterpart third electric-field control-electrode 45c2 arranged in the third quadrant Q3 controls a lateral electric field in the modulation region 14 located between the third electric-field control-electrode 45c1 and the counterpart third electric-field control-electrode 45c2, the lateral electric field is induced by the application of the transfer signal (transfer voltage), and defines a potential gradient in the charge-transport route passing through the third potential-control region 18c via the static induction effect, and transfers the signal charges generated in the pixel $X_{ij}$ to the third charge-accumulation region 17c at a high speed. Moreover, the pair of the fourth electric-field control-electrode 45d1 and the counterpart fourth electric-field control-electrode 45b2 arranged in the fourth quadrant Q4 controls a lateral electric field in the modulation region 14 located between the fourth electric-field control-electrode 45d1 and the fourth electric-field control-electrode 45d2, the lateral electric field is induced by the application of the transfer signal (transfer voltage), and defines a potential gradient in the charge-transport route passing through the fourth potential-control region 18d via the static induction effect, and transfers the signal charges generated in the pixel $X_{ij}$ to the fourth charge-accumulation region 17d at a high speed.

Also in the pixel $X_{ij}$ in the solid-state imaging device pertaining to the fourth embodiment, similarly to the second and third embodiments, a fixed potential, for example, −1 volt is applied to the central potential-control region 18e, and the pulse driven at the mode (0 volt, −2 volts) is sequentially applied to the quadruple potential-control regions 18a, 18b, 18c and 18d, and the charge-transport routes of the signal charges are sequentially determined. In the solid-state imaging device pertaining to the fourth embodiment, the transfer voltages are sequentially applied to the quadruple pairs of the electric-field control-electrodes 45a1, 45a2; 45b1, 45b2; 45c1, 45c2; 45d1, 45d2 arrayed as the topology of the quadruple rotational symmetry in each pixel $X_{ij}$, in accordance with the pulse-timing chart for the quadruple potential-control regions 18a, 18b, 18c and 18d. Consequently, the signal charges generated in the pixel $X_{ij}$ can be sequentially transferred to the charge-accumulation regions 17a, 17b, 17c and 17d outside the modulation region 14 at a desirable timing.

In FIG. 15, the counterpart first electric-field control-electrodes 45a2 and the third electric-field control-electrodes 45c1 are exposed at the top surface of the photoelectric-conversion layer 11 on the cross-sectional view, taken along an XV-XV direction in FIG. 4. The counterpart first electric-field control-electrodes 45a2 and the third electric-field control-electrodes 45c1 are arranged on a gate insulating film 22 illustrated in FIG. 15 and implement insulated gate structures. As the cross-sectional structure of the pixel $X_{ij}$ in the solid-state imaging device pertaining to the fourth embodiment is illustrated in FIG. 15, the structure body can be implemented by a p⁻-type semiconductor substrate itself, or alternatively, by the p⁻-type photoelectric-conversion layer 11 epitaxially grown on the semiconductor substrate, which is similar to the structure body disclosed in the first to third embodiments. On the photoelectric-conversion layer 11, the n-type modulation region 14 is arranged through the surface-buried region 13. A periphery of the modulation region 14 is surrounded by the p-well 12. The gate insulating film 22 is formed so as to cover the p-well 12, the modulation region 14, and the first potential-control region 18a, central potential-control region 18e and third potential-control region 18c of the upper portion of the modulation region 14. As the gate insulating film 22, the $SiO_2$ film is preferable. However, it is allowed to use various insulating films, such as the ONO film other than the $SiO_2$ film, or the oxide which includes at least one element of Sr, Al, Mg, Y, Hf, Zr, Ta and Bi, or the silicon nitride including the foregoing elements.

As can be understood from FIG. 15, the octagonal surface-buried region 13 illustrated by a broken line in FIG. 14 is locally buried in a lower portion at a center of the modulation region 14. The impurity concentration n2 of the surface-buried region 13 is higher than the impurity concentration n1 of the modulation region 14 (n2>n1). The quintuple potential-control regions 18a, 18b, 18c, 18d and 18e control potentials in the corresponding portions of modulation region 14, in which the potential-control regions 18a, 18b, 18c, 18d and 18e are buried, and potentials in the surface-buried region 13 just under the buried portions of the potential-control regions 18a, 18b, 18c, 18d and 18e, independently of each other, and at the same time, the quintuple potential-control regions 18a, 18b, 18c, 18d and 18e serve as pinning layers for capturing and drawing out non-signal charges. As illustrated in FIG. 14, the modulation region 14 is octagon, and the central potential-control region 18e arranged in the center of the modulation region 14 is also octagon. A configuration in which each shape of the quadruple potential-control regions 18a, 18b, 18c and 18d around the central potential-control region 18e is elongated octagon is similar to the topology of the solid-state imaging device pertaining to the second and third embodiments.

In FIG. 15 that is the cross-sectional view taken alone the XV-XV direction in FIG. 14, the first contact region 16a buried in the right side of the first potential-control region 18a, the central contact region 16e buried in the center of the central potential-control region 18e, and the third contact region 16c buried in the left side of the third potential-control region 18c are exposed at the top surface of the photoelectric-conversion layer 11. In addition to the first contact region 16a, the central contact region 16e and the third contact region 16c, the plan view of FIG. 14 illustrates that the p⁺-type second contact region 16b is formed at inner vicinity at a center of an outer long side of the second potential-control region 18b, and the p⁺-type fourth contact region 16d is arranged at inner vicinity at a center of an outer long side of the fourth potential-control region 18d. In the cross-sectional structure in FIG. 15, the illustrations of the inter-layer insulating-film, the contact plug penetrating through the inter-layer insulating-film, or the surface interconnections connected through the contact plug to the first contact region 16a and others are omitted similarly to FIGS. 2 and 9.

As illustrated in FIG. 14, in the solid-state imaging device pertaining to the fourth embodiment, the first exhaust-drain region 19a, the second exhaust-drain region 19b, the third exhaust-drain region 19c and the fourth exhaust-drain region 19d are arrayed respectively in contact with the short sides of the modulation region 14, which has the shape of the unequal-sided octagon. Through the gate insulating film 22 whose illustration is omitted in FIG. 14, a first exhaust-gate electrode 43a is placed so as to cover a top short side of the first potential-control region 18a, a right short side of the second potential-control region 18b and a part of the first exhaust-drain region 19a as illustrated in FIG. 14. Similarly, a second exhaust-gate electrode 43b is placed so as to cover a left short side of the second potential-control region 18b, a top short side of the third potential-control region 18c and a part of the second exhaust-drain region 19b. Moreover, a third exhaust-gate electrode 43c is placed so as to cover a lower short side of the third potential-control region 18c, a left short side of the fourth potential-control region 18c and a part of the third exhaust-drain region 19c, and a fourth exhaust-gate electrode 43d is placed so as to cover a right short side of the fourth potential-control region 18d, a lower short side of the first potential-control region 18c and a part of the fourth exhaust-drain region 19d.

According to the pixel $X_{ij}$ in the solid-state imaging device pertaining to the fourth embodiment, by applying the fixed potential to the central potential-control region 18e illustrated in FIG. 14 and sequentially applying the route-select signals to the quadruple potential-control regions 18a, 18b, 18c and 18d around the central potential-control region 18e, in accordance with the pulse-application mode determined by the timing chart similar to the exemplification in FIG. 13, it is possible to achieve the TOF operation, by controlling the charge-transport routes generated in the lower surface of the modulation region 14 and the surface-buried region 13 so that the signal charges are sequentially accumulated in the quadruple charge-accumulation regions 17a, 17b, 17c and 17d. At that time, by sequentially applying the transfer voltages to the quadruple pairs of the electric-field control-electrodes 45a1, 45a2; 45b1, 45b2; 45c1, 45c2; 45d1, 45d2 synchronously with the route-select signals, the signal charges generated in the pixel $X_{ij}$ can be transferred to the charge-accumulation regions 17a, 17b, 17c and 17d at higher speed than the solid-state imaging devices pertaining to the second and third embodiments. Moreover, by applying the positive potentials to the exhaust-gate electrode 43a, 43b, 43c and 43d illustrated in FIG. 14, electrons contributing to the dark current and background light components in the pixel $X_{ij}$ in the solid-state imaging device pertaining to the fourth embodiment can be drawn out to the exhaust-drain regions 19a, 19b, 19c and 19d. The other structures, operations and features are substantially similar to those of the solid-state imaging devices pertaining to the second and third embodiments, which have the quintuple potential-control regions 18a, 18b, 18c, 18d and 18e. Thus, the duplicated explanations are omitted.

Modification of Fourth Embodiment

Figure 16:
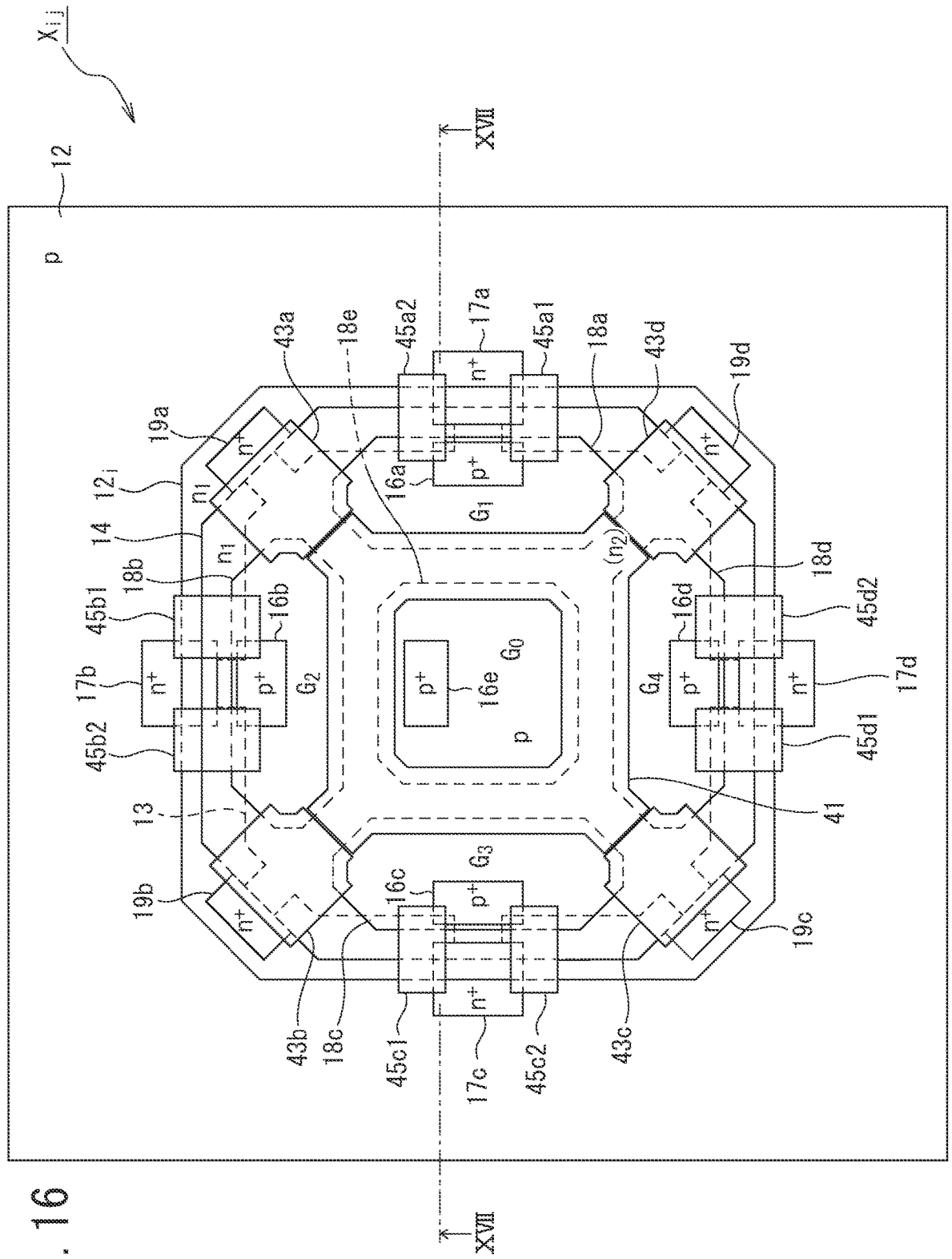
Figure 17:
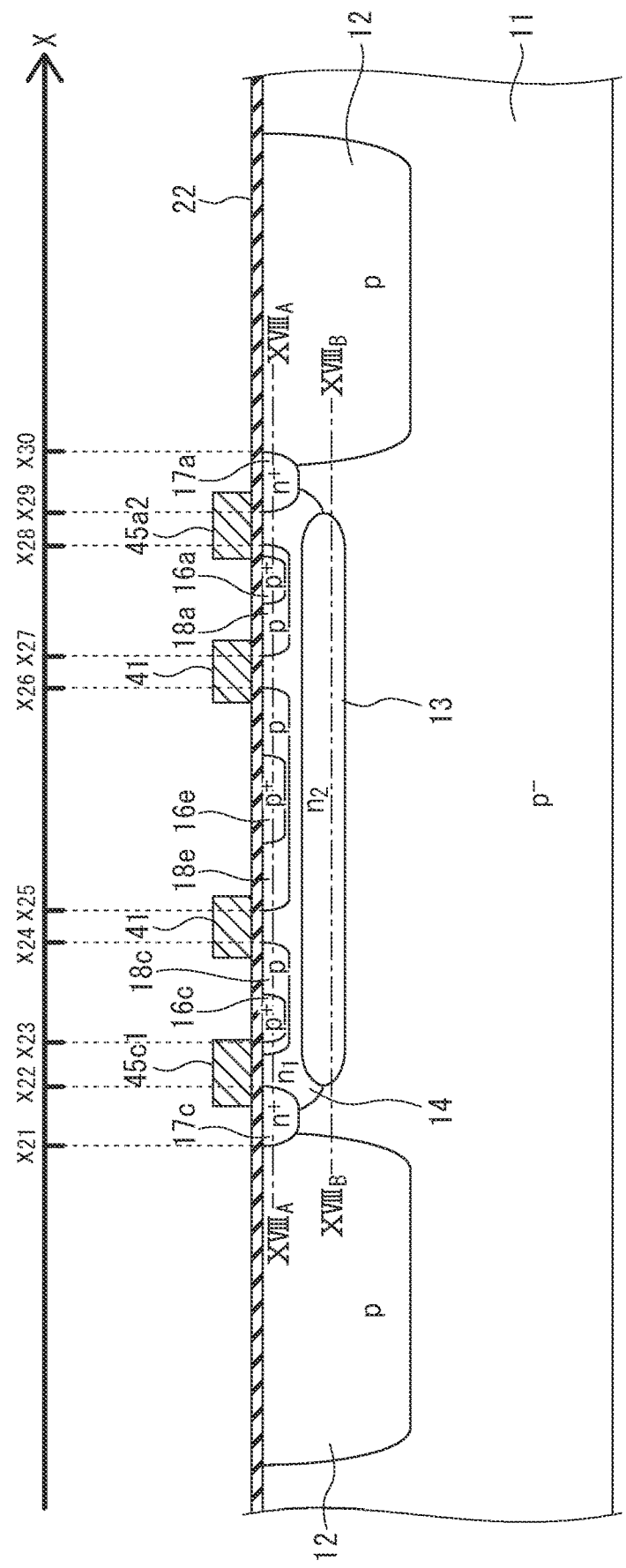
FIG. 17 is a schematic cross-sectional view taken from an XVII-XVII direction in FIG. 16.

A design principle such that a planar layout of a pixel $X_{ij}$ in a solid-state imaging device pertaining to a modification of the fourth embodiment of the present invention has a pattern in which the quintuple p$^+$-type potential-control regions 18a, 18b, 18c, 18d and 18e are arranged as illustrated in FIG. 16 is common to the planar layout of the pixel $X_{ij}$ in the solid-state imaging device pertaining to the second to fourth embodiments. Similar to the second to fourth embodiments, the quintuple potential-control regions 18a, 18b, 18c, 18d and 18e are buried in the upper portion of the n-type modulation region 14 as illustrated in FIG. 17. Also, a layout in which the pixel $X_{ij}$ in the solid-state imaging device pertaining to the modification of the fourth embodiment includes the quadruple pairs of electric-field control-electrodes 45a1, 45a2; 45b1, 45b2; 45c1, 45c2; 45d1, 45d2 on the outer boundary of the array of the quadruple potential-control regions 18a, 18b, 18c and 18d, as the topology of the quadruple rotational symmetry, is common to the planar structure of the pixel $X_{ij}$ in the solid-state imaging device pertaining to the fourth embodiment. However, as illustrated in FIG. 16, a layout in which the auxiliary-gate electrode 41 is placed between the central potential-control region 18e and the quadruple potential-control regions 18a, 18b, 18c and 18d differs from the pixel $X_{ij}$ in the solid-state imaging device pertaining to the fourth embodiment.

The auxiliary-gate electrode 41 is arranged on the gate insulating film 22 illustrated in FIG. 17, in a planar pattern exemplified in FIG. 16, and implements insulated gate structures. As illustrated in FIG. 17, the structure body of the cross-sectional structure of the pixel $X_{ij}$ in the solid-state imaging device pertaining to the modification of the fourth embodiment may be made of the semiconductor substrate itself, or alternatively, the p$^-$-type photoelectric-conversion layer 11 epitaxially grown on the semiconductor substrate. On the photoelectric-conversion layer 11, an n-type modulation region 14 is arranged through the surface-buried region 13. The periphery of the modulation region 14 is surrounded by a p-well 12. A gate insulating film 22 is formed so as to cover the p-well 12, the modulation region 14, and the first potential-control region 18a, central potential-control region 18e and third potential-control region 18c of the upper portion of the modulation region 14. As the gate insulating film 22, in addition to the SiO$_2$ film, it is possible to use the ONO film or the various insulating films made of the oxide including the elements such as Sr, Al, Mg, Y and the like.

A planar pattern of the auxiliary-gate electrode 41 illustrated in FIG. 16, which is a ring-shaped topology that covers the upper portions of the partial area of the outer contour of the central potential-control region 18e and the partial area of the inner contour of the array of the quadruple potential-control regions 18a, 18b, 18c and 18d is common to the planar pattern of the pixel $X_{ij}$ in the solid-state imaging device pertaining to the third embodiment illustrated in FIG. 10. As illustrated in FIG. 16, the auxiliary-gate electrode 41 implements a planar topology that surrounds the outer contour of the central potential-control region 18e with a width that an edge of the width reaches to the first potential-control region 18a. Consequently, a first insulated gate transistor (MIS transistor) is disposed between the central potential-control region 18e and the first potential-control region 18a. Similarly, due to the pattern in which the auxiliary-gate electrode 41 surrounds the outer contour of the central potential-control region 18e with the width that an edge of the width reaches to the second potential-control region 18b, the auxiliary-gate electrode 41 implements a second MIS transistor, the gate of which is common to the first MIS transistor between the central potential-control region 18e and the second potential-control region 18b. Moreover, the auxiliary-gate electrode 41 implements the third MIS transistor between the central potential-control region 18e and a third potential-control region 18c, and implements a fourth MIS transistor between the central potential-control region 18e and the fourth potential-control region 18d, respectively. The third and fourth MIS transistors have the auxiliary-gate electrodes 41 common to the first MIS transistor.

A p$^+$-type first contact region 16a is formed at inner vicinity at a center of an outer long side of the first potential-control region 18a. Similarly, a p$^+$-type second contact region 16b is formed at inner vicinity at a center of an outer long side of the second potential-control region 18b. Moreover, a p$^+$-type third contact region 16c is arranged at inner vicinity at a center of an outer long side of the third potential-control region 18c, and a p$^+$-type fourth contact region 16d is arranged at inner vicinity at a center of an outer long side of the fourth potential-control region 18d.

In FIG. 17 that is the cross-sectional view taken from an XVII-XVII direction in FIG. 16, the first contact region 16a buried in the right side of the first potential-control region 18a, the central contact region 16e buried in the center of the central potential-control region 18e, and the third contact region 16c buried in the left side of the third potential-control region 18c are exposed at the top surface of the photoelectric-conversion layer 11. And, the first charge-accumulation region 17a is exposed at the top surface of the photoelectric-conversion layer 11 in vicinity of the right side of the first potential-control region 18a, and the third charge-accumulation region 17c is exposed at the top surface of the photoelectric-conversion layer 11 in vicinity of the left side of the third potential-control region 18c. The right side of FIG. 17 illustrates the auxiliary-gate electrode 41 of the first MIS transistor that is formed between the central potential-control region 18e and the second potential-control region 18b, and the left side of FIG. 17 illustrates the auxiliary-gate electrode 41 of the third MIS transistor that is formed between the central potential-control region 18e and the third potential-control region 18c. And, the counterpart first electric-field control-electrodes 45a2 is disposed on the further right side of the right auxiliary-gate electrode 41, and the third electric-field control-electrodes 45c1 is exposed on the gate insulating film 22 on the further left side of the left auxiliary-gate electrode 41. The right auxiliary-gate electrode 41 and the left auxiliary-gate electrode 41, which are represented as if separated from each other in FIG. 17, are the continuous integrated member as illustrated in FIG. 16.

When a transfer signal is applied to the first electric-field control-electrodes 45a1 and the counterpart first electric-field control-electrodes 45a2 exemplified in FIG. 16, the pair of the first electric-field control-electrodes 45a1 and the counterpart first electric-field control-electrodes 45a2 controls a lateral electric field in the modulation region 14 between the first electric-field control-electrodes 45a1 and the counterpart first electric-field control-electrodes 45a2, and transfers the signal charges generated in the pixel $X_{ij}$ to the first charge-accumulation region 17a at a high speed. The pair of the second electric-field control-electrode 45b1 and the counterpart second electric-field control-electrode 45b2 controls the lateral electric field in the modulation region 14 located between the second electric-field control-electrode 45b1 and the counterpart second electric-field control-electrode 45b2, the lateral electric field is induced by the application of the transfer signal, and accordingly transfers the signal charges to the second charge-accumulation region 17b along the charge-transport route passing through the second potential-control region 18b at a high speed. Also, the pair of the third electric-field control-electrode 45c1 and the counterpart third electric-field control-electrode 45c2 controls the lateral electric field in the modulation region 14 located between the third electric-field control-electrode 45c1 and the counterpart third electric-field control-electrode 45c2, the lateral electric field is induced by the application of the transfer signal, and accordingly transfers the signal charges to the third charge-accumulation region 17c along the charge-transport route passing through the third potential-control region 18c at a high speed. Moreover, the pair of the fourth electric-field control-electrode 45d1 and the counterpart fourth electric-field control-electrode 45b2 controls the lateral electric field in the modulation region 14 located between the fourth electric-field control-electrode 45d1 and the fourth electric-field control-electrode 45d2, the lateral electric field is induced by the application of the transfer signals, and accordingly transfers the signal charges to the fourth charge-accumulation region 17d along the charge-transport route passing through the fourth potential-control region 18d at a high speed.

Actually, the inter-layer insulating-film shall be existing for covering the counterpart first electric-field control-electrodes 45a2, the third electric-field control-electrodes 45c1, the auxiliary-gate electrode 41 and the gate insulating film 22, which are illustrated in FIG. 17. However, in the cross-sectional structure in FIG. 17, the illustrations of the inter-layer insulating-film, the contact plug penetrating through the inter-layer insulating-film, and the surface inter-connections connected through the contact plug to the first contact region 16a and others are omitted similarly to FIGS. 2 and 9.

The upper side of FIG. 17 illustrates position coordinates x21, x22, x23, - - - , x30 of a planar direction (X direction). However, a curve represented by a solid line in FIG. 18 represents a potential profile on a cross-section along an $XVIII_A$-$XVIII_A$ direction of the pixel $X_{ij}$ illustrated in FIG. 17. Also, a curve represented by a broken line in FIG. 18 represents a potential profile on a cross-section along an $XVIII_B$-$XVIII_B$ direction of the pixel $X_{ij}$ illustrated in FIG. 17. In a vias condition in which the first control voltage G1=−2 volts is applied to the first potential-control region 18a, the fixed potential G0=−1 volt is applied to the central potential-control region 18e, and the third control voltage G3=0 volt is applied to the third potential-control region 18c, potentials on the horizontal potential cross-section along the $XVIII_A$-$XVIII_A$ direction, which cut horizontally an upper surface side of the pixel, represents an approximately constant zero potential in a range lying at left side of the coordinate x21, which corresponds to an area of the left p-well 12, as illustrated in FIG. 18. And, the potential profile along the $XVIII_A$-$XVIII_A$ direction represents a potential well at positions between the coordinates x21 and x22, which corresponds to area in the third charge-accumulation region 17c. Moreover, a horizontal potential profile, which cut horizontally at shallow positions along the $XVIII_A$-$XVIII_A$ direction, represents a potential of about 1 volt at positions between the coordinates x22 and x23, which corresponds to area just under the third electric-field control-electrodes 45c1, between the third charge-accumulation region 17c and the third potential-control region 18c, and then rises to a position at coordinate x23, which corresponds to an area of the left short side of the third potential-control region 18c. And, the potential profile represents an approximately constant zero potential at positions between the coordinates x23 and x24, which corresponds to an area of the third potential-control region 18c, and then represents a potential valley at gap positions between the coordinates x24 and x25, which corresponds to area between the third potential-control region 18c and the central potential-control region 18e.

When the horizontal potential cross-section advances to the further right side on the X axis, the potential profile represents a potential of approximate −1 volt at positions between the coordinates x25 and 26, which corresponds to an area of the central potential-control region 18e, and then represents a potential valley at gap positions between the coordinates x26 and x27, which corresponds to area between the central potential-control region 18e and the first potential-control region 18a. The potential profile represents an approximately constant peak voltage −2 volts at positions between the coordinates x27 and x28, which corresponds to an area of the first potential-control region 18a, and then represents a potential of about −1 volt at positions between the coordinates x28 and x29, which corresponds to area just under the counterpart first electric-field control-electrodes 45a2, between the first potential-control region 18a and the first charge-accumulation region 17a, and then represents a potential well at positions between the coordinates x29 and x30, which corresponds to an area of the first charge-accumulation region 17a. And, when the horizontal potential cross-section advances to the further right side on the X axis, the potential profile again represents an approximately constant zero potential in a range lying the right side from the coordinate x30, which corresponds to an area of the right p-well 12.

In the vias condition in which the first control voltage G1=−2 volts is applied to the first potential-control region 18a, the fixed potential G0=−1 volt is applied to the central potential-control region 18e, and the third control voltage G3=0 volt is applied to the third potential-control region 18c, the potentials on the horizontal potential cross-section along the $XVIII_A$-$XVIII_A$ direction cutting in the upper surface side of the pixel represents the potential profile illustrated in FIG. 18, which represents a double hook structures of p-n-p BJTs, which are connected in series. The double hook structures include a hook structure of a BJT implemented by the third potential-control region 18c as the emitter, and the central potential-control region 18e as the collector, and another hook structure of another BJT implemented by the central potential-control region 18e as the emitter and the first potential-control region 18a as the collector.

In the vias condition in which the first control voltage G1=−2 volts is applied to the first potential-control region 18a, the fixed potential G0=−1 volt is applied to the central potential-control region 18e, and the third control voltage G3=0 volt is applied to the third potential-control region 18c, a potential profile on a horizontal potential cross-section, which passes horizontally through relatively deep positions in the surface-buried region 13 of the pixel along the $XVIII_B$-$XVIII_B$ direction, represents a relatively gentle change, as represented by a broken line in FIG. 18. When the horizontal potential cross-section starts from a potential well at positions between the coordinates x21 and x22, which corresponds to the area of the third charge-accumulation region 17c and advances to a right direction, a potential on the horizontal potential cross-section begins to decrease from the position just under the third electric-field control-electrodes 45c1 between the third charge-accumulation region 17c and the third potential-control region 18c, and represents a potential of approximately constant 1.8 volts between the coordinates x22 and x24, which corresponds to the area of the third potential-control region 18c. After that, the potential decreases to about 0.2 volts. The potential begins to decrease from the gap position between the third potential-control region 18c and the central potential-control region 18e, through positions between the coordinates x24 and x28, which corresponds to the area of the first potential-control region 18a, and becomes a constant potential of about 0.2 volts at the gap position between the coordinates x28 and x29, which corresponds to area between the first potential-control region 18a and the first charge-accumulation region 17a. And then, the potential profile represents a potential well at positions between the coordinates x29 and x30, which corresponds to the area of the first charge-accumulation region 17a.

As can be understood from the potential profile in FIG. 18, by applying the fixed potential to the central potential-control region 18e illustrated in FIG. 16 and sequentially applying the route-select signals to the quadruple potential-control regions 18a, 18b, 18c and 18d around the central potential-control region 18e, in accordance with the pulse-application mode determined by the predetermined timing chart, it is possible to achieve the TOF operation, by controlling the charge-transport routes generated in the lower surface of the modulation region 14 and the surface-buried region 13 so that the signal charges are sequentially accumulated in the quadruple charge-accumulation regions 17a, 17b, 17c and 17d.

Also, by slightly modifying the timing chart in FIG. 13 used in the third embodiment and with the bias condition in which the first control voltage G1, the second control voltage G2, the third control voltage G3 and the fourth control voltage G4 are not driven, for example, under assumption of G1=G2=G3=G4=0 volt, by applying a negative voltage to the auxiliary-gate electrode 41, a potential barrier against non-signal charges is removed. When the negative voltage (non-signal charge-induction pulse) is applied to the auxiliary-gate electrode 41, the auxiliary-gate electrode 41 induces the non-signal charges just under the auxiliary-gate electrode 41, and the non-signal charges are drawn out to the surface interconnection through the central potential-control region 18e, which is maintained at the fixed potential G0=−1 volt, from just under the auxiliary-gate electrode 41. On the other hand, when a positive voltage is applied to the auxiliary-gate electrode 41 in the bias condition in which the first control voltage G1, the second control voltage G2, the third control voltage G3 and the fourth control voltage G4 are not driven, the potential barrier against the non-signal charges becomes high. The potential barrier against the non-signal charges becomes a potential well for electrons, which will contribute to dark current and background light components. Thus, when the positive potential is applied to the exhaust-gate electrodes 43a, 43b, 43c and 43d, electrons contributing to the dark current and background light components just under the auxiliary-gate electrode 41 can be drawn out to the exhaust-drain regions 19a, 19b, 19c and 19d. That is, the auxiliary-gate electrode 41 facilitates the extraction of electrons contributing to the dark current and background light components to the exhaust-drain regions 19a, 19b, 19c and 19d.

Moreover, by applying the positive potential to the exhaust-gate electrodes 43a, 43b, 43c and 43d illustrated in FIG. 16, electrons contributing to the dark current and background light components in the pixel $X_{ij}$ in the solid-state imaging device pertaining to the modification of the fourth embodiment can be drawn out to the exhaust-drain regions 19a, 19b, 19c and 19d. Because the other structures, operations and features are substantially similar to the solid-state imaging devices pertaining to the second to fourth embodiments, each of which having the quintuple potential-control regions 18a, 18b, 18c, 18d and 18e, the duplicated explanations are omitted.

Other Embodiments

As mentioned above, the present invention is described by the first to fourth embodiments. However, the descriptions and drawings implementing a part of the disclosure should not be construed to limit the invention. From the disclosure, various variations, implementations and operational techniques may be clear for one skilled in the art. For example, in the already-described explanations of the first to fourth embodiments, a case is exemplified in which a single charge-transport route is defined for each potential-control region and a single charge-accumulation region is assigned to each potential-control region. However, a plurality of charge-transport routes may be defined for each of the potential-control regions. That is, a scheme in that a plurality of charge-accumulation regions is assigned to each of the potential-control region, and the signal charges can be transferred independently through the plurality of charge-transport routes in each of the potential-control regions is available.

Another Embodiment: No. 1

Figure 19:
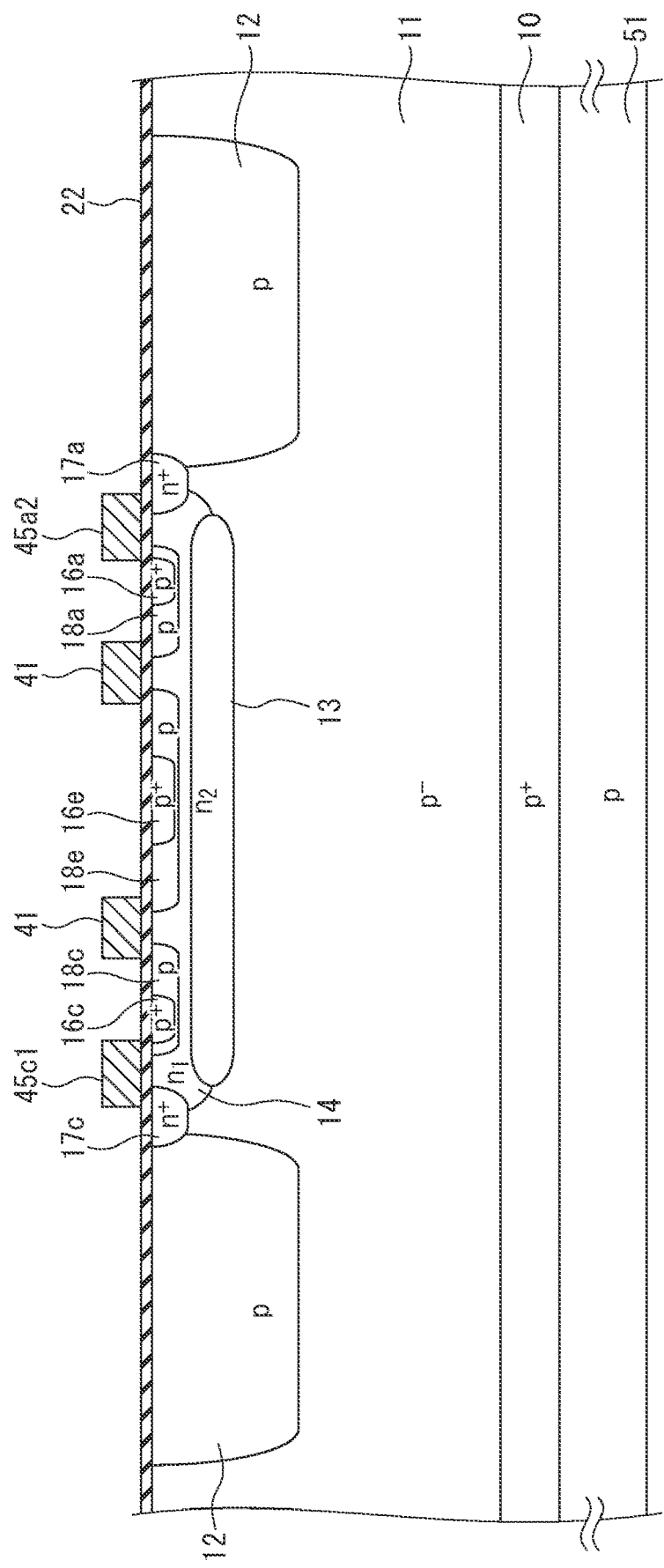
FIG. 19 is a schematic cross-sectional view explaining a structure of a pixel in a solid-state imaging device pertaining to another embodiment of the present invention (No. 1)

For example, in the structures explained in the already-described first to fourth embodiments, it is difficult to operate the pixel $X_{ij}$ at a high speed, when a component of slow signal charges moving in a neutral region at a diffusion velocity exists in a depth portion of the photoelectric-conversion layer 11. In a case that electrons (signal charges) generated in the photoelectric-conversion layer 11 at a deep position from a surface are required to be transferred at a high speed, it is preferred to use a layout as illustrated in FIG. 19 in which a p$^+$-type bottom-side bias-layer 10 whose impurity concentration is, for example, $3 \times 10^{18}$ to $2 \times 10^{19}$ cm$^{-3}$ is epitaxially grown on a p-type semiconductor substrate 51, and a p$^-$-type photoelectric-conversion layer 11 whose impurity concentration is, for example, $5 \times 10^{12}$ to $1 \times 10^{14}$ cm$^{-3}$ is continuously epitaxially grown on the bottom-side bias-layer 10.

By applying a negative voltage to the bottom-side bias-layer 10 and depleting the substantially entire of the photoelectric-conversion layer 11 from the top surface of the photoelectric-conversion layer 11, the signal charges generated in the photoelectric-conversion layer 11 can be transported in a drift field at a high speed. If due to the structure illustrated in FIG. 19, the depletion layer extends to the entire of the photoelectric-conversion layer 11, the signal charges can be transported by drift field in the depletion layer.

Thus, it is possible to operate the pixel $X_{ij}$ at a high speed.

Another Embodiment: No. 2

Figure 20:
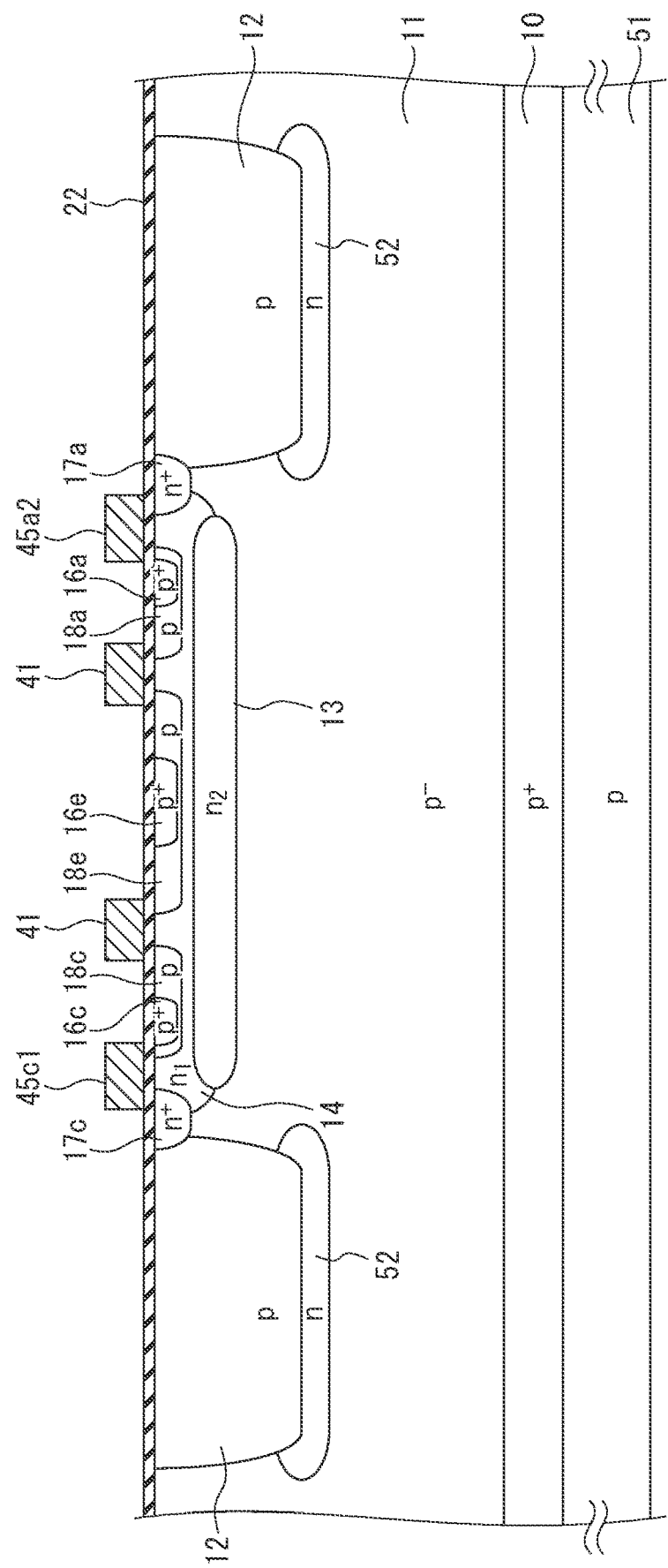
FIG. 20 is a schematic cross-sectional view explaining a structure of another pixel in a solid-state imaging device pertaining to another embodiment (No. 2)

In view of a problem in the structure illustrated in FIG. 19, in which the injection of holes into the photoelectric-conversion layer 11 from the p-well 12 is problem, for blocking the injection of holes which will serve as the non-signal charges, by providing an n-type shield area 52 for covering the lower portion of the p-well 12 as illustrated in FIG. 20, it is possible to avoid the increase in power dissipation caused by the injection of holes into the photoelectric-conversion layer 11 from the p-well 12, when the depletion layer extends to the entire of the photoelectric-conversion layer 11, and it is possible to operate the pixel $X_{ij}$ at a high speed.

Another Embodiment: No. 3

Figure 21:
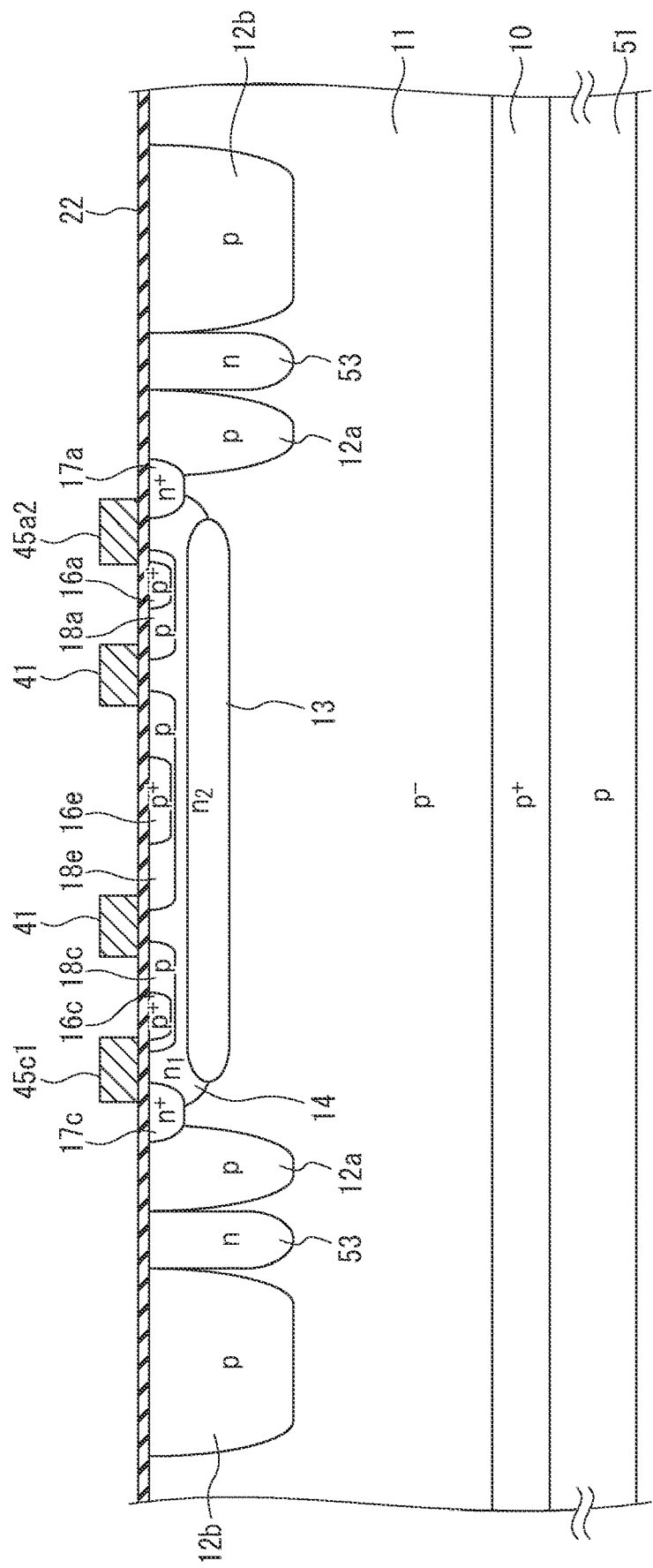
FIG. 21 is a schematic cross-sectional view explaining still another cross-sectional structure of a pixel in a solid-state imaging device pertaining to another embodiment (No. 3)

FIG. 21 illustrates a layout that is surrounded by an inner p-well region (first p-well) 12a surrounding the surface-buried region 13, an wall-shaped n-type tab area (n-tab) 53 surrounding the periphery of the first p-well 12a, and an outer p-type well region (second p-well) surrounding the outside of the n-tab 53. The structure of the cross-sectional view in FIG. 21 corresponds to a topology in which the p-type well region 12 as illustrated in FIGS. 19 and 20 is divided into two of the first p-well 12a and the second p-well 12b by the n-tab 53.

That is, as illustrated in the cross-sectional view in FIG. 21, even in the structure in which the two well regions of the first p-well 12a and the 15 second p-well 12b are implemented by the n-tab 53, the potential barrier against holes can be generated in the lower surfaces of the first p-well 12a and the second p-well 12b. Thus, according to the pixel $X_{ij}$ in the solid-state imaging device pertaining to still another embodiment illustrated in FIG. 21, in the situation in which the pixel $X_{ij}$ is operated at a high speed by extending the depletion layer in the entire of the photoelectric-conversion layer 11, it is possible to suppress holes from injecting into the photoelectric-conversion layer 11 from the first p-well 12a and the second p-well 12b.

Another Embodiment: No. 4

In the above explanations of the first to fourth embodiments, the explanation of the concrete layout of a group of MOS transistors implementing "the intra-pixel circuit-elements" such as the reset transistor, the read-out transistor, the switching transistor and others as exemplified in FIG. 3 are omitted. However, as to the group of MOS transistors implementing the intra-pixel circuit-elements, for usual CMOS process, n-type source/drain regions are typically buried in the upper portion of the p-well 12 as illustrated in FIGS. 2 and 8. However, as illustrated in FIGS. 22 and 23, using a structure of the SOI substrate as a base body, the MOS transistors can be deployed on an SOI insulating film 23, and the deployed MOS transistors may be used as the intra-pixel circuit-elements.

For example, the Silicon-On-Insulator (SOI) substrate can be formed, after forming the SOI insulating film 23 by an SIMOX (separation by implanted oxygen) method using ion implantation of oxygen. Or, the SOI substrate may be formed by directly bonding two silicon substrates to each other through the SOI insulating film 23 by a wafer-bonding method. Moreover, the SOI substrate may be formed by an ELTRAN (registered trademark) based on epitaxial growth. Also, for the SOI structure by the wafer-bonding method, the SOI substrate may be formed by a Smart-Cut (registered trademark) method of using a delamination method in which phenomena of blistering and flaking induced by proton ion implantation is used.

Figure 22:
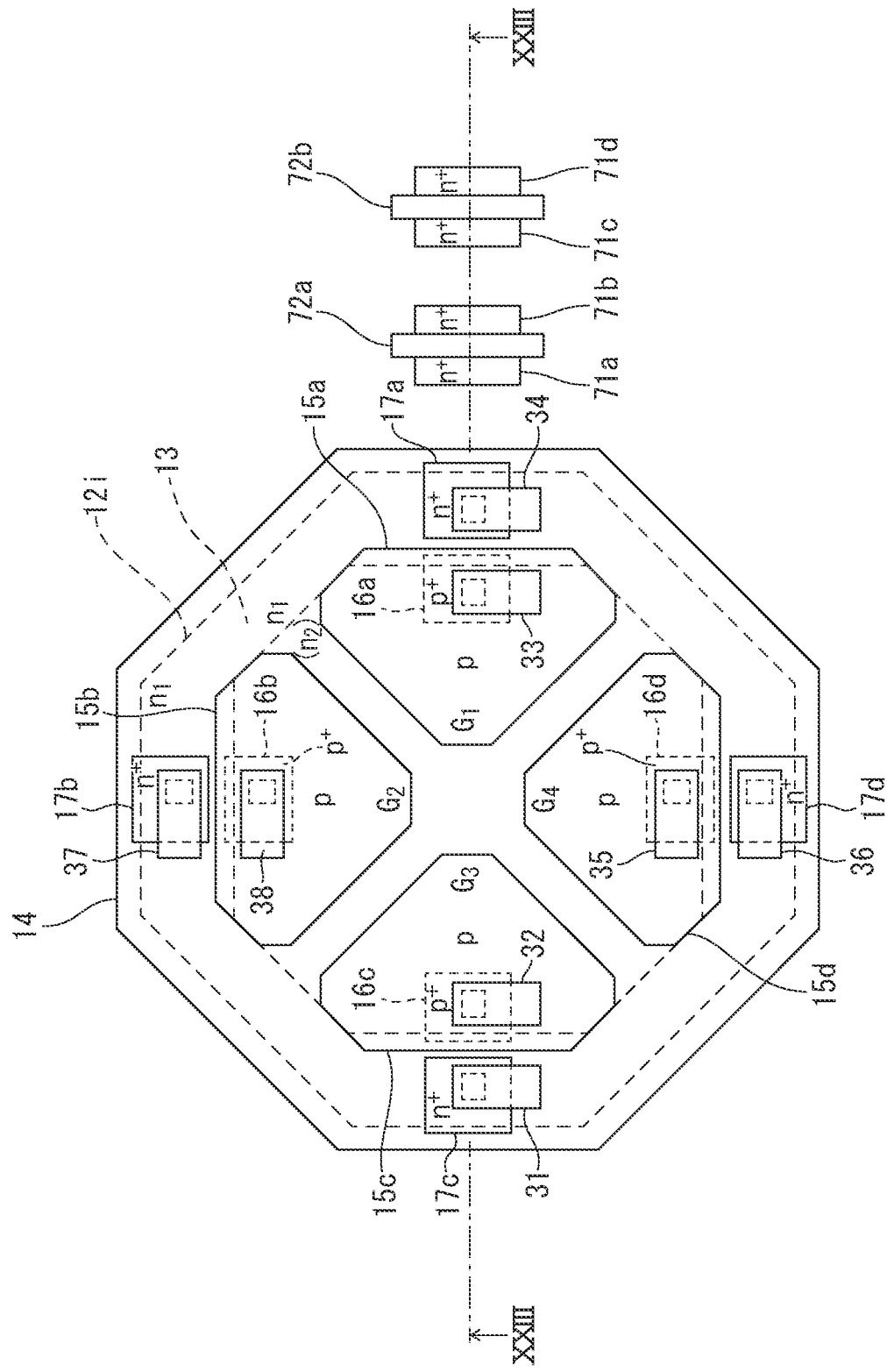
FIG. 22 is a schematic cross-sectional view explaining a structure of another pixel of a solid-state imaging device pertaining to a yet still another embodiment (No. 4)
Figure 23:
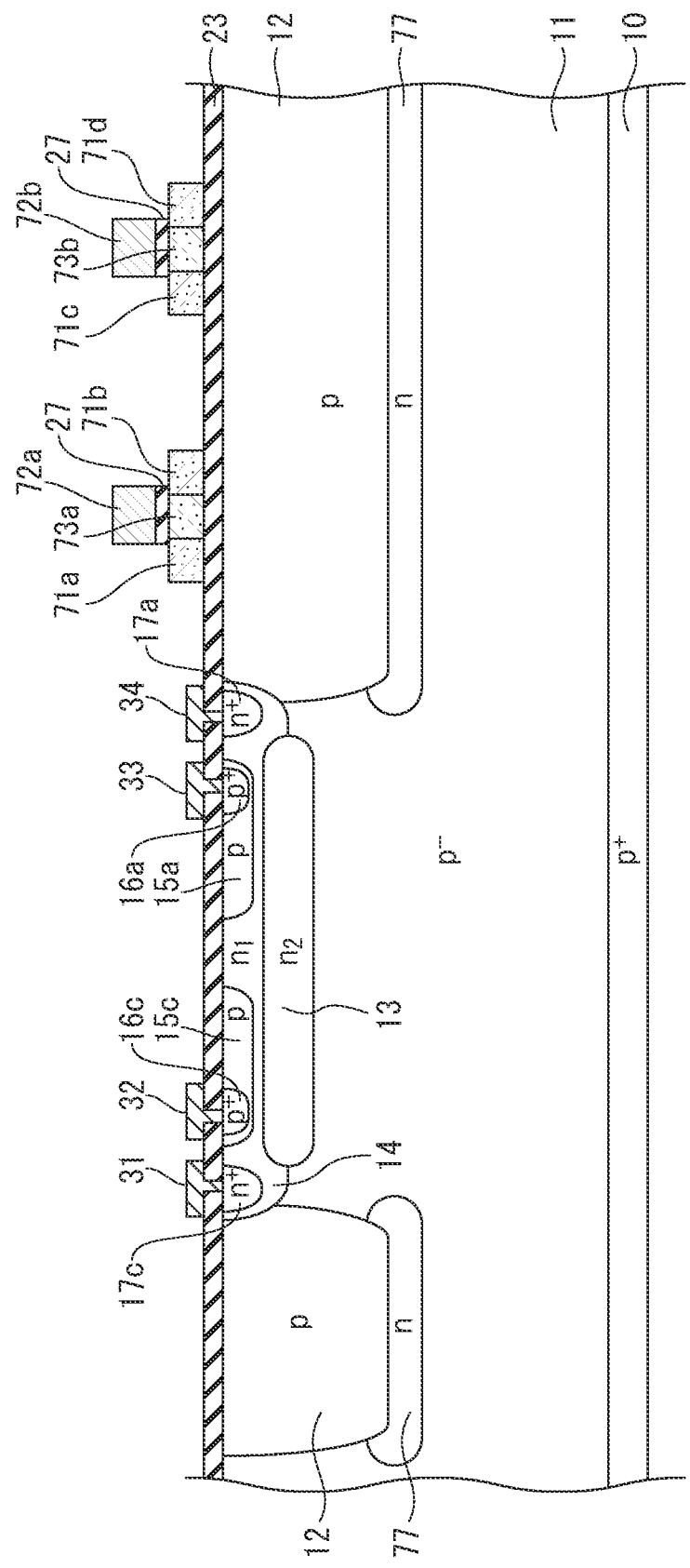
FIG. 23 is a schematic cross-sectional view taken from a cross-section corresponding to an XXIII-XXIII direction of a pixel in a solid-state imaging device pertaining to a yet still another embodiment illustrated in FIG. 22.

FIG. 22 exemplifies a plan view of a part of an intra-pixel circuit-element implemented by two MOS transistors, in which a gate electrode 72a of a MOS transistor is disposed between source/drain regions 71a and 71b, and another gate electrode 72b of another MOS transistor is disposed between source/drain regions 71c and 71d. As can be understood from FIG. 23, the source/drain regions 71a, 71b, 71c and 71d, which exemplify a part of the group of MOS transistors implementing the intra-pixel circuit-element, are made of single-crystalline silicon as a SOI silicon thin-film layer (SOI layer), which is laminated on the SOI insulating film 23. As can be understood from FIG. 23, a channel area 73a made by SOI layer is disposed just under the gate electrode 72a, and the source/drain regions 71a and 71b are arranged on both sides of the channel area 73a, sandwiching the channel area 73a in between. Similarly, a channel area 73b made by SOI layer is formed just under the gate electrode 72b, and the source/drain regions 71c and 71d are arranged on both sides of the channel area 73b, sandwiching the channel area 73ba in between. A gate insulating film 27 for the intra-pixel circuit-element is arranged between the gate electrode 72a and the channel area 73a, and another gate insulating film 27 for the intra-pixel circuit-element is arranged between the gate electrode 72b and the channel area 73b, and the gate structures of the MOS transistors are accordingly established.

The structure of the solid-state imaging device pertaining to a yet still another embodiment in which the pixel $X_{ij}$ illustrated in FIG. 22 has quadruple p$^+$-type potential-control regions 15a, 15b, 15c and 15d is common to the structure exemplified in the first embodiment illustrated in FIG. 1. However, the quadruple potential-control regions 15a, 15b, 15c and 15d are buried in an upper portion of an n-type modulation region 14 made of silicon substrate, which serve as a support substrate of SOI structure as illustrated in FIG. 23.

As can be understood from FIG. 23, an octagonal surface-buried region 13 represented by a broken line in FIG. 22 is locally buried in a lower portion at a center of the modulation region 14. The layout, in which a p+-type first contact region 16a is arranged in the first potential-control region 15a, a p+-type second contact region 16b is arranged in the second potential-control region 15b, a p+-type third contact region 16c is arranged in the third potential-control region 15c, and a p+-type fourth contact region 16d is arranged in the fourth potential-control region 15d, is common to the structure exemplified in the first embodiment. As illustrated in FIG. 22, quadruple charge-accumulation regions 17a, 17b, 17c and 17d for sequentially accumulating the signal charges transferred by the quadruple potential-control regions 15a, 15b, 15c and 15d via the static induction effect are arranged as floating-drain regions, respectively, outside the quadruple potential-control regions 15a, 15b, 15c and 15d.

As illustrated in FIG. 23, a p+-type bottom-side bias-layer 10 is formed on a bottom surface of the photoelectric-conversion layer 11. Similar to the structure illustrated in FIG. 20, by applying the negative voltage to the bottom-side bias-layer 10, it is possible to deplete substantially the entire of the photoelectric-conversion layer 11, measured from the top surface of the photoelectric-conversion layer 11. And, similarly to the structure illustrated in FIG. 20, an n-type shield area 77 is formed which blocks the injection of holes which will serve as the non-signal charges. Thus, in an operation condition in which the depletion layer extends to the entire of the photoelectric-conversion layer 11, it is possible to avoid the increase in the power dissipation caused by the injection of holes into the photoelectric-conversion layer 11 from the p-well 12, and the signal charges can be transported by drift field in the depletion layer at a high speed.

Another Embodiment: No. 5

Figure 24:
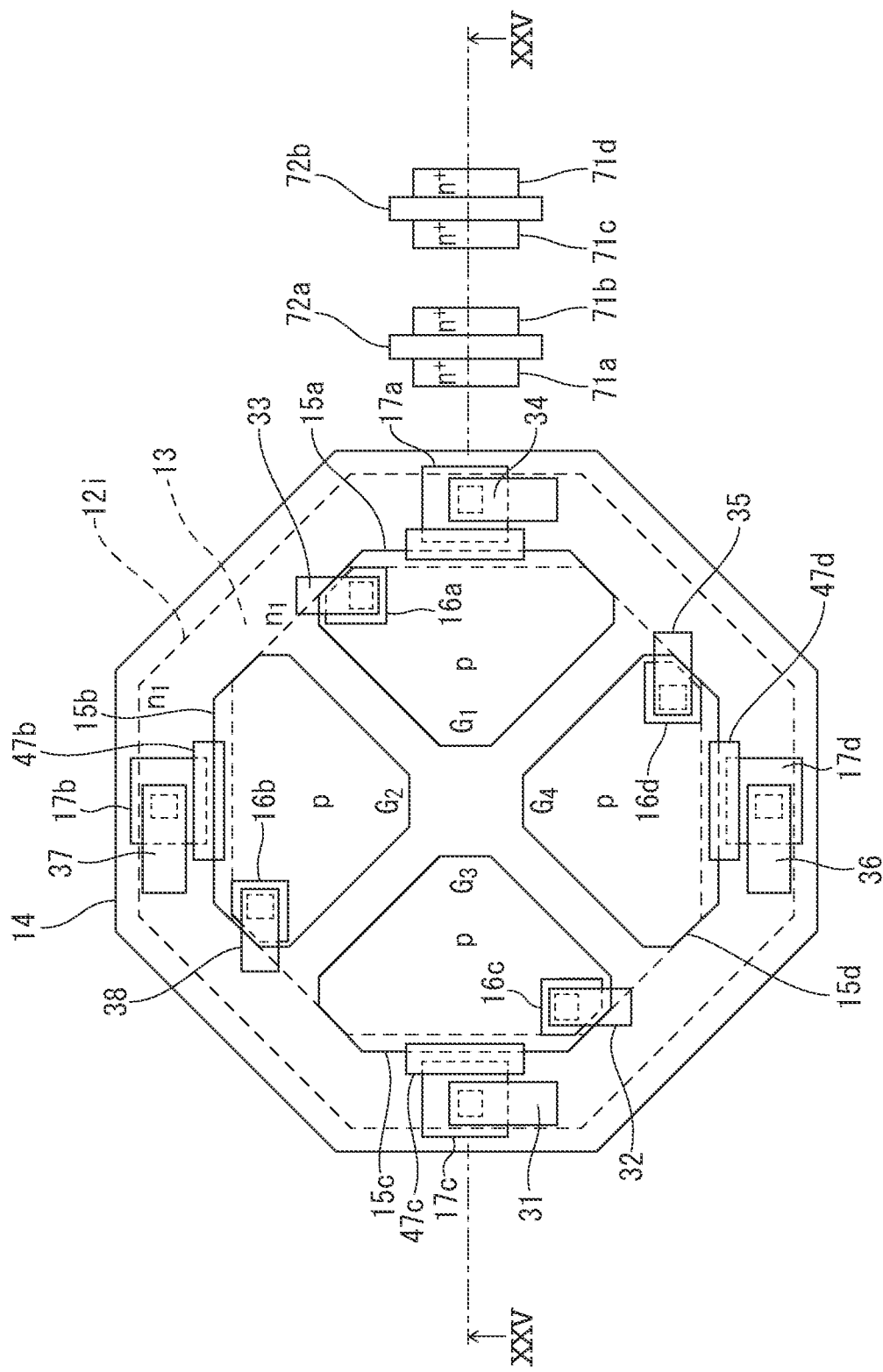
FIG. 24 is a schematic cross-sectional view explaining a structure of another pixel of a solid-state imaging device pertaining to a yet still another embodiment (No. 5)
Figure 25:
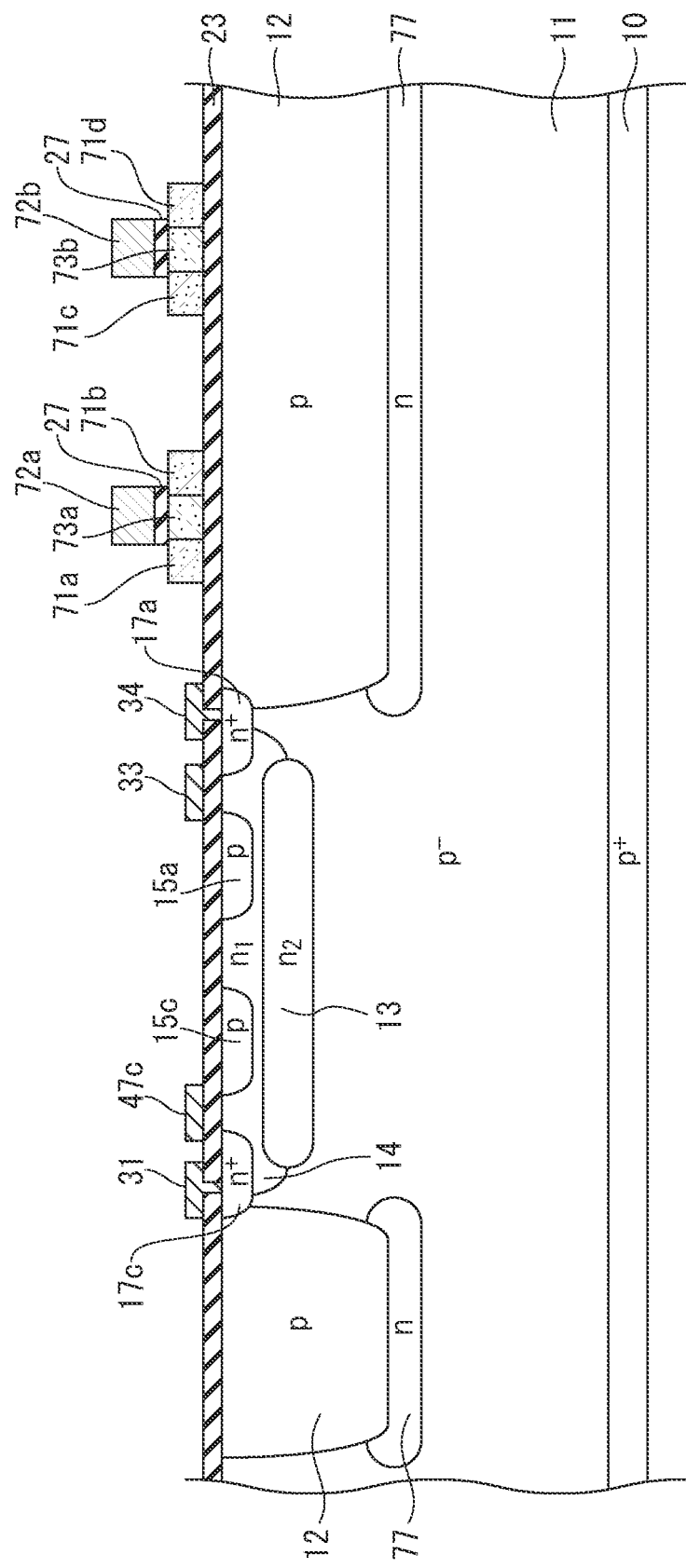
FIG. 25 is a schematic cross-sectional view taken from a cross-section corresponding to an XXV-XXV direction of a pixel in a solid-state imaging device illustrated in FIG. 24.

As can be understood from FIGS. 24 and 25, a group of MOS transistors implementing the intra-pixel circuit-element, which is arranged in each pixel $X_{ij}$ in the solid-state imaging device pertaining to a yet still another embodiment, is formed on the SOI insulating film 23. As illustrated in FIG. 25, the feature in which a first transfer-gate electrode 47a and a third transfer-gate electrode 47c, which implement transfer transistors, are formed on the SOI insulating film 23 differs from the structure illustrated in FIG. 23. In order that the transfer-gate electrodes, such as the first transfer-gate electrode 47a and the third transfer-gate electrode 47c, can efficiently transfer the signal charges, a thickness of the SOI insulating film 23 is selected as about 50 to 200 nm. In order to form the thin SOI insulating film 23 of 200 nm or less, the SIMOX method is suitable. However, the forming method of the transfer transistors is not limited to the SIMOX method. In order to increase the efficiency of the transfer-gate electrode such as the first transfer-gate electrode 47a, the third transfer-gate electrode 47c and others, by removing the SOI insulating film 23 just under the transfer-gate electrode, a thin gate oxide film may be formed on a surface of a silicon substrate, which serves as the support substrate of SOI structure, alternatively.

As can be known from FIG. 25, a channel area 73a implemented by a SOI layer is formed just under a gate electrode 72a of the MOS transistor, which implements the intra-pixel circuit-element, and source/drain regions 71a and 71b made by SOI layer are arranged both sides of the channel area 73a so that the channel area 73a is sandwiched in between the source/drain regions 71a and 71b. Similarly, a channel area 73b made by SOI layer is formed just under a gate electrode 72b of the MOS transistor, which implements the intra-pixel circuit-element, and source/drain regions 71c and 71d made by SOI layer are arranged both sides of the channel area 73b so that the channel area 73b is sandwiched in between the source/drain regions 71c and 71d. Between the gate electrode 72a and the channel area 73a a gate insulating film 27 for the intra-pixel circuit-element is arranged, and a gate structure of the MOS transistor is established. Similarly, between the gate electrode 72b and the channel area 73b, another gate insulating film 27 for the intra-pixel circuit-element is arranged, and another gate structure of the MOS transistor is established.

With regard to a layout of a photodiode portion, quadruple potential-control regions 15a, 15b, 15c and 15d are buried in the upper portion of the n-type modulation region 14 made of silicon substrate serving as support substrate of the SOI structure, as illustrated in FIG. 25. Thus, the structure of the photodiode portion is similar to the structure illustrated in FIG. 23. The surface-buried region 13 represented by the broken line in FIG. 24 is buried in a lower portion of the modulation region 14. The layout in which the p+-type first contact region 16a is arranged in the first potential-control region 15a, the p+-type second contact region 16b is arranged in the second potential-control region 15b, the p+-type third contact region 16c is arranged in the third potential-control region 15c, and the p+-type fourth contact region 16d is arranged in the fourth potential-control region 15d is common to the structure illustrated in FIG. 23. As illustrated in FIG. 24, the quadruple charge-accumulation regions 17a, 17b, 17c and 17d for sequentially accumulating the signal charges, which are transferred by the quadruple potential-control regions 15a, 15b, 15c and 15d via the static induction effect, are arranged as the floating-drain regions, respectively, outside the quadruple potential-control regions 15a, 15b, 15c and 15d. The first transfer-gate electrode 47a is placed between the first potential-control region 15a and the first charge-accumulation region 17a. A second transfer-gate electrode 47b is placed between the second potential-control region 15b and the second charge-accumulation region 17b. The third transfer-gate electrode 47c is placed between the third potential-control region 15c and the third charge-accumulation region 17c. A fourth transfer-gate electrode 47d is placed between the fourth potential-control region 15d and the fourth charge-accumulation region 17c.

As illustrated in FIG. 25, the structure in which a p+-type bottom-side bias-layer 10 is formed on the bottom surface of the photoelectric-conversion layer 11 is similar to FIG. 23. By applying the negative voltage to the bottom-side bias-layer 10, it is possible to deplete substantially the entire of the photoelectric-conversion layer 11, measured from the top surface of the photoelectric-conversion layer 11. And, similarly to the structure illustrated in FIG. 23, the n-type shield area 77 for blocking the injection of holes is formed so as to cover the lower portion of a p-well 12. Thus, in an operation condition in which the depletion layer extends to the entire of the photoelectric-conversion layer 11, it is possible to avoid the increase in the power dissipation caused by the injection of holes into the photoelectric-conversion layer 11 from the p-well 12, and the signal charges can be transported by drift field in the depletion layer at a high speed.

Another Embodiment: No. 5

Figure 27:
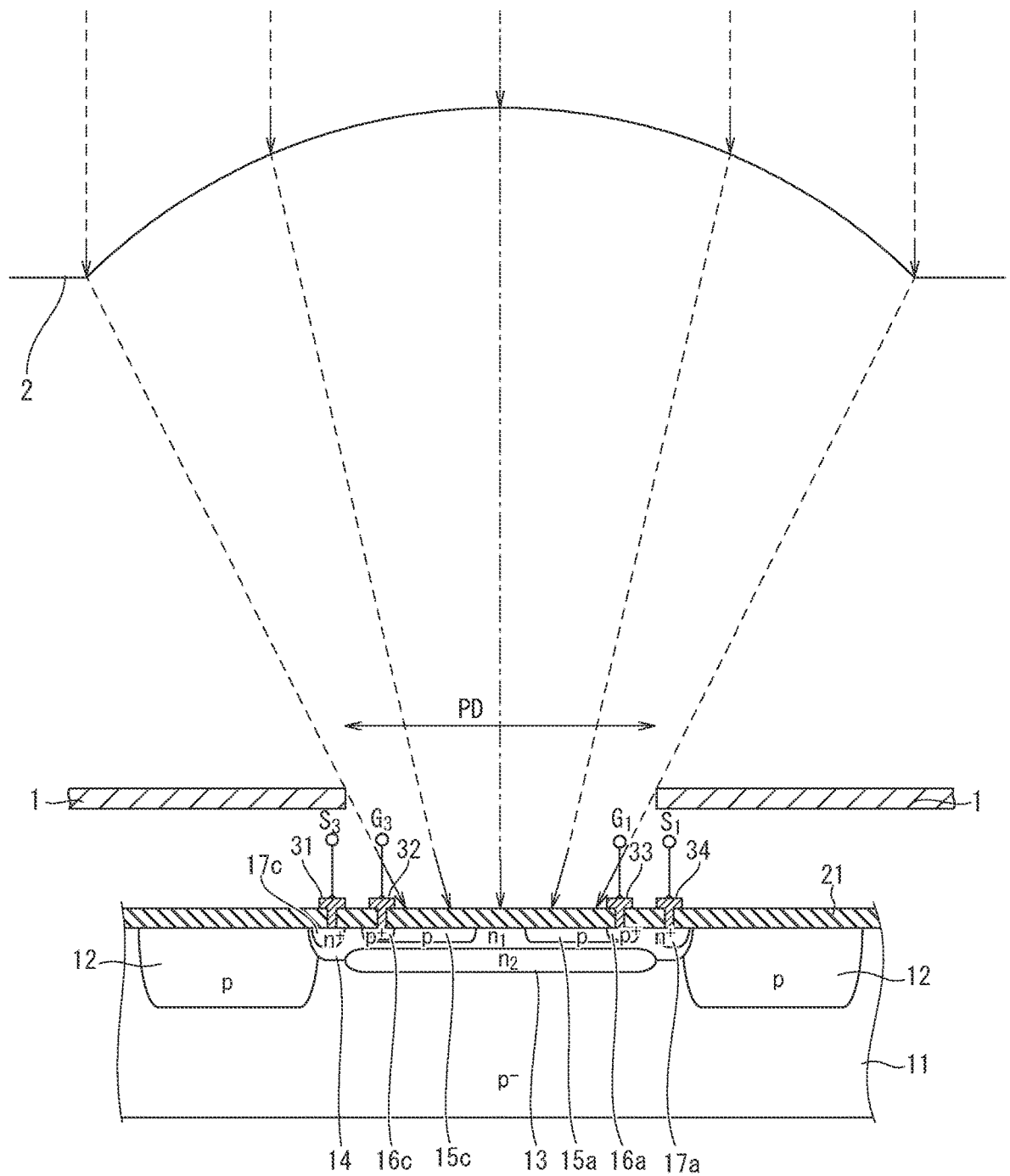
FIG. 27 is a schematic cross-sectional view explaining a structure of another pixel of a solid-state imaging device pertaining to a yet still another embodiment (No. 6).

As a solid-state imaging device using a photoelectric-conversion element pertaining to a yet still another embodiment of the present invention, as illustrated in FIG. 27, a micro lens 2 for converging light from a target object, and irradiating the light into a light-receiving area PD may be placed on an upper side of a shield plate 1. By illuminating the light through the micro lens 2, an opening ratio can be improved, which can make a sensitivity of the solid-state imaging device higher. Even by the photoelectric-conversion element pertaining to a yet still another embodiment illustrated in FIG. 27, it is possible to provide the effectiveness in which the high-speed operation of TOF architecture can be performed with the low power dissipation, similarly to the photoelectric-conversion element illustrated in FIGS. 1 to 2, 6, 8 to 11, 14 to 17 and 19 to 25. By the way, the micro lens is not limited to a single-level structure exemplified in FIG. 27. It is possible to achieve a further miniaturization by laminating the micro lenses on the photoelectric conversion element in a composite structure with double level or more levels.

The explanations of the structures of the solid-state imaging devices pertaining to other embodiments illustrated in FIGS. 19 to 25 and 27 exemplarily explain the case of using the p-type semiconductor substrate 51 and the p$^+$-type bottom-side bias-layer 10 arranged on the semiconductor substrate 51. However, it is not limited to the p-type semiconductor substrate 51. Instead of using the p-type semiconductor substrate 51, an n-type semiconductor substrate may be used, or an insulator substrate may be used. Moreover, the p$^+$-type semiconductor substrate itself may be employed as the bottom-side bias-layer 10.

In a case of using the p$^+$-type semiconductor substrate, a solid-state imaging device of back-side-illuminated type may be designed in such a way that in view of an attenuation distance of light, the thickness of the semiconductor substrate is adjusted to be thinned to five to ten micrometers or less by performing a polishing work, CMP and the like. In a case of using the solid-state imaging device of the back-side-illuminated type, it is preferred to ensure a mechanical strength by coupling a support substrate, such as Si substrate and the like, through the inter-layer insulating-film on the surface, to the upper surface by a wafer bonding method and the like. Moreover, a deep trench (penetration hole) penetrating through the photoelectric-conversion layer may be dug around a chip by ion milling or an RIE method, and p-type impurities may be diffused into a side wall of the penetration hole, and an reverse bias may be applied to a bottom surface side. Moreover, by embedding refractory metal in the penetration hole and implementing "Through Silicon Vias (TSV)", the reverse bias may be applied to the bottom surface side. Moreover, by digging selectively a concave portion in the p$^-$-type semiconductor substrate just under the surface-buried region 13 from the bottom, the surface-buried region 13 is illustrated in FIG. 2, so as to implement a thickness of five to ten micrometers or less, the solid-state imaging device of the back-side-illuminated type may be established, in a structure that a mechanical strength is ensured by the frame-shaped thick semiconductor substrate around the concave portion.

By the way, in the already-described explanations of the first to fourth embodiments, the first conductivity type is explained as the p-type, and the second conductivity type is explained as the n-type. However, even if the first conductivity type is defined as the n-type and the second conductivity is defined as the p-type, it may be possible to easily understand that the similar effectiveness can be achieved by making the electric polarities opposite to each other. In reversing the electric polarities, for example, in such a way that the modulation region 14 illustrated in FIG. 2 serves as "a light-receiving anode-region", corresponding to the reversed polarity. Also, in the explanations of the first to fourth embodiments, the signal charge is explained as the electron, and the non-signal charge whose conductivity type is opposite to the signal charge is explained as the hole. However, when the polarity is reversed, the signal charges are assigned to holes, and the non-signal charge become electrons.

In the explanations of the first to fourth embodiments, the two-dimensional solid-state imaging device (area sensor) is explained exemplarily. However, the pixel $X_{ij}$ in the present invention should not be construed to be limited to be used only for the pixel $X_{ij}$ in the two-dimensional solid-state imaging device. For example, from the content of the above disclosure, it will be easily understood that, in an architecture for the two-dimensional matrix illustrated in FIG. 1, a plurality of the pixels $X_{ij}$ can be arrayed one-dimensionally so as to implement a one-dimensional solid-state imaging device (line sensor), in which j=m=1 is defined.

In this way, it is obvious that the present invention includes various embodiments and the like that are not detailed above. Thus, the technical scope of the present invention is determined only by the technical features specifying the invention prescribed by following Claims, reasonable from the above explanations.

REFERENCE SIGNS LIST 1 a shield plate
2 a micro lens
10 a bottom-side bias-layer
11 a photoelectric conversion area
12 a well region (p-well)
12a a first p-well
12b a second p-well
13 a surface-buried region
14 a modulation region
15a a first potential-control region
15b a second potential-control region
15c a third potential-control region
15d a fourth potential-control region
16a a first contact region
16b a second contact region
16c a third contact region
16d a fourth contact region
16e a central contact region
17a, 18a a first charge-accumulation region
17b, 18b a second charge-accumulation region
17c, 18c a third charge-accumulation region
17d, 18d a charge-accumulation region
18e a central potential-control region
19a a first exhaust-drain region
19b a second exhaust-drain region
19c a third exhaust-drain region
19d a fourth exhaust-drain region
21 an inter-layer insulating-film
22 a gate insulating film
31 to 38 a surface interconnection
41 an auxiliary-gate electrode
43a a first exhaust-gate electrode
43b a second exhaust-gate electrode
43c a third exhaust-gate electrode
43d a fourth exhaust-gate electrode
45a1, 45a2 a first electric-field control-electrode
45b1, 45b2 a second electric-field control-electrode
45c1, 45c2 a third electric-field control-electrode
45d1, 45d2 a fourth electric-field control-electrode
51 a semiconductor substrate 52 a shield area
53 an n-tab

The invention claimed is:

1. A charge-modulation element, comprising:
a photoelectric-conversion layer of a first conductivity type;
a surface-buried region of a second conductivity type buried in a part of an upper portion of the photoelectric-conversion layer, configured to implement a photodiode with the photoelectric-conversion layer;
a modulation region of the second conductivity type buried in another part of the upper portion of the photoelectric-conversion layer, in a depth level at an upper surface side than the surface-buried region, having lower impurity concentration than the surface-buried region, configured to implement a part of the photodiode with the photoelectric-conversion layer;
a plurality of potential-control regions of the first conductivity type, each having higher impurity concentration than the photoelectric-conversion layer, each of the potential-control regions is respectively assigned in one of a plurality of divided areas in the modulation region, the divided areas are arranged radially with respect a center of polar coordinate defined in a center of the modulation region; and
a plurality of charge-accumulation regions of the second conductivity type, arranged respectively adjacent to the potential-control regions on an outer boundary of each of the divided areas, the position of the charge-accumulation regions are separated from the potential-control regions, configured to accumulate signal charges temporally, the signal charges are generated in the photodiode, and the signal charges are respectively transferred through independent charge-transport routes to corresponding charge-accumulation regions,
wherein potentials in the modulation region and the surface-buried region are controlled by route-select signals applied to the potential-control regions so as to select one of the charge-transport routes, which transfers the signal charges toward one of the charge-accumulation regions.

2. The charge-modulation element of the claim 1, wherein a plurality of the charge-transport routes and corresponding charge-accumulation regions are assigned to each of the potential-control regions, so that through each of the charge-transport routes the signal charges can be transferred independently to one of the corresponding charge-accumulation regions.

3. The charge-modulation element of the claim 2, further comprising a central potential-control region of the first conductivity type arranged in a center of the plurality of the potential-control regions, so that a center of the central potential-control region coincides to the center of the polar coordinate,
wherein a fixed potential is applied to the central potential-control region.

4. The charge-modulation element of claim 3, further comprising a bottom-side bias-layer of the first conductivity type having a higher impurity concentration than the photoelectric-conversion layer, disposed on a bottom surface of the photoelectric-conversion layer,
wherein the photoelectric-conversion layer is depleted by a voltage applied to the bottom-side bias-layer.

5. The charge-modulation element of claim 2, further comprising a bottom-side bias-layer of the first conductivity type having a higher impurity concentration than the photoelectric-conversion layer, disposed on a bottom surface of the photoelectric-conversion layer,
wherein the photoelectric-conversion layer is depleted by a voltage applied to the bottom-side bias-layer.

6. The charge-modulation element of the claim 1, further comprising a central potential-control region of the first conductivity type arranged in a center of the plurality of the potential-control regions, so that a center of the central potential-control region coincides to the center of the polar coordinate,
wherein a fixed potential is applied to the central potential-control region.

7. The charge-modulation element of the claim 6, further comprising:
a gate insulating film covering an upper partial portion of the central potential-control region and upper partial portions of the potential-control regions, the gate insulating film spans from the upper partial portion of the central potential-control region at an outer contour of the central potential-control region to the upper partial portions of the potential-control regions at inner contours of the potential-control regions; and
an auxiliary-gate electrode disposed on the gate insulating film,
wherein, when the route-select signal is not applied, a non-signal charge-induction pulse is applied to the auxiliary-gate electrode so as to induce non-signal charges having opposite conductivity type to the signal charges just under the auxiliary-gate electrode.

8. The charge-modulation element of claim 7, further comprising a bottom-side bias-layer of the first conductivity type having a higher impurity concentration than the photoelectric-conversion layer, disposed on a bottom surface of the photoelectric-conversion layer,
wherein the photoelectric-conversion layer is depleted by a voltage applied to the bottom-side bias-layer.

9. The charge-modulation element of claim 6, further comprising a bottom-side bias-layer of the first conductivity type having a higher impurity concentration than the photoelectric-conversion layer, disposed on a bottom surface of the photoelectric-conversion layer,
wherein the photoelectric-conversion layer is depleted by a voltage applied to the bottom-side bias-layer.

10. The charge-modulation element of claim 1, further comprising a bottom-side bias-layer of the first conductivity type having a higher impurity concentration than the photoelectric-conversion layer, disposed on a bottom surface of the photoelectric-conversion layer,
wherein the photoelectric-conversion layer is depleted by a voltage applied to the bottom-side bias-layer.

11. A solid-state imaging device comprising:
a pixel-array area having an array of a plurality of pixels, each of the pixels including:
a photoelectric-conversion layer of a first conductivity type;
a surface-buried region of a second conductivity type buried in a part of an upper portion of the photoelectric-conversion layer, configured to implement a photodiode with the photoelectric-conversion layer;
a modulation region of the second conductivity type buried in another part of the upper portion of the photoelectric-conversion layer, in a depth level at an upper surface side than the surface-buried region, having lower impurity concentration than the surface-buried region, configured to implement a part of the photodiode with the photoelectric-conversion layer;

a plurality of potential-control regions of the first conductivity type, each having higher impurity concentration than the photoelectric-conversion layer, each of the potential-control regions is respectively assigned in one of a plurality of divided areas in the modulation region, the divided areas are arranged radially with respect a center of polar coordinate defined in a center of the modulation region; and a plurality of charge-accumulation regions of the second conductivity type, arranged respectively adjacent to the potential-control regions on an outer boundary of each of the divided areas, the position of the charge-accumulation regions are separated from the potential-control regions, configured to accumulate signal charges temporally, the signal charges are generated in the photodiode, and the signal charges are respectively transferred through independent charge-transport routes to corresponding charge-accumulation regions, and a peripheral-circuit area merged in a single semiconductor chip with the pixel-array area, configured to drive the pixels and to process signals from the pixels, wherein in each of the pixels, potentials in the modulation region and the surface-buried region are controlled by route-select signals applied to the potential-control regions so as to select one of the charge-transport routes, which transfers the signal charges toward one of the charge-accumulation regions.

12. The solid-state imaging device of the claim 11, wherein in each of the pixels, a plurality of the charge-transport routes and corresponding charge-accumulation regions are assigned to each of the potential-control regions, so that through each of the charge-transport routes the signal charges can be transferred independently to one of the corresponding charge-accumulation regions.

13. The solid-state imaging device of the claim 12, wherein each of the pixels further comprises a central potential-control region of the first conductivity type arranged in a center of the plurality of the potential-control regions, so that a center of the central potential-control region coincides to the center of the polar coordinate, wherein, in each of the pixels, a fixed potential is applied to the central potential-control region.

14. The solid-state imaging device of claim 13, further comprising a bottom-side bias-layer of the first conductivity type having a higher impurity concentration than the photoelectric-conversion layer, disposed on a bottom surface of the photoelectric-conversion layer, wherein the photoelectric-conversion layer in each of the pixels is depleted by a voltage applied to the bottom-side bias-layer.

15. The solid-state imaging device of claim 12, further comprising a bottom-side bias-layer of the first conductivity type having a higher impurity concentration than the photoelectric-conversion layer, disposed on a bottom surface of the photoelectric-conversion layer, wherein the photoelectric-conversion layer in each of the pixels is depleted by a voltage applied to the bottom-side bias-layer.

16. The solid-state imaging device of the claim 11, wherein each of the pixels further comprises a central potential-control region of the first conductivity type arranged in a center of the plurality of the potential-control regions, so that a center of the central potential-control region coincides to the center of the polar coordinate, wherein, in each of the pixels, a fixed potential is applied to the central potential-control region.

17. The solid-state imaging device of the claim 16, wherein each of the pixels further comprises:

a gate insulating film covering an upper partial portion of the central potential-control region and upper partial portions of the potential-control regions, the gate insulating film spans from the upper partial portion of the central potential-control region at an outer contour of the central potential-control region to the upper partial portions of the potential-control regions at inner contours of the potential-control regions; and an auxiliary-gate electrode disposed on the gate insulating film, wherein, in each of the pixels, when the route-select signal is not applied, a non-signal charge-induction pulse is applied to the auxiliary-gate electrode so as to induce non-signal charges having opposite conductivity type to the signal charges just under the auxiliary-gate electrode.

18. The solid-state imaging device of claim 17, further comprising a bottom-side bias-layer of the first conductivity type having a higher impurity concentration than the photoelectric-conversion layer, disposed on a bottom surface of the photoelectric-conversion layer, wherein the photoelectric-conversion layer in each of the pixels is depleted by a voltage applied to the bottom-side bias-layer.

19. The solid-state imaging device of claim 16, further comprising a bottom-side bias-layer of the first conductivity type having a higher impurity concentration than the photoelectric-conversion layer, disposed on a bottom surface of the photoelectric-conversion layer, wherein the photoelectric-conversion layer in each of the pixels is depleted by a voltage applied to the bottom-side bias-layer.

20. The solid-state imaging device of claim 11, further comprising a bottom-side bias-layer of the first conductivity type having a higher impurity concentration than the photoelectric-conversion layer, disposed on a bottom surface of the photoelectric-conversion layer, wherein the photoelectric-conversion layer in each of the pixels is depleted by a voltage applied to the bottom-side bias-layer.

* * * * *